(12) United States Patent
Portela et al.

(10) Patent No.: US 12,006,404 B2
(45) Date of Patent: *Jun. 11, 2024

(54) SELF-ASSEMBLY OF SHELL-BASED ARCHITECTED MATERIALS

(71) Applicant: California Institute of Technology, Pasadena, CA (US)

(72) Inventors: Carlos M. Portela, Pasadena, CA (US); Daryl Wei Liang Yee, Pasadena, CA (US); Dennis M. Kochmann, Pasadena, CA (US); Julia R. Greer, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/032,539

(22) Filed: Sep. 25, 2020

(65) Prior Publication Data

US 2021/0340334 A1 Nov. 4, 2021

Related U.S. Application Data

(60) Provisional application No. 62/907,392, filed on Sep. 27, 2019.

(51) Int. Cl.
*C08J 3/02* (2006.01)
*B82Y 30/00* (2011.01)
(Continued)

(52) U.S. Cl.
CPC ............ *C08J 3/02* (2013.01); *C04B 38/0051* (2013.01); *C04B 38/0067* (2013.01); *C08J 9/26* (2013.01);
(Continued)

(58) Field of Classification Search
CPC ......... B82Y 30/00; B82Y 40/00; C04B 35/00; C04B 38/0051; C04B 38/0067;
(Continued)

(56) References Cited

U.S. PATENT DOCUMENTS

| 10,833,318 B2 | 11/2020 | Greer et al. | |
| 2016/0056474 A1* | 2/2016 | Greer ................. | H01M 8/0247 428/221 |

(Continued)

FOREIGN PATENT DOCUMENTS

| EP | 1837365 A1 | 9/2007 | |
| WO | WO-2016201339 A1 * | 12/2016 | .......... H01M 10/345 |
| WO | WO 2020/043788 A1 | 3/2020 | |

OTHER PUBLICATIONS

Calladine (1983) Section 4.6 in Chapter 4 of Theory of Shell Structures, pp. 80-123. Cambridge University Press, Cambridge. URL http://ebooks.cambridge.org/ref/id/CB09780511624278.

(Continued)

*Primary Examiner* — Hai Vo
(74) *Attorney, Agent, or Firm* — Leydig, Voit & Mayer, Ltd.

(57) ABSTRACT

In an aspect, provided herein are low density materials, including shell-based materials, with three-dimensional architectures formed, in part, via self-assembly processes. Shell-based materials of some embodiments exhibit a combination of ultralow density (e.g., ≤100 mg cm$^{-3}$ and optionally ≤10 100 mg cm$^{-3}$) and non-periodic architectures characterized by low defect densities and geometries avoiding stress concentrations. Low density shell based materials of some embodiments have architectures characterized by small curvatures and lack of straight edges providing enhance mechanical response. In some embodiments, for example, the present low density materials, including shell-based materials, providing a combination target mechanical (Continued)

properties including high stiffness-to-density ratios, mechanical resilience and tolerance for deformation.

33 Claims, 30 Drawing Sheets
(28 of 30 Drawing Sheet(s) Filed in Color)

(51) Int. Cl.
  *B82Y 40/00* (2011.01)
  *C04B 38/00* (2006.01)
  *C08J 9/26* (2006.01)
  *C23C 16/40* (2006.01)
  *C23C 16/455* (2006.01)

(52) U.S. Cl.
  CPC ...... *C23C 16/403* (2013.01); *C23C 16/45525* (2013.01); *B82Y 30/00* (2013.01); *B82Y 40/00* (2013.01); *C08J 2363/02* (2013.01); *Y10T 428/249953* (2015.04)

(58) Field of Classification Search
  CPC .............. C04B 38/0074; C04B 38/045; C04B 38/0615; C08J 2363/02; C08J 3/02; C08J 9/26; C23C 16/01; C23C 16/045; C23C 16/403; C23C 16/45525; Y10T 428/249953
  See application file for complete search history.

(56) References Cited

U.S. PATENT DOCUMENTS

2018/0375104 A1\* 12/2018 Witt ..................... H01M 10/345
2020/0023584 A1\* 1/2020 Portela .................... B29C 64/30

OTHER PUBLICATIONS

Han et al. (2017) "A Microscopic Shell Structure with Schwarz's D-Surface," Scientific Reports 7: 13405. doi: 10.1038/s41598-017-13618-3.
Valdevit et al. (2013) "Compressive strength of hollow microlattices: Experimental characterization, modeling, and optimal design," J. Mater. Res., vol. 28, No. 17, 2461-2473.
Al-Ketan et al. (Sep. 2018) "Microarchitected Stretching-Dominated Mechanical Metamaterials with Minimal Surface Topologies," Advanced Engineering Materials, 20(9):1800029.
Bates et al. (1997) "Polymeric Bicontinuous Microemulsions," Physical Review Letters, 79(5):849-852.
Bauer et al. (Apr. 2016) "Approaching theoretical strength in glassy carbon nanolattices," Nature Materials, 15(4):438-443.
Bell et al. (2010) "Annealing of Cocontinuous Polymer Blends: Effect of Block Copolymer Molecular Weight and Architecture," Macromolecules, 43(11):5024-5032.
Berdova et al. (2014) "Mechanical assessment of suspended ALD thin films by bulge and shaft-loading techniques," Acta Materialia, 66:370-377.
Berger et al. (2017) "Mechanical metamaterials at the theoretical limit of isotropic elastic stiffness," Nature, 543(7646):533-537.
Biener et al. (2006) "Size Effects on the Mechanical Behavior of Nanoporous Au," Nano Letters, 6(10):2379-2382.
Bonatti et al. (Jan. 2019) "Mechanical performance of additively-manufactured anisotropic and isotropic smooth shell-lattice materials: Simulations & experiments," Journal of the Mechanics and Physics of Solids, 122:1-26.
Deshpande et al. (2001) "Effective properties of the octet-truss lattice material," Journal of the Mechanics and Physics of Solids, 49(8):1747-1769.
Dimas et al. (2013) "Tough composites inspired by mineralized natural materials: Computation, 3D printing, and testing," Advanced Functional Materials, 23, 36, 4629-4638.
Dou et al. (Jul. 2018) "Ultralow Thermal Conductivity and Mechanical Resilience of Architected Nanolattices," Nano Lett. 18, 8, 4755-4761, doi: 10.1021/acs.nanolett.8b01191.
Espinosa et al. (2009) "Merger of structure and material in nacre and bone—Perspectives on de novo biomimetric materials," Progress in Materials Science, 54, 1059-1100. URL https://doi.org/10.1016/j.pmatsci.2009.05.001.
Gross et al. (Mar. 2019) "Correlation between topology and elastic properties of imperfect truss-lattice materials," Journal of the Mechanics and Physics of Solids, 124:577-598.
Han et al. (2015) "A New Type of Low Density Material: Shellular," Advanced Materials, 27(37):5506-5511.
Higgins et al. (Mar. 2000) "Anisotropic spinodal dewetting as a route to self-assembly of patterned surfaces," Nature, 404(6777):476-478.
Hsieh et al. (Apr. 2019) "The mechanical response of cellular materials with spinodal topologies," Journal of the Mechanics and Physics of Solids, 125, 401-419, doi: 10.1016/j.jmps.2019.01.002.
Injeti et al. (Nov. 2019) "Metamaterials with engineered failure load and stiffness," PNAS, 116 (48) 23960-23965; doi: 10.1073/pnas.1911535116.
Khaderi et al. (Jan. 2017) "The indentation response of Nickel nano double gyroid lattices," Extreme Mechanics Letters, 10, 15-23, doi: 10.1016/j.eml.2016.08.006.
Krödel et al. (2016) "Microlattice Metamaterials for Tailoring Ultrasonic Transmission with Elastoacoustic Hybridization," Physical Review Applied, 6(6):064005.
Kwon et al. (2010) "Morphology and topology in coarsening of domains via non-conserved and conserved dynamics," Philosophical Magazine, 90:1-4, 317-335, DOI: 10.1080/14786430903260701010.
Latture et al. (Feb. 2018) "Design and mechanical properties of elastically isotropic trusses," Journal of Materials Research, 33(3):249-263.
Latture et al. (May 2018) "Effects of nodal fillets and external boundaries on compressive response of an octet truss," Acta Materialia, 149:78-87.
Lazarus et al. (2012) "Geometry-Induced Rigidity in Nonspherical Pressurized Elastic Shells," Physical Review Letters, 109(14):144301.
Lee et al. (2010) "Bicontinuous macroporous materials from bijel templates," Advanced Materials, 22(43):4836-4841.
Liu et al. (2017) "Elastic and failure response of imperfect three-dimensional metallic lattices: the role of geometric defects induced by Selective Laser Melting," Journal of the Mechanics and Physics of Solids, 107:160-184.
Lopez-Barron et al. (2010) "Direct Measurement of Interface Anisotropy of Bicontinuous Structures via 3D Image Analysis," Langmuir, 26(17):14284-14293.
Mangipudi et al. (2016) "Topology-dependent scaling laws for the stiffness and strength of nanoporous gold," Acta Materialia, 119:115-122.
Mateos et al. (Dec. 2018) "Discrete-Continuum Duality of Architected Materials: Failure, Flaws, and Fracture," Advanced Functional Materials, 29, 5, 1806772.
Meza et al. (2014) "Strong, lightweight, and recoverable three-dimensional ceramic nanolattices," Science, 345(6202):1322-1326.
Meza et al. (2015) "Resilient 3D hierarchical architected metamaterials," Proceedings of the National Academy of Sciences, 112(37):11502-11507.
Meza et al. (Aug. 2017) "Reexamining the mechanical property space of three-dimensional lattice architectures," Acta Materialia, 140:424-432.
Meza et al. (Nov. 2017) "Reexamining the mechanical property space of three-dimensional lattice architectures," Acta Materialia, vol. 140, Nov. 2017, pp. 424-432, doi: 10.1016/j.actamat.2017.08.052.
Nath et al. (2003) "Genetic control of surface curvature," Science, 299(5611):1404-1407.
Ndoni et al. (2003) "Nanoporous Materials with Spherical and Gyroid Cavities Created by Quantitative Etching of Polydimethylsiloxane in Polystyrene—Polydimethylsiloxane Block Copolymers," Journal of the American Chemical Society, 125(44):13366-13367.

(56) References Cited

OTHER PUBLICATIONS

Nguyen et al. (2017) "Design of the P-surfaced shellular, an ultra-low density material with micro-architecture," Computational Materials Science, 139:162-178.
Park et al. (2003) "Enabling nanotechnology with self assembled block copolymer patterns," Polymer, 44(22):6725-6760.
Park et al. (2017) "Coarsening of complex microstructures following spinodal decomposition," Acta Materialia, 132:13-24.
Pham et al. (Jan. 2019) "Damage-tolerant architected materials inspired by crystal microstructure," Nature, 565, 305-311.
Pini et al. (2016) "How two-dimensional bending can extraordinarily stiffen thin sheets," Scientific Reports, 6, 29627, 6 pp.
Portela et al. (Jul. 2018) "Impact of node geometry on the effective stiffness of non-slender three-dimensional truss lattice architectures," Extreme Mechanics Letters, 22:138-148.
Portela et al. (Mar. 2020) "Extreme mechanical resilience of self-assembled nanolabyrinthine materials," and Supporting Information. PNAS 117, 11, 5686-5693.
Ramm et al. (2004) "Shell structures - A sensitive interrelation between physics and numerics," International Journal for Numerical Methods in Engineering, 60(1):381-427.
Roylance (2001) "Stress-Strain Curves," MIT course, Aug. 23, 2001, 14 pp., accessed Aug. 2020 at http://web.mit.edu/course/3/3.11/www/modules/ss.pdf.
Schaedler et al. (2011) "Ultralight Metallic Microlattices," Science, 334(6058):962-965.
Schroer et al. (Jan. 2018) "Deformation behavior and energy absorption capability of polymer and ceramic-polymer composite microlattices under cyclic loading," Journal of Materials Research, 33(3):274-289.
Tancogne-Dejean et al. (2016) "Additively-manufactured metallic micro-lattice materials for high specific energy absorption under static and dynamic loading," Acta Materialia, 116:14-28.
Tancogne-Dejean et al. (Jul. 2018) "Elastically-isotropic elementary cubic lattices composed of tailored hollow beams," Extreme Mechanics Letters, 22:13-18.
Tancogne-Dejean et al. (Nov. 2018) "3D Plate-Lattices: An Emerging Class of Low-Density Metamaterial Exhibiting Optimal Isotropic Stiffness," Advanced Materials, 30(45):1803334.
Tsujioka et al. (2008) "Well-controlled 3D skeletal epoxy-based monoliths obtained by polymerization induced phase separation," Journal of Polymer Science Part A: Polymer Chemistry, 46(10):3272-3281.
Vidil et al. (2017) "Nanoporous Thermosets with Percolating Pores from Block Polymers Chemically Fixed above the Order-Disorder Transition," ACS Central Science, 3(10):1114-1120.
Vidyasagar et al. (Oct. 2018) "Microstructural patterns with tunable mechanical anisotropy obtained by simulating anisotropic spinodal decomposition," Proc. R. Soc. A, 474(2218): 20180535, doi: http://dx.doi.org/10.1098/rspa.2018.0535.
Weisstein "Radius of Curvature," From MathWorld—A Wolfram Web Resource; available at https://mathworld.wolfram.com/RadiusofCurvature.html, last accessed on Sep. 22, 2020.
Zeng et al. (2017) "Anisotropic and Interconnected Nanoporous Materials from Randomly End-Linked Copolymer Networks," Macromolecules, 50(12):4668-4676.
Zhang et al. (Mar. 2019) "Lightweight, flaw-tolerant, and ultrastrong nanoarchitected carbon," Proceedings of the National Academy of Sciences, 116(14): 6665-6672. https://doi.org/10.1073/pnas.1817309116, Aug. 4, 2022.
Zhang et al. (Oct. 2018) "Energy absorption characteristics of metallic triply periodic minimal surface sheet structures under compressive loading," Additive Manufacturing, 23, 505-515.
Zheng et al. (2014) "Ultralight, ultrastiff mechanical metamaterials," Science, 344(6190):1373-1377.
Zheng et al. (2016) "Multiscale metallic metamaterials," Nature Materials, 15(10):1100-1106.
Zhou et al. (2006) "Mesoporous membrane templated by a polymeric bicontinuous microemulsion," Nano Letters, 6(10):2354-2357.
Ziehmer et al. (2016) "A principle curvatures analysis of the isothermal evolution of nanoporous gold: Quantifying the characteristic length-scales," Acta Materialia, 120, 24-31. doi: 10.1016/j.actamat.2016.08.028.
McDevitt et al. (2019) "Microstructural characteristics of bijel-templated porous materials," Materialia 7: 100393. doi: 10.1016/j.mtla.2019.100393.
Montemayor et al. (2015) "Mechanical Response of Hollow Metallic Nanolattices: Combining Structural and Material Size Effects," Journal of Applied Mechanics 82: 071012-1-07102-10.
Witt et al. (2013) "Bijel reinforcement by droplet bridging: a route to bicontinuous materials with large domains," Soft Matter, 9, 6773-6780.

\* cited by examiner

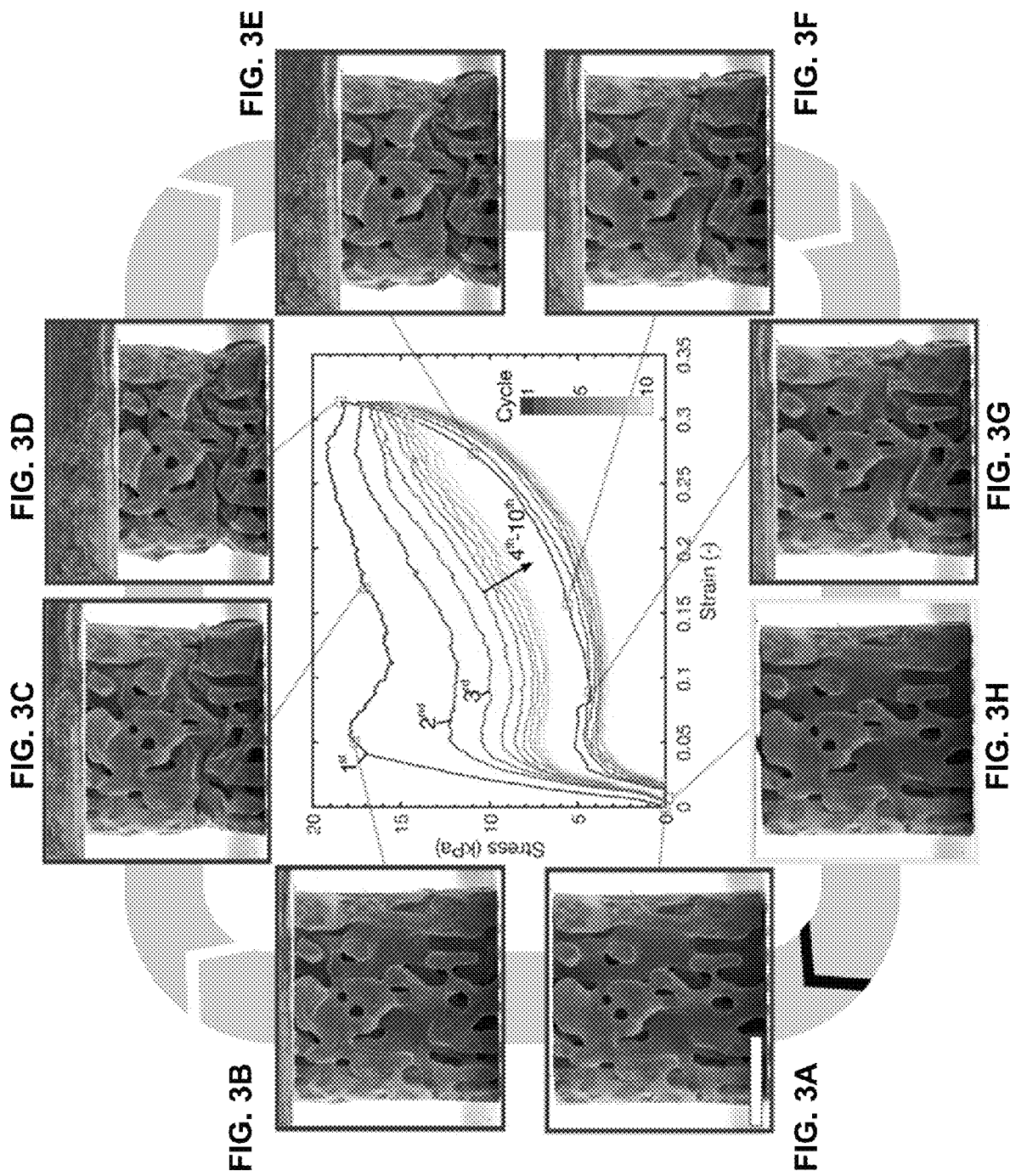

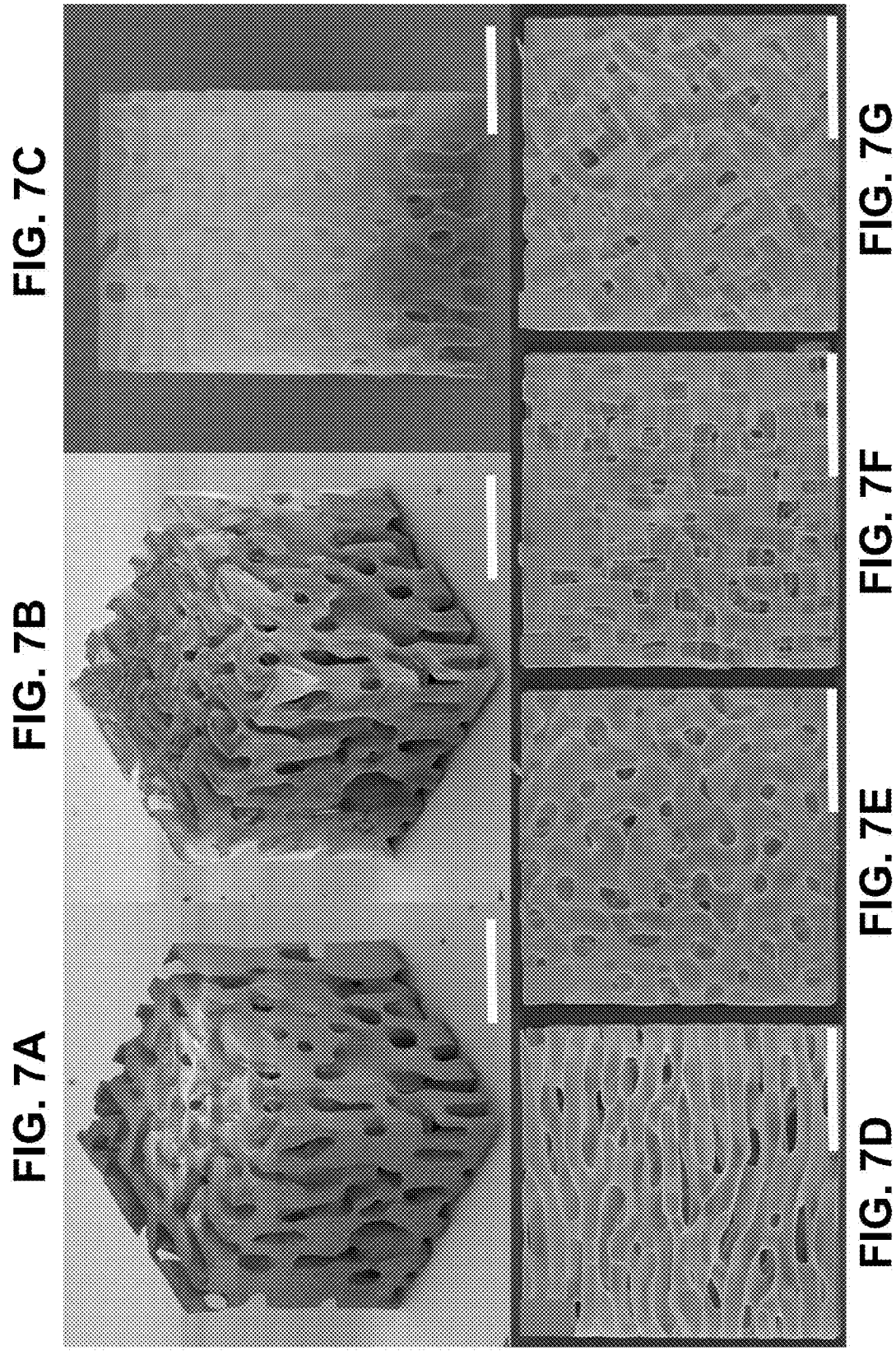

SELF-ASSEMBLY OF SHELL-BASED ARCHITECTED MATERIALS

CROSS-REFERENCE TO RELATED APPLICATIONS

This application claims the benefit of priority to U.S. Provisional Patent Application No. 62/907,392, filed Sep. 27, 2019, which is hereby incorporated by reference in its entirety.

STATEMENT REGARDING FEDERALLY SPONSORED RESEARCH OR DEVELOPMENT

This invention was made with government support under Grant No. CA194533 awarded by the National Institutes of Health and under Grant No(s). N00014-16-1-2431 & N00014-16-1-2827 awarded by the Office of Naval Research. The government has certain rights in the invention.

BACKGROUND OF INVENTION

The design and fabrication of light weight, low density materials with tailorable properties has attracted significant attention for a range of research and commercial applications. Such light weight, low density materials support applications in diverse fields including load bearing materials, catalyst support, separations, electrochemical systems, thermal management, and biomaterials.

Progress in additive manufacture processes, for example, has enabled a robust fabrication platform for manufacturing deterministic, periodic architected materials with nanoscale resolution. Such additive manufacturing processes have been developed capable of making metamaterials with highly selected three dimensional (3D) architectures and exhibiting a range of physical and mechanical properties.

Fabrication techniques based on self-assembly processes provides a complementary approach to making light weight, low density materials. Self-assembly approaches have been shown to be useful for making a variety of nanostructured architectures including designs inspired by nature, for example, including non-periodic architectures characterized by defect free architectures. Practical advantages of self-assembly based fabrication also include compatible with high throughput volumes, scalability and cost effectiveness.

Despite this progress, there remains a need for low density stiff materials capable of tolerating large forces and deformation without deterioration or failure. Self-assembly based fabrication techniques are needed capable of achieving optimal combinations of useful mechanical properties including high stiffness-to-density ratios, flaw tolerance and mechanical resilience. In addition, self-assembly based processes for fabricating low density stiff materials are needed providing tunable control over the morphology and resultant mechanical properties.

SUMMARY OF THE INVENTION

In an aspect, provided herein are low density materials, including shell-based materials, with three-dimensional architectures formed, in part, via self-assembly processes. Shell-based materials of some embodiments exhibit a combination of ultralow density (e.g., $\leq 100$ mg cm$^{-3}$ and optionally $\leq 10$ 100 mg cm$^{-3}$) and non-periodic architectures characterized by low defect densities and geometries avoiding stress concentrations. Low density shell-based materials of some embodiments have architectures characterized by small curvatures and lack of straight edges providing enhance mechanical response. In some embodiments, for example, the present low-density materials, including shell-based materials, providing a combination target mechanical properties including high stiffness-to-density ratios, mechanical resilience and tolerance for deformation.

In an aspect, provided herein are fabrication methods for making low density materials combining self-assembly processes and templating techniques. In some embodiments, for example, self-assembly of polymer emulsions via spinodal decomposition (i.e., phase separation) is used to generate a scaffold that serves as a template for conformal coating with one or more materials of interest. In some embodiments, selection of process parameters including temperature, reaction time, the amounts and molar ratios of polymers or polymer precursors, etc., provides for substantial tunability, thereby allowing fabrication of low-density materials having a range of useful architectures and resulting properties. Fabrication methods of some aspects are versatile with respect to composition of the templated material (e.g., metals, alloys, ceramics, metal oxides, semiconductors, polymers, carbon allotropes, etc.) and are capable of large sample volumes and commercially relevant scale up.

In an aspect, the invention provides a shell-based material comprising a plurality shell features provided in a porous shell network; wherein at least a portion of the shell features are independently characterized by a ratio of average thickness to magnitude of inverse principal curvature of less than or equal to 0.16, and optionally less than or equal to 0.01; wherein the shell-based material has an average density less than or equal to 100 mg cm$^{-3}$, and optionally less than or equal to 50 mg cm$^{-3}$, In an embodiment, for example, at least a portion of the shell features are independently characterized by the ratio of thickness to magnitude of inverse principal curvature selected over the range of $5\times10^{-8}$ to 0.16. Optionally, at least a portion of the shell features is independently characterized by the ratio of thickness to magnitude of inverse principal curvature selected over the range of $5\times10^{-8}$ to 0.16, or anywhere therebetween inclusively, such as optionally selected from the range of $5\times10^{-8}$ to 0.13, optionally selected from the range of $5\times10^{-8}$ to 0.1, optionally selected from the range of $5\times10^{-8}$ to 0.08, optionally selected from the range of $5\times10^{-8}$ to 0.05, optionally selected from the range of $5\times10^{-8}$ to 0.01, optionally selected from the range of $5\times10^{-8}$ to 0.005. Optionally, at least 50%, preferably for some applications at least 75%, preferably for some applications at least 90%, preferably for some applications at least 95%, preferably for some applications at least 99%, of the shell features are independently characterized by the ratio of thickness to magnitude of inverse principal curvature selected over the range of $5\times10^{-8}$ to 0.16, or anywhere therebetween inclusively, such as optionally selected from the range of $5\times10^{-8}$ to 0.13, optionally selected from the range of $5\times10^{-8}$ to 0.1, optionally selected from the range of $5\times10^{-8}$ to 0.08, optionally selected from the range of $5\times10^{-8}$ to 0.05, optionally selected from the range of $5\times10^{-8}$ to 0.01, optionally selected from the range of $5\times10^{-8}$ to 0.005. In an embodiment, for example, at least 90% of, and optionally all of, the shell features are independently characterized by a ratio of thickness to magnitude of inverse principal curvature less than or equal to 1.6, optionally selected over the range of $5\times10^{-8}$ to 0.16. In an embodiment, for example, the shell-based material has an average density selected over the range of 0.5 mg cm$^{-3}$ to 100 mg cm$^{-3}$, optionally selected over the range of 0.5 mg cm$^{-3}$ to 50 mg cm$^{-3}$, optionally selected over the range of 0.5 mg cm$^{-3}$ to 20 mg cm$^{-3}$, optionally selected over the range of 0.5 mg cm$^{-3}$ to 10 mg cm$^{-3}$, optionally selected over the range of 0.5 mg cm$^{-3}$ to 5 mg cm$^{-3}$, optionally selected over the range of 1 mg cm$^{-3}$ to 100 mg cm$^{-3}$, optionally selected over the range of 1 mg cm$^{-3}$ to 50 mg cm$^{-3}$, optionally selected over the range of 1 mg cm$^{-3}$ to 20 mg cm$^{-3}$, optionally selected over the range of 1 mg cm$^{-3}$ to 10 mg cm$^{-3}$, optionally selected over the range of 1 mg cm$^{-3}$ to 5 mg cm$^{-3}$, optionally selected over the range of 1.5 mg cm$^{-3}$ to 100 mg cm$^{-3}$, optionally selected over the range of 1.5 mg cm$^{-3}$ to 50 mg cm$^{-3}$, optionally selected over the range of 1.5 mg cm$^{-3}$ to 20 mg cm$^{-3}$, optionally selected over the range of 1.5 mg cm$^{-3}$ to 10 mg cm$^{-3}$, optionally selected over the range of 1.5 mg cm$^{-3}$ to 5 mg cm$^{-3}$, optionally selected over the range of 1.5 mg cm$^{-3}$ to 100 mg cm$^{-3}$, optionally selected over the range of 1.9 mg cm$^{-3}$ to 100 mg cm$^{-3}$, optionally selected over the range of 1.9 mg cm$^{-3}$ to 50 mg cm$^{-3}$, optionally selected over the range of 1.9 mg cm$^{-3}$ to 20 mg cm$^{-3}$, optionally selected over the range of 1.9 mg cm$^{-3}$ to 10 mg cm$^{-3}$, optionally selected over the range of 1.9 mg cm$^{-3}$ to 5 mg cm$^{-3}$, optionally selected over the range of 2 mg cm$^{-3}$ to 65 mg cm$^{-3}$. For example, with a substantially 5 nm ALD coating of alumina, the shell based material can have an average density of substantially 2 mg cm$^{-3}$.

Shell-based materials of the invention may comprise shell feature characterized by a range of physical dimensions, shapes, spatially distributions and/or orientations in a porous shell network.

In an embodiment, for example, the shell features of the porous shell network are warped features and/or multiple curvature features, such as double curvature features. In an embodiment, for example, at least a portion of the shell features of the porous shell network are provided in a spatial distribution that is anisotropic in at least one direction. In an embodiment, for example, at least a portion of the shell features of the porous shell network are provided in a non-periodic spatial distribution and/or asymmetrical spatial distribution.

In an embodiment, for example, the shell features of the porous shell network are at least partially hollow features, such as a feature wherein an outer structural layer at least partially encloses or at least partially surrounds an internal a cavity or void space. In an embodiment, for example, the shell features of the porous shell network are hollow features, wherein an outer structural layer encloses or surrounds an internal a cavity or void space. In an embodiment, for example, the outer layer of the shell feature has a thickness selected over the range of 2 nm to 50 μm, optionally selected over the range of 4 nm to 50 μm, optionally selected over the range of 5 nm to 50 μm, optionally selected over the range of 4 nm to 10 μm, optionally selected over the range of 4 nm to 5 μm, optionally selected over the range of 4 nm to 3 μm, optionally selected over the range of substantially 5 nm to substantially 3 μm. In an embodiment, for example, greater than 75%, optionally greater than 85% of the volume of the shell feature is a void space such as an internal cavity, and optionally for some embodiments greater than 95% of the volume of the feature is void space such as an internal cavity. Optionally, the internal cavity or void space within, surrounded by, or enclosed by, at least 50%, preferably at least 75%, optionally at least 90%, or all of the plurality of shell features has a diameter or other cross-sectional dimension selected from the range of 500 nm to 100 μm. Optionally, the internal cavity or void space within, surrounded by, or enclosed by, at least 50%, preferably at least 75%, optionally at least 90%, optionally at least 95%, or all of the plurality of shell features has a diameter or other cross-sectional dimension selected from the range of 100 nm to 200 μm, optionally 100 nm to 100 μm, optionally 500 nm to 100 μm, 500 nm to 100 μm, 500 nm to 10 μm, 100 nm to 10 μm, optionally 100 nm to 1 μm, optionally 1 μm to 100 μm.

In an embodiment, for example, the shell features of the porous shell network are interconnected features, for example, physically interconnected features and/or fluidically interconnected features. In an embodiment, for example, the shell features of the porous shell network comprise one or more a continuous structure, such as a macroscopically monolithic structure.

In an embodiment, for example, the shell features of the porous shell network are characterized by average thickness selected from the range of 4 nm to 20 μm, optionally selected from the range of 4 nm to 10 μm, optionally selected from the range of 4 nm to 5 μm, optionally selected from the range of 4 nm to 4 μm, optionally selected from the range of 4 nm to 800 nm, optionally selected from the range of 4 nm to 600 nm, optionally selected from the range of 5 nm to 2 μm, optionally selected from the range of 5 nm to 1 μm, and optionally selected from the range of 5 nm to 500 nm. In an embodiment, for example, the shell features of the porous shell network are characterized by a ratio of average thickness to characteristic length selected over the range of $5 \times 10^{-4}$ to 0.2. This characteristic length is defined as an average pore size, which determines the on-average separation between shells. This characteristic length scale can be obtained via the distribution of principal curvatures in a given material, such as shown in Ziehmer et al. (M. Ziehmer, et al., 2016, "A principle curvatures analysis of the isothermal evolution of nanoporous gold: Quantifying the characteristic length-scales," Acta Materialia, Volume 120, November 2016, Pages 24-31, August 2016, doi: 10.1016/j.actamat.2016.08.028), which is incorporate herein by reference in its entirety. In an embodiment, for example, the shell features of the porous shell network are characterized by a ratio of average thickness to characteristic length selected over the range of $4 \times 10^{-4}$ to 0.3, optionally selected over the range of $5 \times 10^{-4}$ to 0.3, optionally selected over the range of $5 \times 10^{-4}$ to 0.2, or any value or range therebetween inclusively.

In an embodiment, for example, the shell features of the porous shell network do not include portions characterized by a magnitude of normalized curvature greater than 30 and/or do not include features characterized by one zero-valued principal curvature or radial symmetry. In an embodiment, for example, the shell features are provided in a bicontinuous shell network.

In an embodiment, for example, the shell features of the porous shell network are one or more material selected from the group consisting of a ceramic, a polymer, a metal, a metal oxide, a carbon allotrope and any combinations of these, for example, as provided in the form of any outer layer at least partially enclosing or at least partially surrounding one or more internal cavities or void spaces. In an embodiment, for example, the shell features of the porous shell network are formed of a material comprising $Al_2O_3$, $HfO_2$, $SiO_2$, $TiO_2$, $SrTiO_3$, $Ta_2O_5$, $Gd_2O_3$, $ZrO_2$, $Ga_2O_3$, $V_2O_5$, $Co_3O_4$, ZnO, ZnO:Al, ZnO:B, $In_2O_3$:H, $WO_3$, $MoO_3$, $Nb_2O_5$, NiO, MgO, $RuO_2$, TiN, TaN, Si3N4, AlN, GaN, WN, HfN, NbN, GdN, VN, ZrN, Pt, Ru, Pd, Ni, W, ZnS, $MoS_2$, $MgF_2$, $AlF_3$, Cu, nickel-phosphorous alloy, nickel-boron alloy, Cu, Al, Hf, Si, Ti, Sr, Ta, Zr, Gd, Ga, V, Co, Zn, In, Mo, Nb, Mg, an alloy of any of these, an oxide of any of these, a nitride of any of these, a fluoride of any of these, or any combinations of these. In an embodiment, for example, the shell features of the porous shell network are formed of a material selected from the group consisting of $Al_2O_3$, $HfO_2$, $SiO_2$, $TiO_2$, $SrTiO_3$, $Ta_2O_5$, $Gd_2O_3$, $ZrO_2$, $Ga_2O_3$, $V_2O_5$, $Co_3O_4$, ZnO, ZnO:Al, ZnO:B, $In_2O_3$:H, $WO_3$, $MoO_3$, $Nb_2O_5$, NiO, MgO, $RuO_2$, TiN, TaN, Si3N4, AlN, GaN, WN, HfN, NbN, GdN, VN, ZrN, Pt, Ru, Pd, Ni, W, ZnS, $MoS_2$, $MgF_2$, $AlF_3$, Cu, nickel-phosphorous alloy, nickel-boron alloy, Cu, Al, Hf, Si, Ti, Sr, Ta, Zr, Gd, Ga, V, Co, Zn, In, Mo, Nb, Mg, an alloy of any of these, an oxide of any of these, a nitride of any of these, a fluoride of any of these, and any combinations of these.

Shell-based materials of the invention may be characterized by various physical and mechanical properties and combination thereof. In an embodiment, for example, the shell-based material has a stiffness ranging from 0.2% to 48% of the theoretical stiffness bound (Voigt bound). In an embodiment, for example, the shell-based material has a stiffness ranging from 0.2% to 99%, optionally from 0.2% to 90%, optionally from 0.2% to 80%, optionally from 0.2% to 70%, optionally from 0.2% to 60%, optionally from 0.2% to 50%, optionally from 1% to 90%, optionally from 2% to 90%, optionally from 5% to 90%, optionally from 10% to 90%, optionally from 15% to 90%, optionally from 20% to 90%, optionally from 25% to 90%, optionally from 30% to 90%, optionally from 35% to 90%, optionally from 40% to 90%, optionally from 25% to 99%, optionally from 35% to 99%, optionally from 40% to 99%, of the theoretical stiffness bound (Voigt bound). In an embodiment, for example, the shell-based material has an average stiffness-to-density ratio selected from the range of 5 kPa*$m^3$/kg to 4.44 MPa*$m^3$/kg. In an embodiment, for example, the shell-based material has an average stiffness-to-density ratio selected from the range of 1 kPa*$m^3$/kg to 10 MPa*$m^3$/kg, optionally selected from any value or range therebetween inclusively, optionally selected from the range of 1 kPa*$m^3$/kg to 5 MPa*$m^3$/kg, optionally selected from the range of 5 kPa*$m^3$/kg to 10 MPa*$m^3$/kg, selected from the range of 5 kPa*$m^3$/kg to 5 MPa*$m^3$/kg, optionally selected from the range of 10 kPa*$m^3$/kg to 10 MPa*$m^3$/kg, optionally selected from the range of 50 kPa*$m^3$/kg to 10 MPa*$m^3$/kg, optionally selected from the range of 100 kPa*$m^3$/kg to 10 MPa*$m^3$/kg, optionally selected from the range of 10 kPa*$m^3$/kg to 5 MPa*$m^3$/kg, optionally selected from the range of 100 kPa*$m^3$/kg to 5 MPa*$m^3$/kg.

In an embodiment, for example, the average stiffness (S) of the material increases substantially linearly with relative density (D) pursuant to the expression (E1) wherein $1.0 < x < 1.3$:

$$S \propto D^x \quad \text{(E1)}.$$

In an embodiment, for example, the shell-based material has resilient response showing no crack formation in response to strain selected over the range of greater than 0% to 40%, preferably selected over the range of greater than 0% to 50%, optionally selected over the range of 10% to 40%, optionally selected over the range of 20% to 40%.

In an embodiment, for example, the shell-based material has an anisotropic Young's modulus, such that the ratio of a first average Young's modulus along a first direction to a second average Young's modulus along a second direction is greater than or equal to 177, wherein the first direction is orthogonal to the second direction. In an embodiment, for example, the shell-based material has an anisotropic Young's modulus, such that the ratio of a first average Young's modulus along a first direction to a second average Young's modulus along a second direction is greater than or equal to 50, optionally greater than or equal to 100, optionally greater than equal to 150, optionally equal to or greater than 175, optionally selected from the range of 50 to 200, optionally selected from the range of 100 to 200, optionally selected from the range of 150 to 200, optionally selected from the range of 50 to 300, optionally selected from the range of 100 to 300, optionally selected from the range of 150 to 300, optionally selected from the range of 170 to 180, wherein the first direction is orthogonal to the second direction.

In an embodiment, for example, the shell-based material has an average porosity selected over the range of 90% to 99.9%, optionally 95% to 99.9%, and optionally 97.6% to 99.85%.

In an embodiment, for example, the shell-based material has a defect density equal to or less than 10 $\mu m^{-3}$. In an embodiment, for example, the shell-based material is characterized by a throughput volume greater than or equal to $1 \times 10^{-6}$ $cm^3$, optionally greater than or equal to $2 \times 10^{-6}$ $cm^3$, optionally greater than or equal to $2.5 \times 10^{-6}$ $cm^3$ optionally greater than or equal to $3 \times 10^{-6}$ $cm^3$, optionally greater than or equal to $5 \times 10^{-6}$ $cm^3$, optionally greater than or equal to $1 \times 10^{-5}$ $cm^3$, optionally greater than or equal to $5 \times 10^{-6}$ $cm^3$, optionally greater than or equal to $1 \times 10^{-4}$ $cm^3$, optionally greater than or equal to $5 \times 10^{-4}$ $cm^3$, optionally greater than or equal to $1 \times 10^{-3}$ $cm^3$.

In an embodiment, for example, the shell-based material has a sample volume greater than or equal to $1 \times 10^6$ $\mu m^3$, optionally greater than greater than or equal to $2 \times 10^6$ $\mu m^3$, optionally greater than greater than or equal to $2.7 \times 10^6$ $\mu m^3$, optionally greater than greater than or equal to $5 \times 10^6$ $\mu m^3$, optionally greater than greater than or equal to $1 \times 10^7$ $\mu m^3$, optionally greater than greater than or equal to $1 \times 10^8$ $\mu m^3$, optionally greater than greater than or equal to $1 \times 10^9$ $\mu m^3$, optionally greater than greater than or equal to $1 \times 10^{10}$ $\mu m^3$, optionally greater than greater than or equal to $1 \times 10^{11}$ $\mu m^3$, optionally greater than greater than or equal to $1 \times 10^{12}$ $\mu m^3$.

In an embodiment, for example, the shell-based material comprises a composite material. In an embodiment, for example, the shell-based material comprises a matrix phase provide in at least a portion of the porous of the porous shell network.

In an embodiment, for example, the shell-based material is fabricated via a self-assembly based templating approach process. In an embodiment, for example, the shell-based material is fabricated via a process other than an additive manufacturing based process.

In an aspect, the invention provides a method of making a shell-based material, the method comprising providing a mixture comprising a first polymer precursor and/or a second polymer precursor (preferably, the mixture comprising the first polymer precursor and the second polymer precursor); polymerizing the first polymer precursor and/or the second polymer precursor (in the mixture) so as to cause phase separation of the mixture, thereby resulting in formation of a porous bi-continuous template structure; coating at least a portion of the porous bi-continuous template structure with a deposition material, thereby generating a layer of deposited material on at least a portion of the template structure having a thickness less than or equal to 5 µm; and at least partially removing the porous template structure; thereby forming a shell-based material comprising a plurality shell features provided in a porous shell network; wherein at least a portion of the shell features are independently characterized by a ratio of average thickness to magnitude of inverse principal curvature of less than or equal to 0.16; wherein the shell-based material has an average density less than or equal to 100 mg $cm^{-3}$. The first polymer precursor is one or more polymers (preferably capable of undergoing further polymerization), one or more prepolymers, one or more monomers, or any combination of these. The second polymer precursor is one or more polymers (preferably capable of undergoing further polymerization), one or more prepolymers, one or more monomers, or any combination of these. Optionally, the removing step comprises removing at least 50%, optionally at least 60%, optionally at least 70%, optionally at least 80%, optionally at least 90%, optionally at least 99%, optionally 100% of the porous template structure. Optionally, the coating step comprises coating at least 50%, optionally at least 60%, optionally at least 70%, optionally at least 80%, optionally at least 90%, optionally at least 99%, optionally 100% of the porous bi-continuous template structure with the deposition material, thereby generating a layer of deposited material on the coated portion of the template structure, the layer having a thickness less than or equal to 5 µm. In embodiments, the porous bi-continuous template structure is formed of one or more, two or more, or three or more polymers.

In an embodiment, for example, at least a portion of the shell features are independently characterized by the ratio of thickness to magnitude of inverse principal curvature selected over the range of $5 \times 10^{-8}$ to 0.16 and wherein the shell-based material has an average density selected over the range of 0.5 mg cm$^{-3}$ to 100 mg cm$^{-3}$.

In an embodiment, for example, the phase separation is generated at least in part due to self-assembly processes of the first polymer precursor, the second polymer precursor and polymerization products thereof, and optionally self-assembly processes of one or more additional polymers or prepolymers.

In an embodiment, for example, the method comprises a step of deforming the porous bi-continuous template structure; wherein the step of deforming is performed between the steps of polymerizing and coating.

In an embodiment, for example, the geometry, morphology and/or physical dimensions of the porous shell network is controllable via selection of one or more parameters selected form the group consisting of: (i) composition of the first polymer precursor and/or the second polymer precursor; (ii) relative amounts of the first polymer precursor and/or the second polymer precursor (e.g., mass ratio of first to second polymer precursor selected from 0.05 to 50); (iii) rate of polymerization of the first polymer precursor and/or the second polymer precursor; (iv) temperature of polymerization (e.g., selected from 10° C. to 200° C.) of the first polymer precursor and/or the second polymer precursor; (v) duration of polymerization (e.g., selected from 1 minute to 24 hours) of the first polymer precursor and/or the second polymer precursor; (vi) mechanical input to the mixture during the polymerizing step (e.g., sonication, ultrasonication, mixing, shaking, and/or swirling); and (vii) deformation force (e.g., selected from 0.005 N to 1000 N) and one or more deformation direction (e.g., within 30° of a maximum or a minimum stiffness axis of the template structure) during the optional step of deforming.

In an embodiment, for example, the mixture comprises a polymeric emulsion. In an embodiment, for example, the polymerizing step results in polymerization, curing and/or cross linking the first polymer precursor and/or the second polymer precursor. In an embodiment, for example, the polymerizing step is thermally induced polymerization, photo induced polymerization or chemically induced polymerization.

In an embodiment, for example, the first polymer precursor comprises one or more of an epoxy resin, an amine group, an acrylate group, a thiol group, an alkyne group, an alkene group, a tetraethoxysilane, a tetramethoxysilane, or any combination of these. In an embodiment, for example, the first polymer precursor comprises one or more of an epoxy resin, an amine-based polymer precursor, an acrylate-based polymer precursor, a thiol-based polymer precursor, an alkyne-based polymer precursor, an alkene-based polymer precursor, a tetraethoxysilane-based polymer precursor, a tetramethoxysilane-based polymer precursor, or any combination of these. Optionally, the mixture comprises more than one of a first polymer or prepolymer. Optionally, the mixture comprises more than one of a second polymer precursor. In an embodiment, for example, the second polymer precursor comprises one or more of polyethylene glycol, poly(vinyl methyl ether), poly(diethoxysiloxane), triethyl phosphate, trimethyl borate, poly(acrylic acid), sodium polystyrene sulfonate, or any combination of these. In an embodiment, for example, the mixture is characterized by a mixing ratio of the first polymer precursor to the second polymer precursor selected from the range of 0.1 to 0.9. In an embodiment, for example, the mixture comprises the first polymer precursor at 10 vol. % to 90 vol. % and the second polymer precursor at 10 vol. % to 90%. In an embodiment, for example, the mixture further comprises a polar solvent or a nonpolar solvent. In an embodiment, for example, the solvent is selected form the group consisting of diglycidyl ether, water, methanol, ethanol, and any combinations thereof. In an embodiment, for example, the mixture further comprises one or more additional polymers or prepolymers. In an embodiment, the mixture included one or more photoinitiators, such as photoinitiators selected from the group consisting of 7-diethylamino-3-thenoylcoumarin, lithium phenyl-2,4,6-trimethylbenzoylphosphinate, and any combinations of these.

In an embodiment, for example, the coating step comprises conformal coating of least a portion of the template structure. In an embodiment, for example, the coating step provides a conformal layer of deposited material on at least a portion of the template structure; wherein the layer has a thickness selected from the range of 4 nm to 20 µm, optionally selected from the range of 4 nm to 10 µm, optionally selected from the range of 4 nm to 5 µm, optionally selected from the range of 4 nm to 4 µm, optionally selected from the range of 4 nm to 800 nm, optionally selected from the range of 4 nm to 600 nm, optionally selected from the range of 5 nm to 2 µm, optionally selected from the range of 5 nm to 1 µm, and optionally selected from the range of 5 nm to 500 nm. In an embodiment, for example, the deposition material is a ceramic, a polymer, a metal, a metal oxide, a carbon allotrope or any precursors or combinations of these.

In an embodiment, for example, the coating step comprises a vapor or thin film deposition technique. In an embodiment, for example, the thin film deposition technique is selected from the group consisting of a physical vapor deposition technique, a chemical vapor deposition technique, an atomic layer deposition technique, a sputtering (e.g., DC or RF) technique, a thermal evaporation technique, a laser ablation technique, an electron-beam evaporation technique, and any combinations of these. In an embodiment, for example, the coating step comprises a wet chemical technique. In an embodiment, for example, the wet chemical technique is selected from the group consisting of a sol gel technique, electroless plating, electrochemical deposition, electrophoretic deposition, and any combinations of these. In an embodiment, for example, the removing step comprises etching, dissolving, ashing, pyrolysis, calcination, thermal degradation, or any combination of these. In an embodiment, for example, the removing step comprises $O_2$ plasma ashing.

In an embodiment, for example, the removing step comprises removing a portion of the deposition material so as to expose a portion of the template structure. In an embodiment, for example, the method further comprises providing a matrix phase in at least a portion of the porous shell network of the shell-based material. In an embodiment, for example, the step of providing the matrix phase in at least the portion of the porous shell network of the shell-based material comprises one or more techniques selected from the group consisting of resin transfer molding, polymerization, melt infiltration, sol-gel, or any combinations.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A. Schematic of the fabrication process starting with spinodal decomposition of an epoxy resin ($\phi=1$) and polyethylene glycol (PEG, $\phi=0$) emulsion, which is thermally cured to produce a porous bi-continuous template after extraction of PEG. The template is then conformally coated with atomic layer deposited (ALD) $Al_2O_3$ which, after removing the epoxy phase via $O_2$ plasma ashing, composes the resulting nano-labyrinthine shell architectures. FIG. 1B. (i) Photograph of a self-assembled porous epoxy disk fabricated using the process described above, (ii)(iii) SEM micrographs of a wedge extracted from the disk, (iv)-(vi) SEM micrographs of the wedge after coating with 79 nm of ALD $Al_2O_3$ and removal of the epoxy, yielding the shell-based nano-labyrinthine material. Scale bars in (ii), (iii) 10 m, (iv) 100 m, (v) 10 m, and (vi) 5 m.

FIG. 2A. Columnar shell geometry with 11 nm shell thickness and (FIG. 2B), corresponding elastic surface at $\bar{\rho}=4.8\pm0.3\%$ showing the computed anisotropy as compared to that of an equally dense octet truss (gray surface). FIG. 2C. Lamellar; (FIG. 2D), isotropic; (FIG. 2E), cubic; and (FIG. 2F), trigonal geometries with the corresponding elastic surfaces as insets (same $\bar{\rho}$ as in FIG. 2B). The Voigt bound of $E/E_s=0.048$ is presented as a golden spherical surface. When not visible, the octet elastic surface is contained within the bi-continuous material's surface. The preferential m-vectors are depicted where applicable. Scale bar, 50 µm.

FIGS. 3A-3H. Cyclic loading and recovery. Cyclic loading of a 11 nm-thick columnar architecture: (FIG. 3A) initial geometry; (FIG. 3B) end of linear regime and onset of buckling; (FIG. 3C) nonlinear buckling regime; (FIG. 3D) end of loading regime; (FIGS. 3E-3G), unloading regime showing elastic recovery; (FIG. 3H) final geometry after 10 cycles showing no visible permanent deformation or microcracks. All micrographs correspond to the first cycle, except for FIG. 3H which corresponds to the end of the tenth cycle. Scale bar, 50 µm.

FIG. 4A. Dimensionless curvature probability distribution for the columnar bi-continuous architecture with the stress distribution for uniaxial loading (inset), $\hat{\kappa}_i=\kappa_i L$, where L is the sample characteristic dimension. FIG. 4B. Two octet architectures with fillets of radii 0.5r and r, where r is the strut radius, and stress distribution for the 0.5r case in uniaxial loading (inset, same color map as FIG. 4A). The normalized curvatures are defined as $\hat{\kappa}_i=\kappa_i L$ where $\kappa_i$ is a principal curvature and L is the unit cell dimension. (FIG. 4C) Evolution of first-cycle-normalized mechanical properties through cyclic loading for hollow octet and columnar bi-continuous material of relative density $\bar{\rho}=0.15\%$, and 11 nm shells. Insets depict both architectures at maximum compression in an in situ experiment. Inset scale bar, 50 µm.

FIG. 6A. Rendered image of a tessellation of the isotropic prototype geometry (computed). FIG. 6B. SEM micrograph of the self-assembled centimeter-scale sample in FIG. 1B.

FIGS. 7A-7G. Sample Fabrication Details. FIG. 7A. Columnar bi-continuous architecture fabricated using two-photon lithography with an 11 nm $Al_2O_3$ coating, with five rectangular perforations at the top obtained via focused ion beam milling. FIG. 7B. Hollow shell-based sample after 80 hours in an $O_2$ plasma ashing system. FIG. 7C. Micrograph of a columnar sample obtained at a high imaging voltage (10 kV) showing the hollow nature of the samples; high-voltage micrographs for the 11 nm (FIG. 7O) lamellar; (FIG. 7E) isotropic; (FIG. 7F) cubic; and (FIG. 7G) trigonal architectures. Scale bar, 50 µm.

FIG. 8A. Elastic surfaces of the columnar and octet architectures at a relative density of $\bar{\rho}\approx 1.8\%$ and (FIG. 8B) $\bar{\rho}\approx4.8\%$. FIGS. 8C-8D. Cross-sections of the surfaces presented in FIG. 8A and FIG. 8B, respectively. At $\bar{\rho}\approx4.8\%$ the hollow-beam octet's elastic surface is more directly comparable to its extensively studied solid-beam counterpart, and the nano-labyrinthine surfaces at this relative density were representative of lower relative densities.

FIG. 9A. Elastic surface for the isotropic architecture (from FIG. 20) and (FIG. 9B) transparent isotropic surface depicting the octet's surface contained inside it. FIG. 9C. Plane cuts of both surfaces showing superior stiffness in the isotropic architecture of up to 61% in some directions.

FIG. 12A. Columnar bi-continuous architecture fabricated using two-photon lithography showing shell waviness due to the layer-by-layer nature of the fabrication process. FIG. 12B. Finite element models of a corrugated sheet with varying thicknesses t and amplitudes A, for a constant wavelength $\lambda=600$ nm (corresponding to two printing layers). FIG. 12C. Stiffness of the corrugated sheets $k_\lambda$ normalized by the stiffness of a flat sheet k, for various amplitude-thickness combinations, upon loading from the top with roller boundary conditions on the sides. At small thicknesses, the two-orders-of-magnitude knockdown is attributed to corrugation. Black and white scale bars, 50 µm and 10 µm, respectively.

FIG. 13A. Isotropic architecture. FIG. 13B. Columnar architecture along the [100] direction. FIG. 13C. Lamellar architecture along the [001] direction. FIG. 13D. Lamellar architecture along the [010] direction. Scale bars, 50 µm.

FIG. 14A. Cubic architecture. FIG. 14B. Isotropic architecture. FIG. 14C. Lamellar architecture. FIG. 14D. Trigonal architecture.

FIG. 15C. Cyclic stress-strain response for both samples, showing a self-similar response for the columnar architecture and a significant decay in the octet architecture's response.

FIG. 17A. Elementary doubly curved shell section depicting the stress resultants (left), and uniaxial compression simulations of three simplified representative structures for the columnar architecture under the same boundary conditions (right). In particular, we show the compression of: (i) a waisted shell with negative Gaussian curvature (i.e., $\kappa_1\kappa_2<0$) showing in-plane stress intensification, (ii) a cylindrical shell with zero Gaussian curvature showing the ideal case of constant in-plane stress, and (iii) a barreled shell with positive Gaussian curvature showing attenuation of vertical in-plane stress. FIGS. 17B-17C. Finite element models of uniaxial compression on the columnar architecture with maximum in-plane stress regions shown in red (FIG. 17B) along with the vectors corresponding to their orientation (FIG. 17C), presenting evidence of no attenuation in vertically aligned domains.

STATEMENTS REGARDING CHEMICAL COMPOUNDS AND NOMENCLATURE

Figures 1A, 1B:
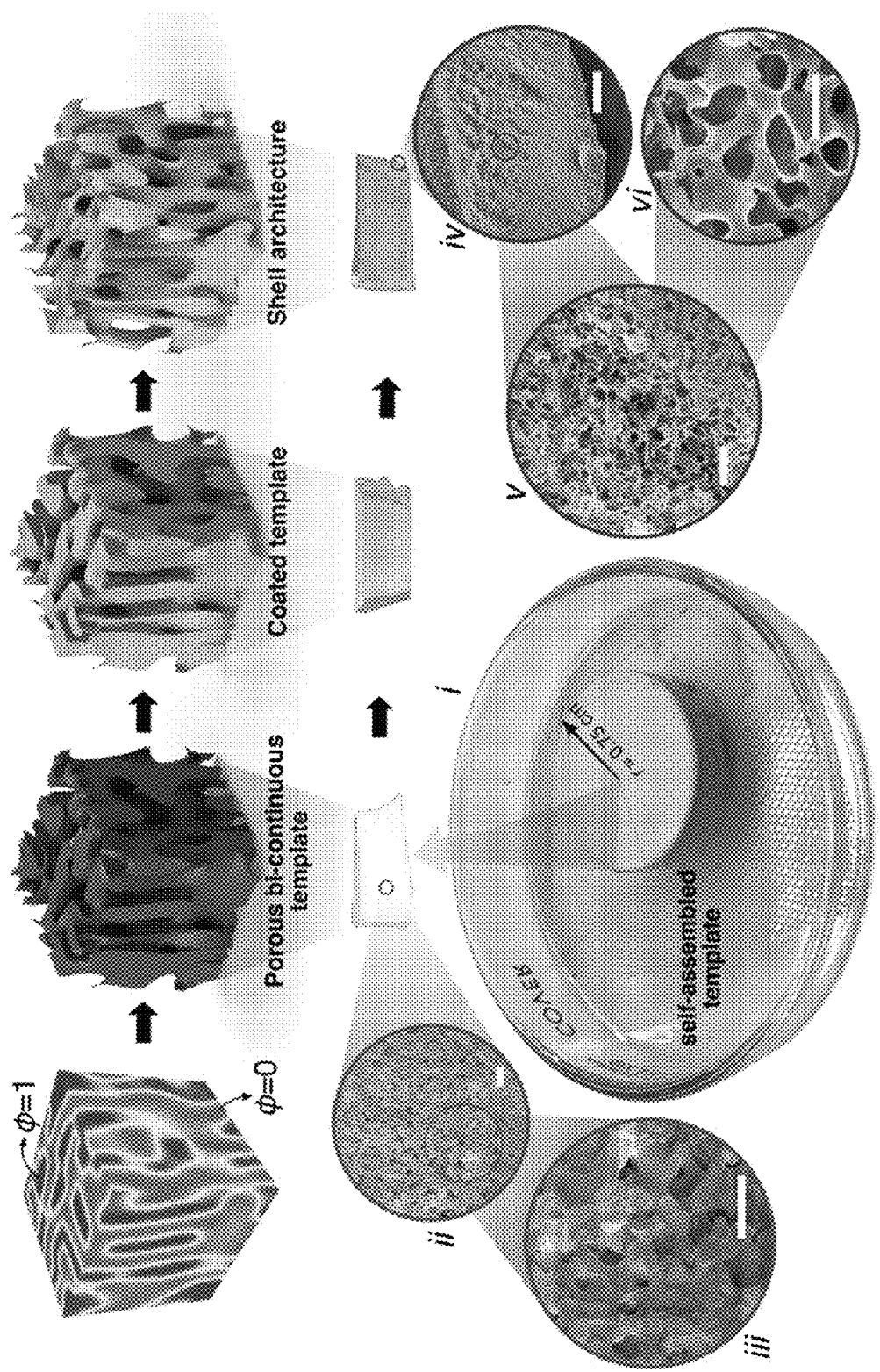
FIGS. 1A-1B. Self-assembled nano-labyrinthine shell-based material.

In general, the terms and phrases used herein have their art-recognized meaning, which can be found by reference to standard texts, journal references and contexts known to those skilled in the art. The following definitions are provided to clarify their specific use in the context of the invention.

The term "shell-based material" refers to a material having a shell structure or a plurality of shell features. The shell structure or plurality of shell features may be arranged as a shell network.

The term "shell feature" refers to an element or portion of a shell-based material having at least one internal lumen, cavity or void space defined by a one or more walls, such as walls resulting from one or more outer layers. Walls defining a shell feature may have a constant or a variable thickness. A shell feature may have a tubular or other hollow structure. As used herein, a "thickness" of a shell feature corresponds to a thickness or cross-sectional of a wall of the shell feature. A continuous shell structure (whose internal lumen, cavity or void space is continuously fluidically-connected throughout said structure), such as a continuous tubular or other continuous hollow structure, for example, can optionally be described as being formed of a plurality of shell features, the plurality of shell features optionally having different parameter(s), such as shell/wall thickness, cavity diameter, etc. For example, a sum of all shell features of a shell-based material can together correspond to or together form a continuous shell structure. In some embodiments, a continuous shell structure can be characterized as a shell network.

The term "shell network" or "porous shell network" refers to an arrangement or structure of a shell or plurality of shell features that are fluidically connected. In some embodiments a shell network is a continuous arrangement or structure of a shell or plurality of shell features. In some embodiments a shell network is a smoothly varying arrangement or structure of a shell or plurality of shell features, and optionally wherein features are physically interconnected and/or fluidically-connected. Shell networks of some aspects are characterized by a non-periodic spatial distribution of shell features, for example, where shell features are provided in an anisotropic spatial distribution in one or more directions. In some embodiments, the internal cavities or internal volume of a shell network are in fluid communication. Optionally, the shell network is non-period and is not a lattice. Preferably, the shell network or shell-based material is deterministic, wherein the arrangement or geometry of the shell network is predetermined and preferably the normalized curvature, average thickness, characteristic length, magnitude of inverse principal curvature, and/or average density of one or more shell features or of the shell-based material are predetermined.

The term "bicontinuous shell network" refers to a shell network of a shell-based material configured such that the shell-based material has two distinct volumes (or, phases) which are not fluidically connected to each other within the shell-based material and which are separated (fluidically and physically) from each other by the wall(s) of the shell network (or shell features thereof), wherein each of said distinct volumes is independently continuous and fluidically-connected throughout itself. Preferably, a first of the two distinct volumes corresponds to the lumen, inner cavity, or inner void spaces of the shell network (or, of the plurality of features thereof). A preferably, a second of the two distinct volumes corresponds to the remainder of the shell-based material's volume exclusive of the shell network itself (or shell features thereof) and its wall(s).

The terms "fluidically-connected," "fluidically connected," and "in fluid communication" can be used interchangeably and refer to an arrangement of materials, elements, features, portions, or structures such that a fluid can be transported among (preferably, though) said materials, elements, features, portions, or structures. Two hollow materials or shell features are "fluidically-connected" when they are arranged such that a fluid can be transported from one to the other via their lumen, inner cavity, or inner void space. For example, in some embodiments two shell features are in fluid communication with one another if a fluid flow path is provided directly between the two shell features. In some embodiments, two shell features are in fluid communication with one another if a fluid flow path is provided indirectly between the two shell features, such as by including one or more other shell features or flow paths between the two shell features. In one embodiment, two shell features present in a body of fluid are not necessarily in fluid communication with one another unless fluid from the first shell feature is drawn to, past and/or through the second shell feature, such as along a flow path. Preferably, any two shell features that are fluidically-connected are arranged such that a fluid can be transported from the lumen, inner cavity, or inner void space of one shell feature to the lumen, inner cavity, or inner void space of the other shell feature either directly or indirectly via one or more intervening shell features. Preferably, any plurality of shell features, of a shell-based material, that are fluidically-connected are arranged such that a fluid can be transported among/throughout the lumens, inner cavities, or inner void spaces of the plurality of shell features either directly or indirectly via one or more intervening shell features of the same shell-based material, and more preferably such that said fluid is confined to said plurality of shell features and said intervening shell features except where the fluid is outside of (e.g., when exiting) or external to the shell-based material having said plurality of shell features and said intervening shell features. Preferably, the lumen, inner cavity, or inner void space of each shell feature of a shell-based material is fluidically connected with the lumen, inner cavity, or inner void space of each other shell feature of the same shell-based material. A continuous shell feature or continuous shell structure is one whose lumen, inner cavity, or inner void space is fluidically connected throughout said continuous shell feature of continuous shell structure.

The term "interconnected" refers to a physical arrangement of features, elements, or portions of a material or structure. For example, a first feature is interconnected with a second feature if the first and second features are either directly physically connected or indirectly physically connected via a third feature. Preferably, any two interconnected shell features are also fluidically connected.

The term "inverse principal curvature" refers to a property of a structure, such as a shell feature of a shell based material, corresponding to a value of one of the radii of curvature at a given point (along one of the two principal orthogonal directions). A magnitude of the inverse principal curvature is the absolute value of one of the radii of curvature at a given point (along one of the two principal orthogonal directions). The inverse principal curvature of a structure can be determined by a variety of analytical or computational techniques including differential geometry and computer aided design. For example, determination of radius of curvature is discussed by Ziehmer et al. (2016) and Kwon et al. (Y. Kwon, et al., 2010, "Morphology and topology in coarsening of domains via non-conserved and conserved dynamics," Philosophical Magazine, 90:1-4, 317-335, DOI: 10.1080/147864309032607012010), following the mathematical definition also presented by Weisstein (at Weisstein, Eric W. "Radius of Curvature." From *MathWorld*—A Wolfram Web Resource; available at https://mathworld.wolfram.com/RadiusofCurvature.html, last accessed on Sep. 22, 2020), all of which are incorporated herein by reference in their entirety.

The term "ratio of average thickness to length" refers to a property of a structure, such as a shell feature of a shell based materials, corresponds to an average thickness determined over a length of the feature divided by the length of the feature.

The term "normalized curvature" (or "scaled curvature") refers to a property of a structure, such as a shell feature of a shell based material, corresponding to the curvature multiplied by a microstructural characteristic length. The normalized curvature of a structure can be determined by a variety of analytical or computational techniques including differential geometry and computer aided design, as also presented in Ziehmer et al (2016), which is incorporated herein by reference in its entirety.

The term "hollow" refers to a material or structure that has one or more internal cavities and/or void spaces, an optionally provided as one or more continuous and/or fluidically-connected internal cavities and/or void spaces, for example provide as one or more internal channel, lumen, chamber or bore. In an embodiment, for example, said shell features of said porous shell network are at least partially hollow features, such as a feature wherein an outer structural layer at least partially encloses or at least partially surrounds one or more internal cavities and/or void spaces. In an embodiment, for example, said shell features of said porous shell network are at least partially hollow features, for example wherein greater than 30% of the volume of the feature is void space such as provided by one or more internal channel, lumen, chamber or bore, optionally for some embodiments greater than 40% of the volume of the feature is void space, and optionally for some embodiments greater than 50% of the volume of the feature is void space . . . .

The term "theoretical stiffness bound" or "Voigt bound" are used interchangeably and refer to the maximum possible stiffness of a material. The theoretical stiffness bound of a material can be determined by a variety of techniques including multiplying the fill fraction of a porous material by the stiffness of the solid portion of the material, as shown for similar structures by Vidyasagar et al (A. Vidyasagar, et al., 2018, "Microstructural patterns with tunable mechanical anisotropy obtained by simulating anisotropic spinodal decomposition," Proc. R. Soc. A, 474: 20180535, doi: http://dx.doi.org/10.1098/rspa.2018.0535), Meza et al (L. R. Meza, et al., 2017, "Reexamining the mechanical property space of three-dimensional lattice architectures," Acta Materialia, Volume 140, November 2017, Pages 424-432, doi: 10.1016/j.actamat.2017.08.052), or similarly for a theoretical strength by Khaderi et al (S. N. Khaderi, 2017, "The indentation response of Nickel nano double gyroid lattices," Extreme Mechanics Letters, Volume 10, January 2017, Pages 15-23, doi: 10.1016/j.eml.2016.08.006), all of which are incorporated herein by reference in their entirety.

The term "stiffness-to-density ratio" refers to a mechanical property of a material, such as a shell-based material, and refers to the ratio of the net stiffness to the density of the material, also referred to as specific stiffness. The stiffness-to-density ratio of a material can be determined by a variety of techniques including a combination of computer aided design and finite element analysis, or experimentally via uniaxial compression with knowledge of the material density. For additional discussion of determining specific stiffness, see Injeti, et al. (S. S. Injeti, November 2019, "Metamaterials with engineered failure load and stiffness," PNAS, 116 (48) 23960-23965; doi: 10.1073/pnas.1911535116), which is incorporated herein by reference in its entirety.

The expression "resilient response showing no crack formation" refers to a mechanical property of a material, such as a shell-based material, and refers to a value or range of strain within which no failure events take place, for example, for a strain range of greater than 0% to 40%. The resilient response of a material can be determined by a variety of techniques including uniaxial compression experiments. For additional discussion of evaluating material response and crack formation, see Dou, et al. (N. G. Dou, July 2018, Nano Lett. 2018, 18, 8, 4755-4761, doi: 10.1021/acs.nanolett.8b01191), which is incorporated herein by reference in its entirety.

The term "defect density" refers to a property of a material, such as a shell-based material, and refers to the number of defects per volume of a material. The defect density of a material can be determined by a variety of techniques known in the art. For additional discussion of defects in structures, see Hsieh, et al. (M.-T. Hsieh, et al., April 2019, "The mechanical response of cellular materials with spinodal topologies," Journal of the Mechanics and Physics of Solids, Volume 125, April 2019, Pages 401-419, doi: 10.1016/j.jmps.2019.01.002), which is incorporated herein by reference in its entirety.

The term "throughput volume" refers to a property of a material, such as a shell-based material, and refers to the volume of a material that can be fabricated in a given period of time.

A deterministic material, network, or structure is custom engineered to be useful for a specific application, where the specific application requires or benefits from one or more features or properties of the material, network, or structure. The term "deterministic" refers to a material, network, or structure characterized by at least one deterministic feature or property, which is predicted and controlled to be substantially equivalent to at least one pre-determined feature or property. A "pre-determined" feature or property, or value(s) thereof, is the feature or property as determined or selected prior to the formation of the internal structure. As used here, "substantially equivalent" refers to the at least one feature or property being equal to or within 30%, preferably within 20%, preferably within 10%, more preferably within 5%, more preferably within 1%, or more preferably within 0.1%, of the at least one pre-determined feature or property. Process conditions and parameters are selected based on the at least one pre-determined feature or property. Thus, a deterministic internal structure is formed to have the at least one pre-determined feature or property, such that the deterministic internal structure has the corresponding at least one deterministic feature or property.

The term "metal" refers to a metal element of the periodic table of elements. Preferably, as used herein, the term "metal" includes elements that are metalloids. Metalloids elements include B, Si, Ge, As, Sb, and Te. Optionally, metalloid elements include B, Si, Ge, As, Sb, Te, Po, At, and Se.

The term "metal alloy" refers to an alloy of two or more metals. For example, a metal alloy may be characterized as a solid solution of two or more metal elements (e.g., the metal elements being in the form of atoms or ions in the solid solution), a mixture of metallic phases, or an intermetallic compound. A metal alloy can be characterized as comprising metallic bonding. In certain embodiments, a metal, rather than a metal alloy, refers to a metallic material whose chemical formula has one metal element (i.e., its compositions has substantially or essentially one metal element).

The term "ceramic" refers to a solid material comprising an compound of metal, non-metal, or metalloid atoms substantially or essentially held in ionic or ionic and covalent bonds. For example, a ceramic material can be characterized as having cations (e.g., metal ions, which can be metalloid ions) and anions (e.g., oxygen ions, nitrogen ions, carbide ions) substantially or essentially held together in ionic or ionic and covalent bonds. Any metal-containing material that is made by any method for making a metal-containing material disclosed herein can be a ceramic (i.e., a metal-containing ceramic). Exemplary ceramic materials include, but are not limited to, barium titanate, bismuth strontium calcium copper oxide, boron oxide, boron nitride, ferrite, lead zirconate titanate magnesium diboride, silicon carbide, silicon nitride, sialon (silicon aluminum oxynitride), aluminum oxide, copper oxide, cobalt oxide, zinc oxide, steatite, titanium carbide, titanium oxide, uranium oxide, yitrium barium copper oxide, zirconium dioxide, and any combinations of these.

The term "mixture" refers to a liquid mixture comprising one or more liquid solvents (e.g., water, nonaqueous solvent and/or other non-water solvents) and one or more chemical species dissolved and/or dispersed in the one or more solvents. Solutions, dispersions, colloids (i.e., colloidal dispersion), and suspensions are exemplary mixtures. For example, a mixture can be a solution, a dispersion, a colloid (i.e., colloidal dispersion), or a suspension. A mixture can be a homogeneous or a heterogeneous mixture. In some embodiments, a mixture is a homogeneous mixture, wherein the one or more dissolved and/or dispersed chemical species are homogeneously, or uniformly, dissolved and/or dispersed in the one or more solvents of the homogeneous mixture. Chemical species dispersed and/or dissolved in a mixture can include, but are not limited to, a first polymer precursor component and a second polymer precursor component, and optionally additional polymer precursor components. Chemical species dispersed and/or dissolved in a mixture can include photo responsive materials, such as photocurable and/or photo-crosslinkable polymers and/or prepolymers and/or photointiators and any combination of these.

The term "wt. %" refers to a weight percent by weight. The term "mol. %" refers to molar percent or percent by moles.

As used herein, the term "polymer" refers to a molecule composed of repeating structural units connected by covalent chemical bonds often characterized by a substantial number of repeating units (e.g., equal to or greater than 3 repeating units, optionally, in some embodiments equal to or greater than 10 repeating units, in some embodiments greater or equal to 30 repeating units) and a high molecular weight (e.g. greater than or equal to 1 kDa, greater than or equal to 5 kDa, greater than or equal to 10,000 Da, in some embodiments greater than or equal to 50,000 Da or greater than or equal to 100,000 Da). Polymers are commonly the polymerization product of one or more monomer precursors. The term polymer includes homopolymers, or polymers consisting essentially of a single repeating monomer subunit. The term polymer also includes copolymers which are formed when two or more different types of monomers are linked in the same polymer. Copolymers may comprise two or more monomer subunits, and include random, block, brush, brush block, alternating, segmented, grafted, tapered and other polymer architectures. Useful polymers include organic polymers or inorganic polymers that may be in amorphous, semi-amorphous, crystalline or semi-crystalline states. Polymer side chains capable of cross linking polymers (e.g., physical cross linking) may be useful for some applications.

The term "photopolymerization" refers a process that uses electromagnetic radiation, such as light, such as visible light, infrared light, and/or ultra-violet light, to initiate and propagate a polymerization or cross-linking reaction between or among cross-linkable materials or chemical species, such as a prepolymer and/or polymer. Photopolymerization may be initiated and/or controlled by photoinitiators, for example provide to a mixture of prepolymers and polymers. Examples of photoinitators include, but are not limited to, 7-diethylamino-3-thenoylcoumarin, lithium phenyl-2,4,6-trimethylbenzoylphosphinate, (here is a list of photoinitiators: https://www.sigmaaldrich.com/content/dam/sigma-aldrich/docs/Aldrich/General_Information/photoinitiators.pdf)

The term "macroscopically monolithic" refers to a material, system, structure, geometry, or other element that is a unitary interconnected and continuous element. In an embodiment, a macroscopically monolithic element is formed or composed of a material without joints or seams. In an embodiment, the term "interconnected" refers to a system, structure, geometry, or other element of which every first portion or first feature is either (i) directly connected to a second portion or second feature of the system, structure, geometry, or other element, or (ii) indirectly connected to a second portion or second feature of the system, structure, geometry, or other element via a third portion or third feature of the system, structure, geometry, or other element. In an embodiment, no portion or feature of an interconnected system, structure, geometry, or other element is fully isolated from the rest of the system, structure, geometry, or other element. In an embodiment, the term "continuous" refers to a system, structure, geometry, or other element of which every first portion or first feature is directly or indirectly bonded to, fused with, or otherwise belongs to the same uninterrupted phase with respect to a second portion or second feature of system, structure, geometry, or other element. In an embodiment, two features which are connected merely by superficial contact (e.g., touching) but are otherwise isolated with respect to each other, are not continuous. In an embodiment, two distinct features, such as fibers or particles, which are merely touching or are woven together may be interconnected but are not continuous with respect to each other. In an embodiment, a structure or geometry consisting of a plurality of features, such as fibers or particles, each of which is merely touching or woven together with another feature, such as a fiber or particle, may be an interconnected structure or geometry but is not a continuous structure or geometry. The term macroscopically monolithic does not and is not intended to describe a size of the material or element. An element can be microscopic or nanoscopic and be characterized as having a macroscopically monolithic structure as described here.

The term "three dimensional geometry" refers to a geometry characterized by a three-dimensional geometric configuration. In an embodiment, a structure has a three dimensional geometry when a three-coordinate system of physical space is required to fully describe the physical dimensions of a unit cell of the structure. A three dimensional geometry may be nano-architected and/or micro-architected. In an embodiment, a structure characterized by a nano-architected three dimensional geometry is a structure characterized one or more features, such as shell features, having at least one physical size dimension (e.g., length, width, diameter, or height).

As used herein, a "feature" of a system or material, such as a shell-based material according to an embodiment, structure, or geometry, such as a three-dimensional geometry according to an embodiment, refers to a structural element such as, but not limited to, a sheet, a shell, smooth structure or a combination of these.

The term "cross-sectional physical dimension" refers to a physical dimension of a feature measured in a transverse or cross-sectional axis. In an embodiment, the transverse axis is perpendicular to a longitudinal axis of the feature. In an embodiment, a cross-sectional physical dimension corresponds to a width or a diameter of a feature such as a beam, strut, or tie. In an embodiment, a longitudinal physical dimension is a dimension of a feature along the longitudinal axis of the feature, wherein the longitudinal axis is perpendicular to a cross-sectional axis. Optionally, the longitudinal physical dimension is measured between two nodes. Optionally, the longitudinal physical dimensions is measured between to physical ends of a structure.

The term "average," when used in reference to a material or structure property, refers to a calculated arithmetic mean of at least two, or preferably at least three, identical measurements or calculations of said property. For example, an average density of a structure is the arithmetic mean of at least two measurements performed identically, of the density of said structure.

The term "density" refers to volumetric mass density. Density is represented in units of mass-per-volume (e.g., $g/cm^3$). When referring to a material, the term density corresponds to the volumetric mass density of the material. When referring to a structure, the term density corresponds to the volumetric mass density of the structure, which is a function of the geometric configuration (geometry) of the structure as well as a function of the material(s) of which the structure is formed, such that an increase in porosity of said structure corresponds to a decrease in density of said structure. The density of a structure, such as a structure having a three-dimensional geometry according to an embodiment of the invention, may be measured according a method conventionally known, or not yet known, in the art. For example, the density of a structure may be determined by determining mass, height, and diameter for a disk-shape sample, and then calculating the determined mass divided by volume for the sample, with assuming the sample is substantially a complete circle.

The term "relative density" refers to a volume fraction of solid material in a composite material system, structure, or feature. In an embodiment, a relative density corresponds to a ratio of density of a structure to density solid material (or the combination of materials), of which the structure is composed. Relative density may be represented as a fraction (the ratio of densities) or as a percentage (the ratio of densities×100%). In two-phase materials such as shell-based materials described herein, the definition of relative density above is equivalent to the fill fraction and can be determined via computer aided design tools or finite element meshes.

The term "specific strength" refers to a ratio of strength to density of a material, system, structure, or feature where strength refers to force per unit area at the point of failure of the material, element, or structure. Specific strength may also be referred to as strength-to-weight ratio. In an embodiment, "strength" refers to compressive strength. In an embodiment, "strength" refers to tensile strength. In an embodiment, compressive strength is the maximum stress a material can sustain under crush loading. In an embodiment, compressive strength of a material, structure, or element that fails by shattering fracture can be defined within fairly narrow limits as an independent property. In an embodiment, the compressive strength of a material, structure, or element that does not shatter in compression is the amount of stress required to distort the material an arbitrary amount. In an embodiment, compressive strength of a material, structure, system, feature, or element that does not shatter in compression can be calculated as the stress at a 0.2% strain offset from the linear portion in a stress-strain curve. In an embodiment, compressive strength is calculated by dividing the maximum load, on the material, structure, or element, by the original cross-sectional area of the material, structure, or element being examined.

The term "stiffness" refers to an extent to which a material, structure, system, or feature resists deformation in response to an applied force. Stiffness corresponds to a ratio of force applied to a material, structure, or element versus the displacement produced by the applied force along the same degree of freedom (e.g., same axis or direction) exhibited by the material, structure, or element. The term "specific stiffness" refers to a ratio of stiffness to density of the material, element, or structure. In an embodiment, the stiffness of a material, structure, or element is the Young's modulus of the material, structure, or element.

The term "polymer precursor" refers to one or more polymers (preferably capable of undergoing further polymerization), one or more prepolymers, one or more monomers, or any combination of these. Generally, the terms "monomer" and "prepolymer" are used interchangeably as referring to a monomer, as the term is readily recognized in the field of polymers and polymerization, or species capable of undergoing polymerization to fully cured state having higher molecular weight. In some embodiments, the term "pre-polymer" or "prepolymer" refers to a monomer or mixture comprising one or more monomers where the monomer(s) have been reacted to an intermediate molecular mass state. According to some embodiments, an oligomer is an exemplary prepolymer. The prepolymer is capable of undergoing further polymerization to a fully cured higher molecular weight state.

The term "substantially" refers to a property that is within 10%, within 5%, within 1%, or is equivalent to a reference property. The term "substantially equal", "substantially equivalent", or "substantially unchanged", when used in conjunction with a reference value describing a property or condition, refers to a value that is within 10%, optionally within 5%, optionally within 1%, optionally within 0.1%, or optionally is equivalent to the provided reference value. For example, a ratio is substantially equal to 1 if the value of the ratio is within 10%, optionally within 5%, optionally within 1%, or optionally equal to 1. The term "substantially greater", when used in conjunction with a reference value describing a property or condition, refers to a value that is at least 2%, optionally at least 5%, or optionally at least 10% greater than the provided reference value. The term "substantially less", when used in conjunction with a reference value describing a property or condition, refers to a value that is at least 2%, optionally at least 5%, or optionally at least 10% less than the provided reference value.

The term "porous" refers to a material, element, or structure that has porosity. The term "porosity" refers to the amount of a material or structure, such as a three-dimensional structure of an electrode, corresponding to an absence of said material or structure, such as absence corresponding to pores, such as apertures, channels, voids, etc. Porosity may be expressed as the percentage of the volume of a material or structure which corresponds to pores, such as apertures, channels, voids, etc., relative to the total volume occupied by the material, structure or device component.

A "matrix phase" refers to a material, or a combination of materials, that may at least partially infiltrate a structure of a composite material system. A matrix phase may be uniform or non-uniform. A matrix phase may be homogeneous or non-homogeneous. At least partial infiltration of the structure refers to at least partial filling of void space of a structure. In an embodiment, at least partial infiltration of the structure refers to at least partial filling of accessible void space of a structure. Non-accessible void space of a structure may refer to closed void regions into a matrix phase may not penetrate without first etching or performing another destructive process on said structure.

"Young's modulus" is a mechanical property of a material, device or layer which refers to the ratio of stress to strain for a given substance. Young's modulus may be provided by the expression:

$$E = \frac{(\text{stress})}{(\text{strain})} = \left(\frac{L_0}{\Delta L}\right)\left(\frac{F}{A}\right), \tag{I}$$

where E is Young's modulus, $L_0$ is the equilibrium length, $\Delta L$ is the length change under the applied stress, F is the force applied, and A is the area over which the force is applied. Young's modulus may also be expressed in terms of Lame constants via the equation:

$$E = \frac{\mu(3\lambda + 2\mu)}{\lambda + \mu}, \tag{II}$$

where $\lambda$ and $\mu$ are Lame constants. The Young's modulus may be measured according a method conventionally known, or not yet known, in the art. For example, the Young's modulus corresponds to the slope of a linear portion of a stress-strain curve as described by Roylance ("Stress-Strain Curves," MIT course, Aug. 23, 2001; accessed at time of filing at http://web.mit.edu/course/3/3.11/www/modules/ss.pdf).

According to certain embodiments, a shell-based materials is characterized by a structure having a substantially node-free geometry (i.e., free or substantially free of node features). In some embodiments, for example, the node-free geometry has exceptional mechanical resilience. Mechanical resilience may be understood, for example, in terms of strain-to-failure and strength-to-failure. In an embodiment, strength-to-failure of a material, element, or structure corresponds to compressive strength of the material, element, or structure. In an embodiment, a structure of the invention has a strain-to-failure of selected from the range of 5% to 40%, optionally 10% to 40%, optionally 20% to 40%, optionally 5% to 50%, optionally 10% to 50%, optionally 20% to 50%. Strain-to-failure may be determined according to a method conventionally known, or not yet known, in the art. For example, strain-to-failure may be determined from the strain value corresponding a linear portion, such as the third linear portion, of stress vs. strain data until sudden stress loss (fracture) of a structure.

In an embodiment, the term "defect" may refer to a fabrication-induced imperfection, or unintended feature or property, such as, but not limited to, local deformation, crack, beam junction offset, beam bulging, curvature of a strut, and pit or void.

Greer, et al. (U.S. application Ser. No. 16/151,186, filed Oct. 3, 2018) and Portela, et al. (U.S. application Ser. No. 16/206,163, filed Nov. 30, 2018) are incorporated herein by reference in their entirety, to the extent not inconsistent herewith. Greer, et al., and Portela, et al., include additional descriptions of photopolymerization techniques, additive manufacturing, and structural or geometrical features, for example.

In an embodiment, a composition or compound of the invention, such as an alloy or precursor to an alloy, is isolated or substantially purified. In an embodiment, an isolated or purified compound is at least partially isolated or substantially purified as would be understood in the art. In an embodiment, a substantially purified composition, compound or formulation of the invention has a chemical purity of 95%, optionally for some applications 99%, optionally for some applications 99.9%, optionally for some applications 99.99%, and optionally for some applications 99.999% pure.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

Aspects of the invention relate to the design and fabrication of materials with three-dimensional (3D) architecture formed via self-assembly and/or templating processes. In particular, the spinodal decomposition (i.e., phase separation) of polymeric emulsions is used in some embodiments to create a bi-continuous scaffold that serves as a template for conformal coating with a metal or ceramic of choice. Upon removal of the polymeric template, the remaining interconnected shell features make up the shell-based architected 3D material.

In some examples, the shell features possess thicknesses ranging from tens of nanometers to hundreds of micrometers and are characterized by small curvatures and lack of straight edges which enhances the mechanical response. In an embodiment, shell networks conform the reinforcing phase of a composite material. The bi-continuous nature of these shells creates two continuous domains which may be infiltrated with different matrix phases, for example, in a composite material.

Using self-assembly processes to fabricate architected materials provides an alternative to restrictive additive manufacturing techniques. Selection of the parameters for the spinodal decomposition process (e.g., temperature, time, molar ratios, polymer/prepolymer composition, photoinitiators, etc.) enables tunability of the resulting morphology (e.g., the architecture), which translates to a wide range of mechanical properties. The shell-based materials obtained through these processes outperform deterministic, periodic architected materials with respect to certain combinations of properties.

The invention can be further understood by the following non-limiting examples.

Example 1A: Extreme Mechanical Resilience of Self-Assembled Nano-Labyrinthine Materials Nano- and micro-architected materials to date have relied on additive manufacturing techniques to produce beam-, plate- and shell-based architectures that achieve highly desired mechanical properties while being limited to low throughput volumes as well as to periodic and symmetric designs that deteriorate if symmetry-breaking defects are present. In this example, we demonstrate the fabrication of nano-architected materials via scalable self-assembly processes, whose features span across multiple scales—from nanometers to centimeters. Through experiments and simulations, we show that the smooth, doubly-curved shell-based geometries achieved through this process can surpass truss-based architectures in terms of energy absorption, stiffness-to-density response, and especially mechanical resilience through an unprecedented combination of material size effects and optimal topology.

Low-density materials with tailorable properties have attracted attention for decades, yet stiff materials that can resiliently tolerate extreme forces and deformation, while being manufactured at large scales, have remained a rare find. Designs inspired by nature, such as hierarchical composites and atomic-lattice-mimicking architectures, have achieved optimal combinations of mechanical properties but suffer from limited mechanical tunability, limited long-term stability, and low throughput volumes that stem from limitations in additive manufacturing techniques. Based on natural self-assembly of polymeric emulsions via spinodal decomposition, here we demonstrate a concept for the scalable fabrication of non-periodic, shell-based ceramic materials with ultralow densities, possessing features on the order of tens of nanometers and sample volumes on the order of cubic centimeters. Guided by simulations of separation processes, we numerically show that the curvature of self-assembled shells can produce close-to-optimal stiffness scaling with density, and we experimentally demonstrate that a carefully chosen combination of topology, geometry, and base material results in superior mechanical resilience in the architected product. The present approach provides a pathway to harnessing self-assembly methods in the design and scalable fabrication of beyond-periodic and non-beam-based nano-architected materials with simultaneous directional tunability, high stiffness, and unsurpassed recoverability with marginal deterioration.

The design of architected cellular materials to date has heavily relied on truss-based geometries, which achieve desirable mechanical properties such as high stiffness- or strength-to-density ratios [1-6], flaw tolerance [7], high energy absorption [8], and vibration mitigation [9]. Truss-based architectures, like open-cell foams, engage their structural members in both stretching and bending, the latter being particularly prominent in non-slender beam networks regardless of architecture [10, 11]. This compliant deformation mode is responsible for poor stiffness-to-density scaling [2, 4, 8](i.e., the effective truss stiffness decreases strongly— faster than linearly—with decreasing density and weight). Additionally, truss lattices have relied on symmetry, periodicity, and scarcity of defects [10] to achieve their ideal mechanical properties. Symmetry-breaking defects in these materials, emerging in virtually any fabrication route, can undermine their strength and stiffness as well as their resilience upon sustained loading [12-15]. As an alternative, plate- and shell-based geometries have been shown to mitigate bending and to reach theoretical stiffness bounds [16, 17] by improving the load distribution within their members as compared to trusses. Unfortunately, those usually exhibit poor recoverability since most truss- and plate-based designs suffer from stress concentrations at junctions, which commonly leads to localized permanent damage and material failure under applied loads [8, 15]. As an apparent remedy, smooth shell architectures such as triply periodic minimal surfaces (TPMS) [18] avoid sharp junctions and attain high stiffness, owing to double curvature in its components. This concept of nonzero Gaussian curvature, first introduced by Gauss in his *Theorema Egregium*, explains the mechanical benefits of doubly curved surfaces [19] and has been identified as providing rigidity to natural structures such as egg shells [20] and plant leaves [21]. Recently, applications of this concept have led to smooth shell architectures that achieve stretching-dominated behavior and have superior energy absorption capabilities as compared to trusses [22-25].

The beneficial mechanical properties of those synthesized truss-, plate-, and shell-based architected materials are largely enabled by the periodicity of symmetric unit cells, which can be susceptible to symmetry-breaking defects such as strut/wall waviness, varying cross-section, and offset nodes [8, 10, 12] as well as the effects of free boundaries [18, 26]. Moreover, such periodic architectures are typically achievable only through additive manufacturing techniques at small scales, which are non-scalable and often introduce defects, inevitably resulting in lower-than-theoretical strength and stiffness. As a point of departure from periodicity, materials that are formed through natural evolution processes like nanoporous foams [27] are often non-periodic and comprised of bi-continuous networks of smooth, doubly curved solid morphologies. Architectures obtained through these processes are also typically isotropic and can be particularly resilient against defects [28]. Tuning these natural morphologies, with the potential for direction-dependent properties, can be achieved via molecular processes like self-assembly of block copolymers [29, 30] or polymeric micro-emulsions [31-33]. These processes not only enable orders-of-magnitude increase in fabrication volumes [34, 35] compared to additively manufactured materials but also have the potential to expand the parameter space by tailoring architectural features whose sizes range from tens of nanometers to tens of micrometers, e.g., by changes in phase concentrations, molecular weights, or temperature [36]. In addition, nano-scale features bear the advantage of leveraging material-level size effects that were previously shown to equip truss lattices with exceptional strength [2] (but poor resilience).

In the shell-based materials and fabrication processes of this example, we combine the best of two approaches—self-assembled double-curvature shell architectures and strong nano-scale material effects—into a new class of nano-labyrinthine materials that do not rely on periodicity and provide a promising scalable pathway to low-density architected materials with extremely low weight, high stiffness, and extreme resilience. We demonstrate a self-assembly based fabrication process that employs natural spinodal decomposition to create templates for doubly curved nano-shell materials with overall sample volumes of up to a few cubic centimeters. To explore the resulting mechanical properties of materials produced via the method described above, we perform a systematic parameter space exploration using computational spinodal decomposition and direct laser writing (DLW) as prototyping tools that enable repeatable nano-mechanical experiments and numerical simulations. Using numerical tools and theory, we provide explanations for the observed extreme recoverability and the predicted stretching-dominated response of these materials, evidencing clear mechanical advantages over truss- or plate-based architected materials.

Self-Assembly Based Fabrication

The fabrication strategy (FIG. 1A) harnesses the self-assembly capabilities of polymeric emulsions to create bi-continuous, doubly curved shell-based materials with throughput volumes on the order of cubic centimeters. With pore sizes on the order of tens of micrometers, and smooth walls with thicknesses on the order of tens of nanometers, our materials span six orders-of-magnitude from the smallest feature dimension to the overall sample dimensions and present the first realization of a scalable self-assembled nano-shell architected material. We fabricated the porous bi-continuous template (FIG. 1B) by exploiting the spinodal decomposition of an epoxy-based emulsion (see Materials and Methods), which produced a fully interconnected, nominally isotropic solid phase of relative density $\bar{\rho} \approx 44\%$ (i.e., fill fraction) upon polymerization with consistent pore morphologies on the order of tens of micrometers [32]. This template was coated with a 79 nm conformal coating of ALD-deposited $Al_2O_3$, followed by $O_2$ plasma ashing to remove the epoxy template and yield the resulting nano-labyrinthine shell-based material. The polymerization-induced phase separation process that creates the initial bi-continuous templates gives these nano-labyrinthine materials the potential to be fully tunable using thermal, chemical, or mechanical stimuli during self-assembly [32, 37, 38], which leads to controllable morphologies for tailoring material properties.

Parameter Space Exploration

To enable a systematic exploration of the wide design space achievable through the general fabrication concept demonstrated in FIG. 1B, we fabricated repeatable samples at the microscale whose geometries were computed to match the characteristics of the larger self-assembled samples.

Simulation of the self-assembly process. To computationally arrive at the bi-continuous morphologies, we described the phase separation process during self-assembly of a generic two-phase system using a Cahn-Hilliard-type phase field model [39], in which $\varphi(X,t)=[0,1]$, defined at position X and time t, separates solid ($\varphi=1$) from void ($\varphi=0$) domains. To control the characteristics of the resulting porous bi-continuous microstructures, we fix the average fill fraction at 50% and tune the surface energy of the interface between the two phases to modify the resulting feature morphology. Drawing inspiration from nanoporous foams and block copolymers whose morphology and directionality can be controlled by properly choosing the alloying [40, 41] or mixing ratios [42], we computed anisotropic shell architectures that mimic such directional tunability [43]. Specifically, we prescribed an anisotropic surface energy $\gamma(n)$ as a function of the surface normal n to penalize growth along a particular set of directions defined by $\{m_1, \ldots, m_n\}$, which produces bi-continuous shapes that are arranged in energetically favorable directions perpendicular to the $m_i$-directions and possess, in principle, any prescribed elastic symmetry.

Figures 6A, 6B:
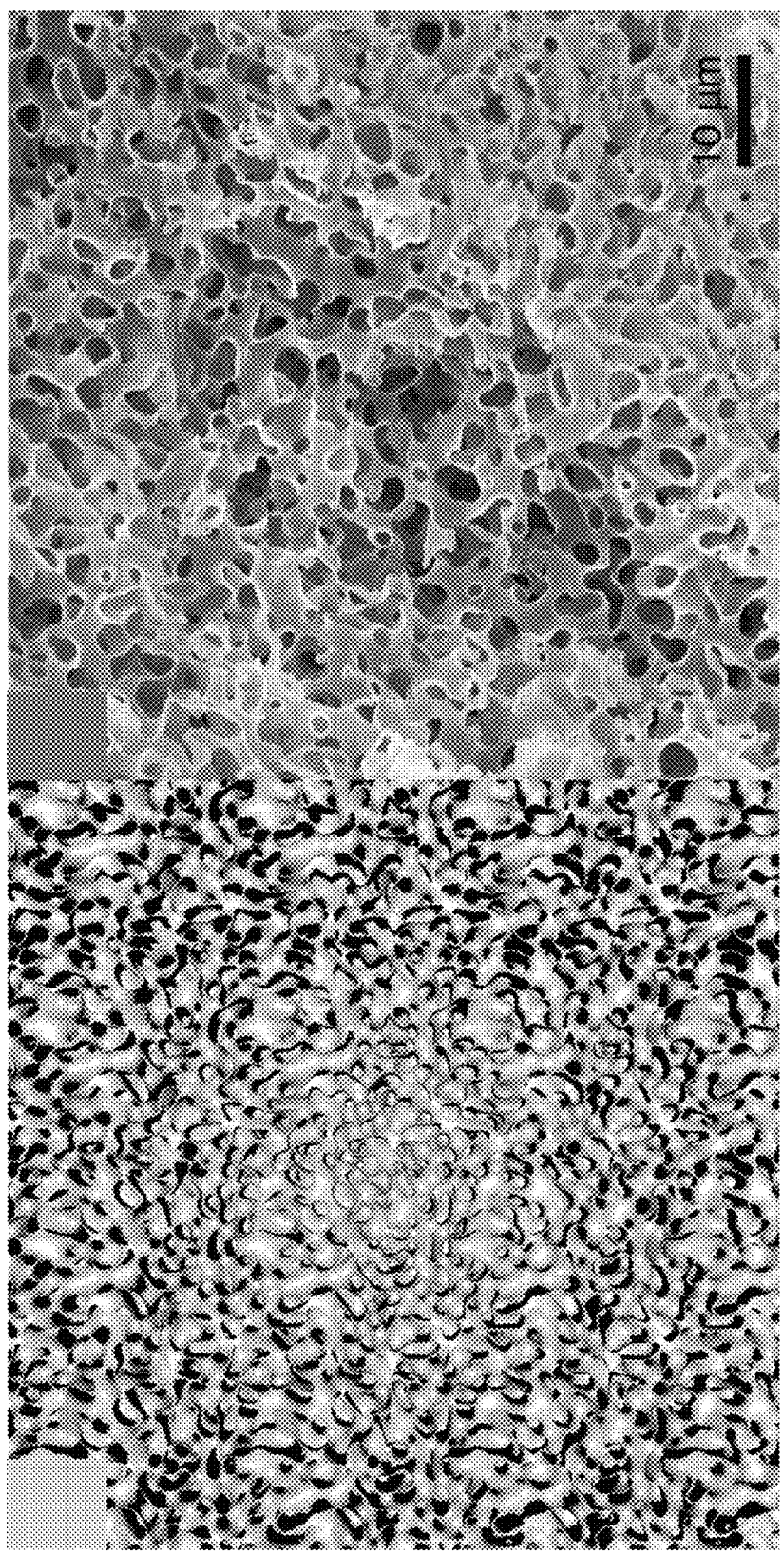
FIGS. 6A-6B. Isotropic morphology in self-assembled samples.
Figure 8A:
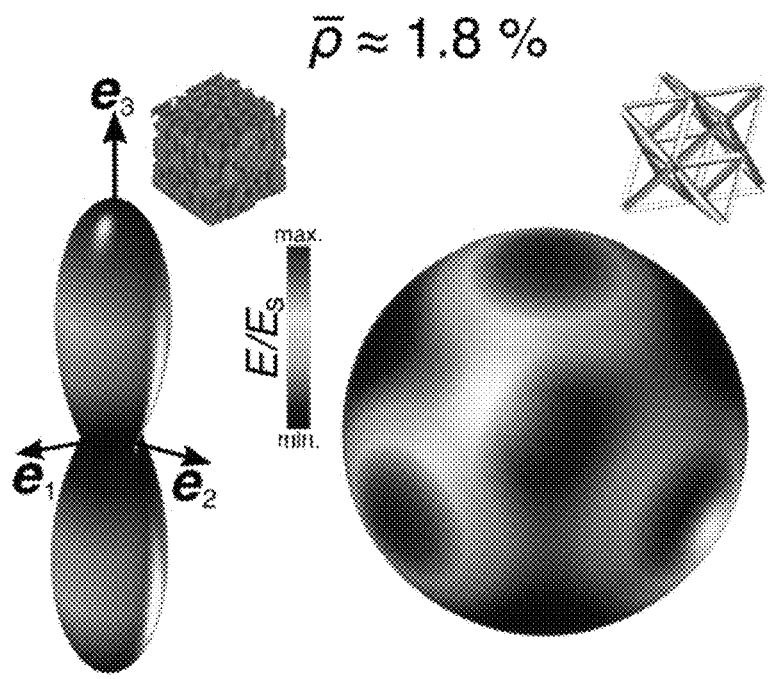
FIGS. 8A-8D. Choice of comparison relative density.
Figure 8B:
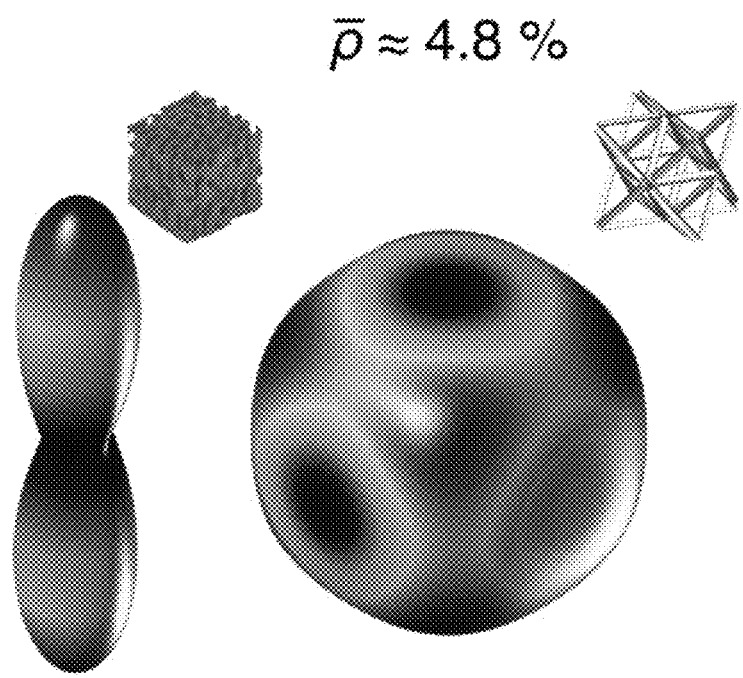
Figure 8D:
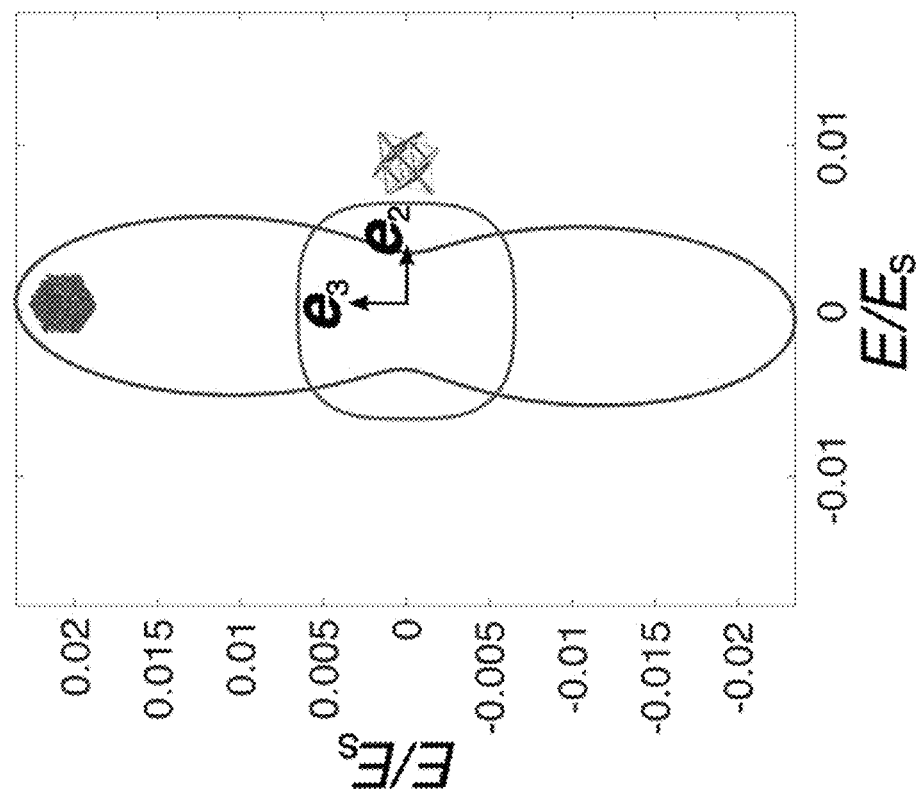
Figure 8C:
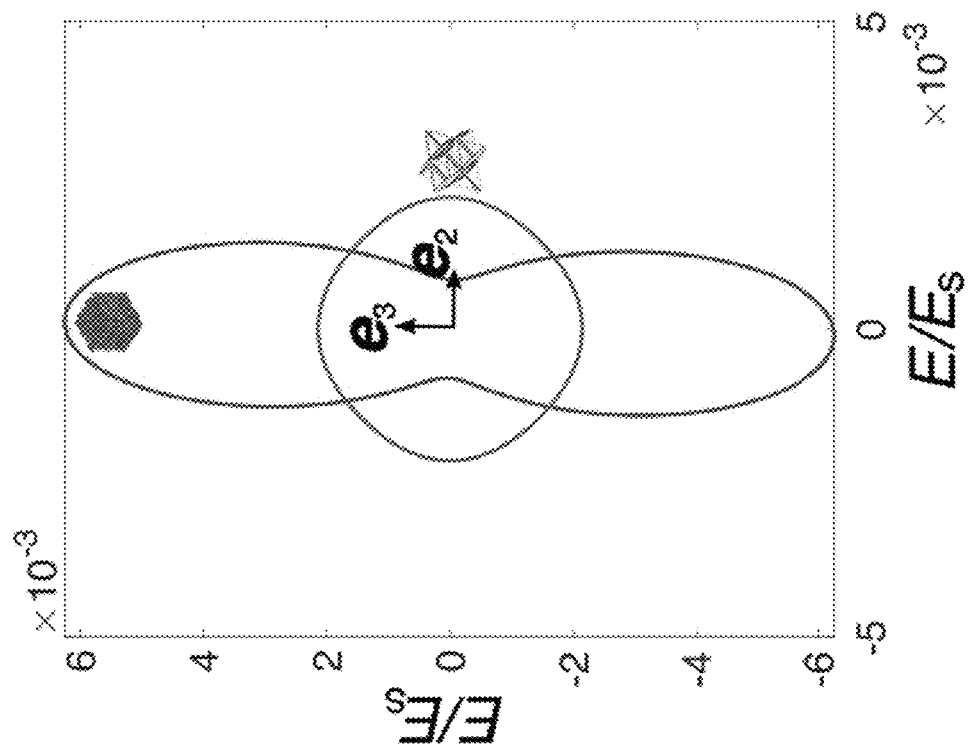

The resulting average pore size and the interface curvatures can be further controlled by the (simulated) duration of the phase separation process. Conformally coating the computed solid phase with a thin layer of a stiff material (whose thickness is uniform and below 10% of the average feature size), and subsequently removing the solid phase, creates the sought thin-shell architectures corresponding to the collective union of all interface regions. For instance, FIGS. 6A-6B depict the resemblance of the computed isotropic shell architecture (i.e., no preferential directions $m_i$) to the self-assembled sample from FIG. 1B.

Fabrication of microscale prototypes. We fabricated representative examples of the computed architectures out of thin-shell alumina using a three-step process: (i) two-photon lithography direct laser writing (Nanoscribe GmbH) to create three-dimensional (3D) scaffolds with prescribed shapes out of IP-Dip photoresist, (ii) atomic layer deposition (ALD) of 11, 44, or 168 nm-thick conformal coatings of $Al_2O_3$ onto the scaffolds, and (iii) removing polymer templates by selectively etching small perforations in the coating using a focused ion beam (FIB) and ashing the samples in $O_2$ plasma. Details of this fabrication process are provided in the Materials and Methods section and in FIGS. 7A-7G. The resulting nano-labyrinthine-sample form factors were cubic, with overall dimensions of 125×125×125 m³, and porous feature sizes on the order of ~10 m akin to the pores of nano-labyrinthine samples from FIG. 1B. The thus—produced samples had a relative density $\bar{\rho}$ of approximately 0.152.4, which corresponds to 4 to 62 mg/cm³, depending on shell thickness. Five representative examples that showcase the wide range of self-assembly-like architectures are shown in FIGS. 2A-2F. The scanning electron microscopy (SEM) images include columnar (FIG. 2A), lamellar (FIG. 2C), isotropic (FIG. 2D), cubic (FIG. 2E), and trigonal (FIG. 2F) architectures, whose direction-dependent mechanical properties vary strongly across architectures.

Tunable elastic anisotropy. The mechanical anisotropy of such shell-based architectures is highlighted by the elastic surfaces (FIGS. 2A-2F), which convey the orientation-dependent sample stiffness, i.e., Young's modulus E as a stiffness measure against uniaxial loading, calculated using linear elastic shell finite element models with the constituent properties of ALD $Al_2O_3$ [44] (see Materials and Methods). We first simulated uniaxial compression of each architecture along the [100], [010], and [001] directions, resembling actual experimental boundary conditions, to allow comparison to experimental anisotropy values in those three directions. Additionally, we implemented a homogenization scheme with periodic boundary conditions to calculate the modulus in all directions, first obtaining the full elastic modulus tensor C and then extracting the compliance tensor $\mathbb{S}=\mathbb{C}^{-1}$, which provided E along arbitrary directions. The resulting elastic surface plots are normalized by the Young's modulus of ALD alumina, $E_s$, and colors represent the magnitude of the normalized modulus (FIG. 2B, insets). The deviation of elastic surfaces from spherical shape is quantitatively related to the elastic anisotropy and is typically maximized along directions perpendicular to the preferential m vectors.

Figure 2A:
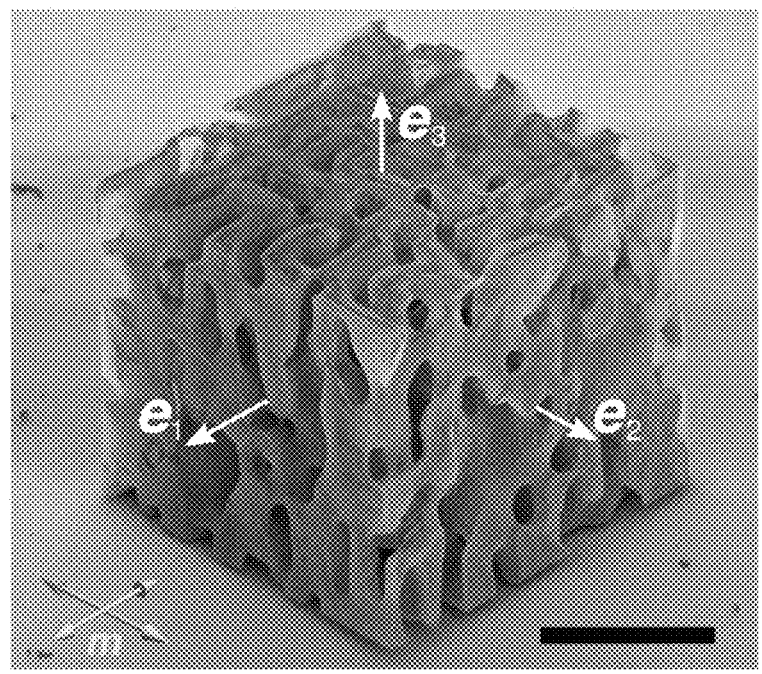
FIGS. 2A-2F. Anisotropic $Al_2O_3$ shell-based bi-continuous geometries.
Figure 2B:
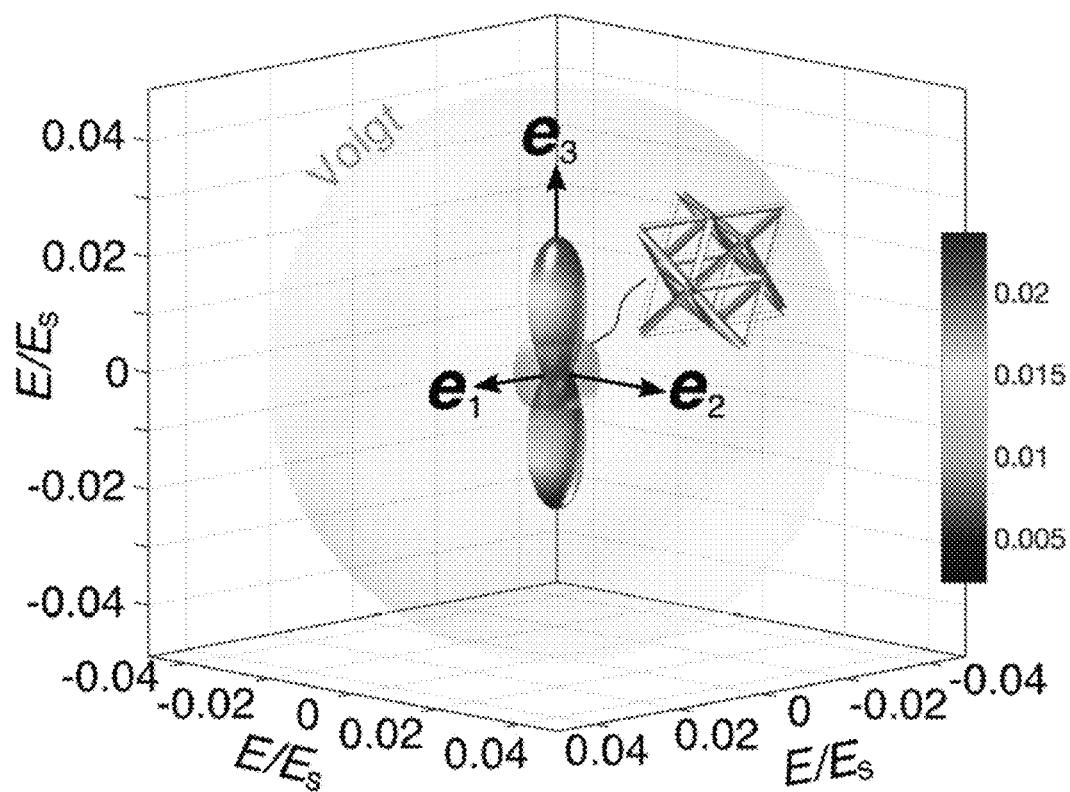
Figure 2C:
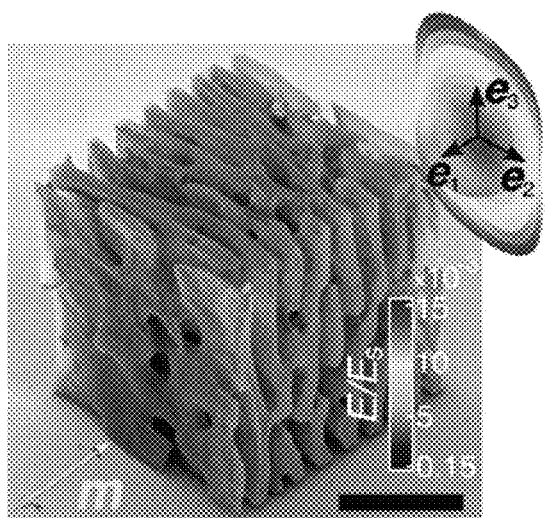
Figure 2D:
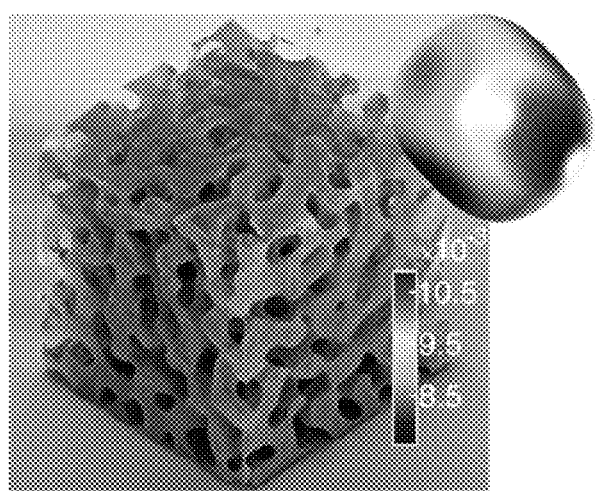
Figure 2E:
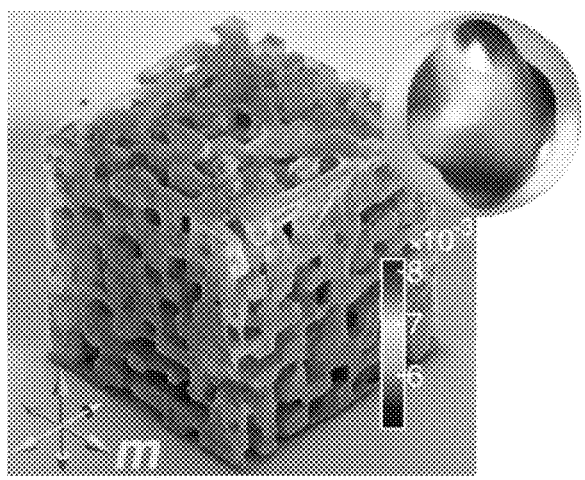
Figure 2F:
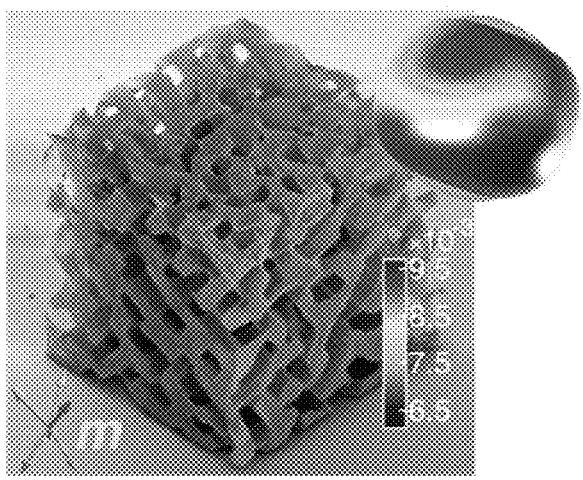
Figure 9A:
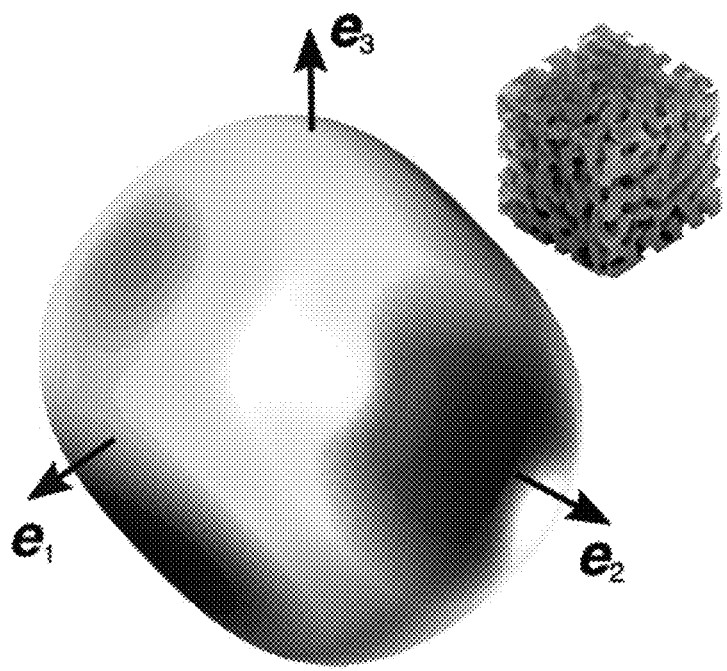
FIGS. 9A-9C. Isotropic architecture vs. octet elastic surface analysis.
Figure 9B:
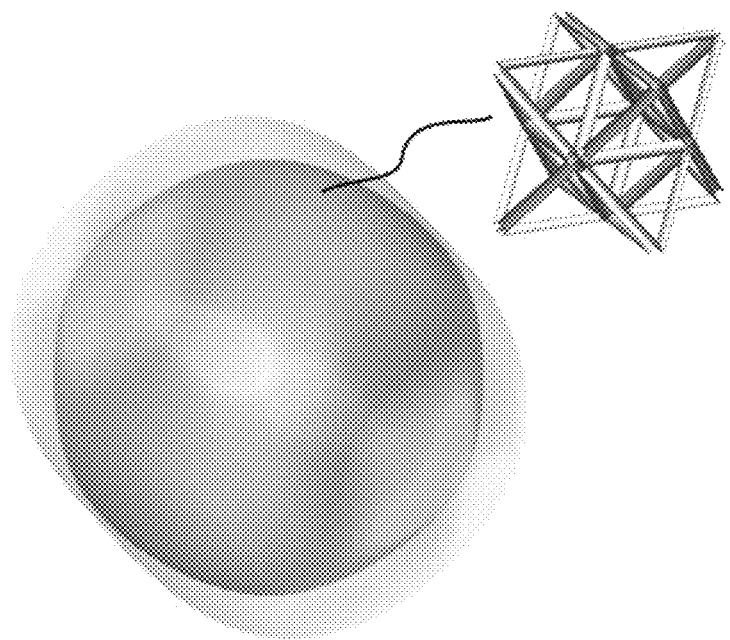
Figure 9C:
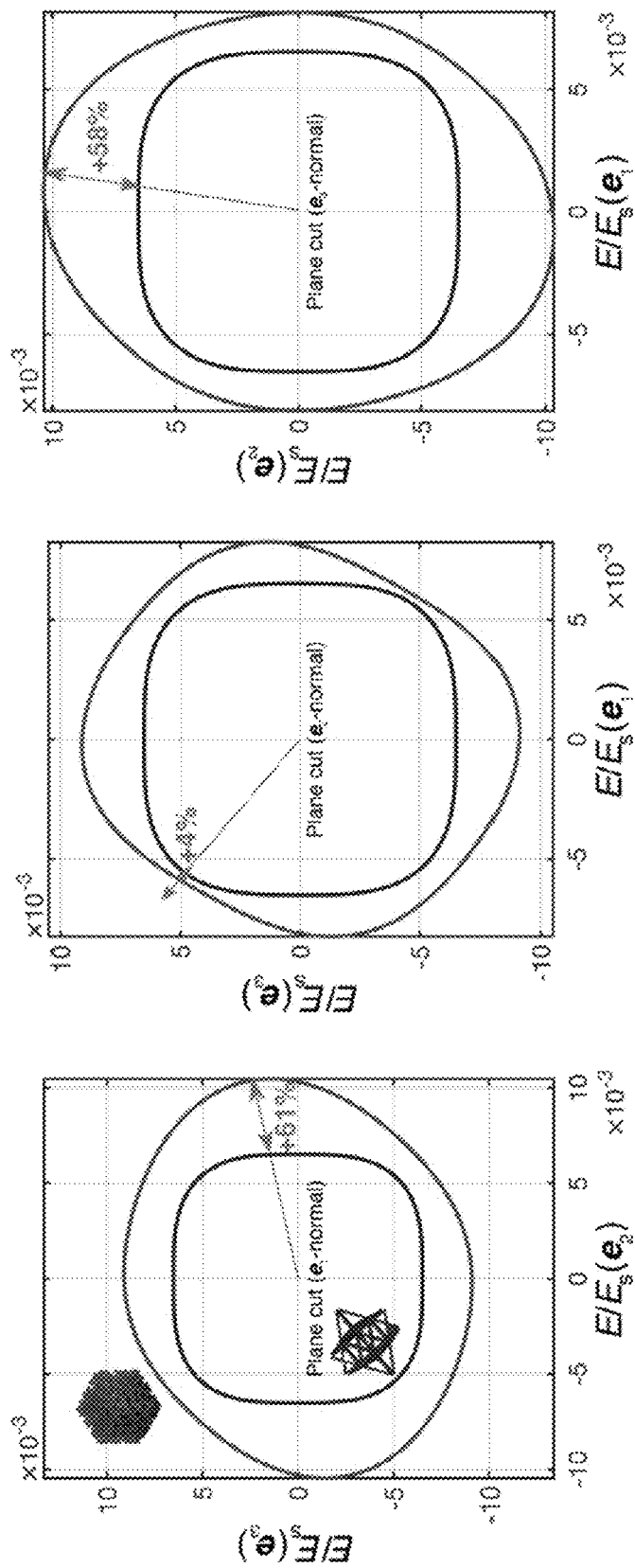

FIG. 2B shows two ellipsoidal lobes along the [001] direction that comprise the elastic surface of the columnar architecture shown in FIG. 2A, along with two further elastic surfaces for reference: that of an octet truss lattice (one of the most extensively explored stiffer periodic architectures [1, 10, 11, 45]) represented by a small gray surface centered at the origin, and that of the Voigt upper bound [46](defined by the rule of mixtures between $Al_2O_3$ and air) shown as a golden sphere. This plot reveals that for this representative case of $\bar{\rho}$=4.8±0.3%, the maximum elastic modulus of the columnar architecture outperforms the equivalently lightweight octet truss by a factor of 3.6 and reaches 48% of the Voigt bound. This particular relative density was chosen for comparison since, here, the elastic surface of the hollow octet resembles that of the classic solid-beam octet, and those of the nano-labyrinthine architectures remained representative of the fabricated relative densities (see FIGS. 8A-8D). The contoured elastic surfaces also reveal a stiff omnidirectional response in the absence of preferential directions within the architecture, an example of which is shown in FIG. 2D, where the architecture's response is close to isotropic as would be the case, for example, in nanoporous materials [2547] and stochastic foams [28]. The elastic surface of the octet is fully contained within that of the isotropic shell architecture (FIG. 2D), which demonstrates that the non-periodic bi-continuous architectures in this work can be stiffer in all directions than an equally dense periodic truss architecture, with improvements of up to 61% along particular directions (see FIGS. 9A-9C). The columnar (FIG. 2A), lamellar (FIG. 2C), cubic (FIG. 2E) and trigonal (FIG. 2F) geometries reflect the wide range of mechanical anisotropy achievable by tuning the shell geometries.

In the case of the columnar architecture, the anisotropy induced by the selected preferential directions promotes material arrangement in stress-bearing columnar features along the [001] direction, which renders its relative modulus $E/E_s$ in this direction the highest for all studied geometries. The lamellar structure (FIG. 2C) displays the highest degree of anisotropy, with an $E_{[001]}/E_{[100]}$ ratio of 177, driven by sheet-like, low inter-connectivity material arrangements along the [010] and [001] directions. These computational results demonstrate that introducing preferential directions into the non-periodic shell architectures allows for prescribing substantial elastic anisotropy and provides a mechanism to design the elastic response along chosen directions in a single material, attaining performance superior to some periodic architectures. As expected, all computed elastic responses are below the theoretical upper bound (since enforcing shell bi-continuity requires some material arrangement in less-than-ideal configurations), yet the surface-energy-driven connectivity is achieved without any sharp junctions or edges—opposite of what is typical in most periodic architectures—and is essential in giving these nano-labyrinthine materials exceptional properties beyond stiffness.

Figure 10:
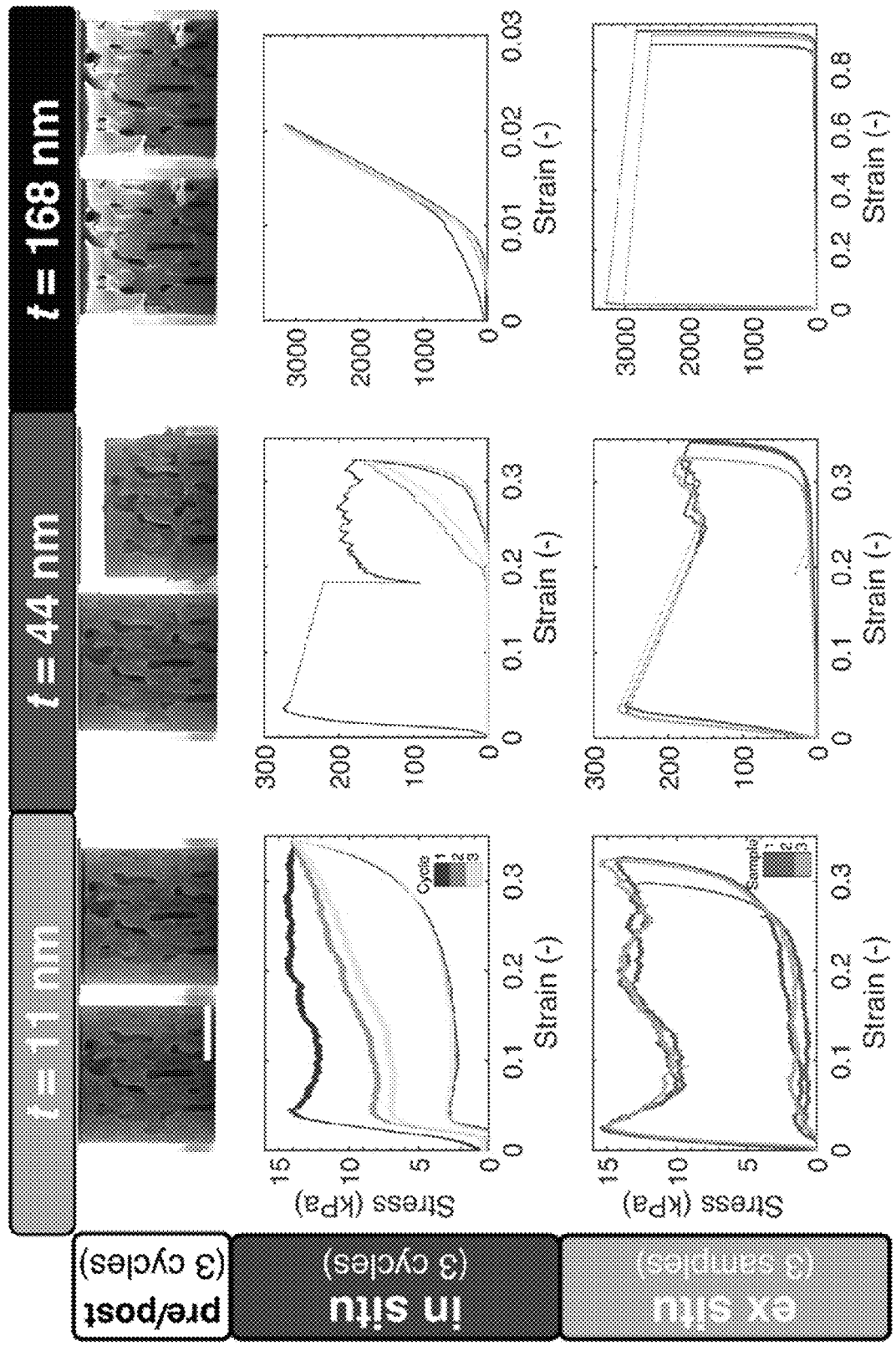
FIG. 10. Compressions of columnar samples at different thicknesses. Top row: micrographs before and after 3-cycle in-situ uniaxial compressions to $\varepsilon=30\%$ (the maximum load in the nanoindenter was reached prior to failure of the 168 nm sample). Middle row: stress-strain response for the in-situ cycles. Bottom row: stress-strain response for ex-situ compression on 3 distinct samples for each thickness. Scale bar, 50 µm.
Figure 11A:
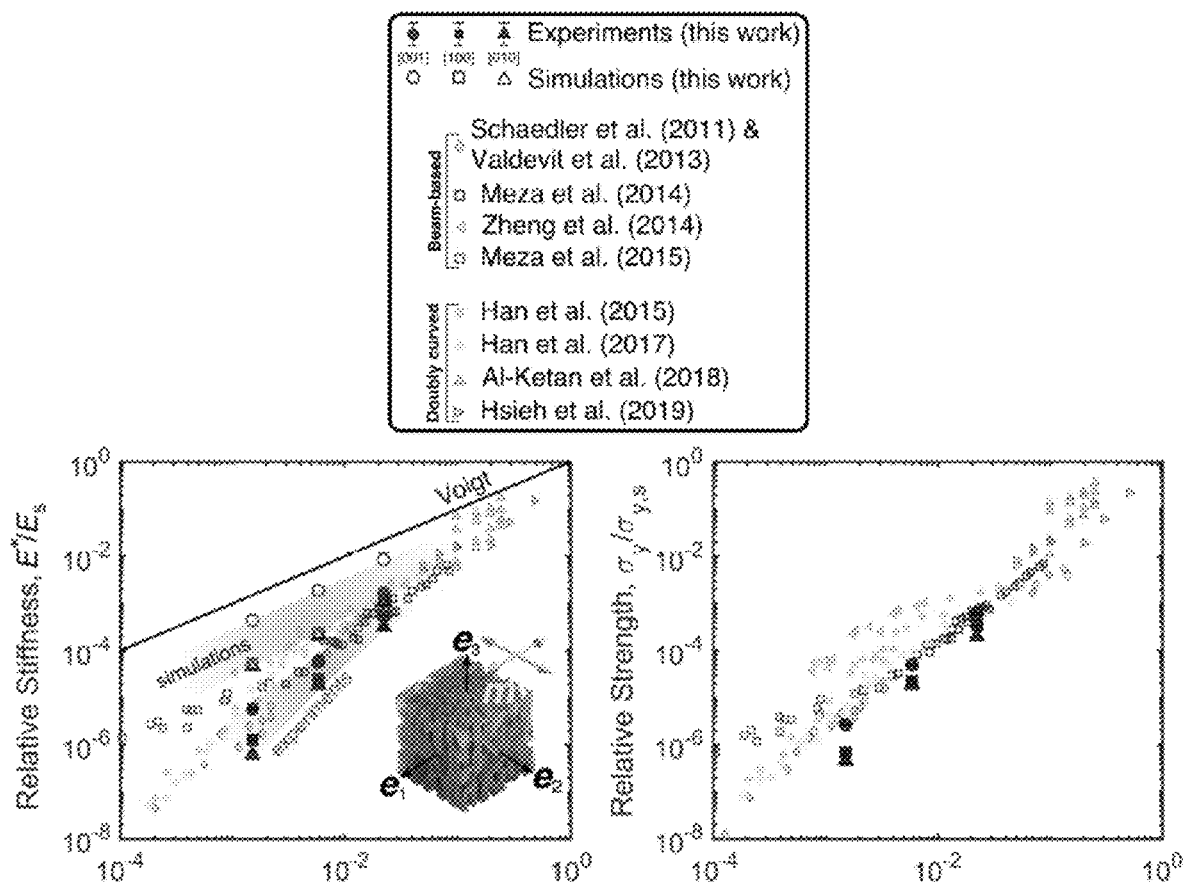
FIGS. 11A-11C. Comparison to other architected materials. Relative stiffness $E^*/E_s$ (experiments in black and simulations in red) and relative strength $\sigma_y/\sigma_{y,s}$ (experiments in red), where $E_s$ and $\sigma_{y,s}$, are the Young's modulus and strength of the constituent material, respectively, for (FIG. 11A) the columnar architecture, (FIG. 11B) the isotropic architecture, and (FIG. 11C) the lamellar architecture. The grey and red regions present the range of achievable stiffnesses obtained from the simulations and experiments, respectively. Reported values for other beam-based and doubly curved architected materials are presented for reference. Waviness in the fabricated thin shells at low relative densities (see Extended Data FIGS. 12A-12C) causes a significant knock-down factor in stiffness compared to simulations which becomes less significant at higher relative densities. The simulations consisted of uniaxial compression boundary conditions with free lateral boundaries, mimicking the experimental conditions.
Figure 11B:
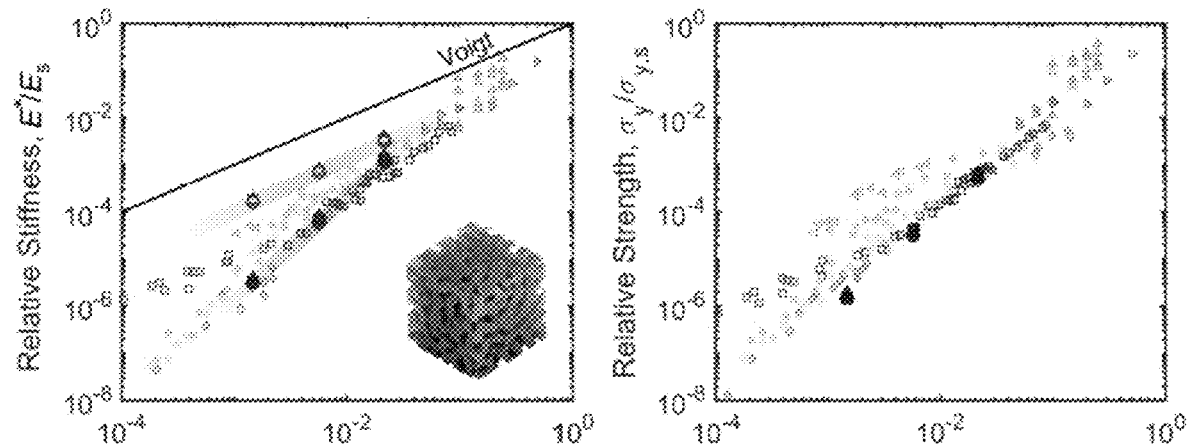
Figure 11C:
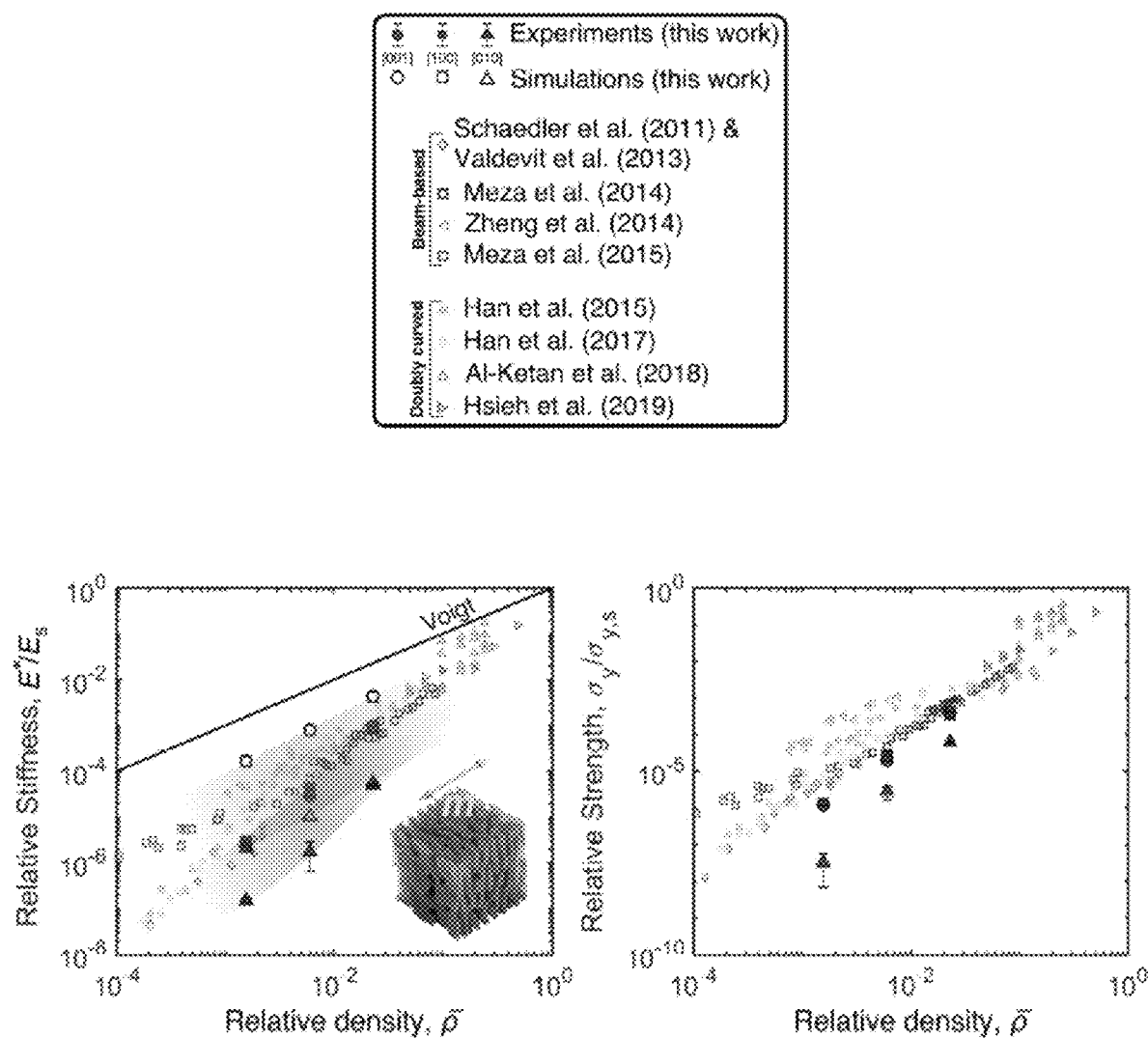
Figure 12A:
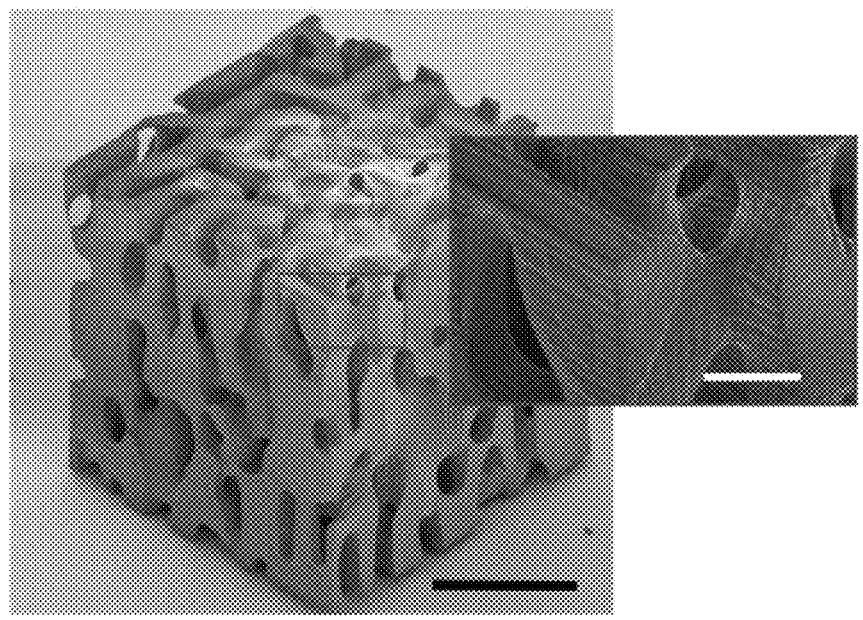
FIGS. 12A-12C. Effect of shell waviness.
Figure 12B:
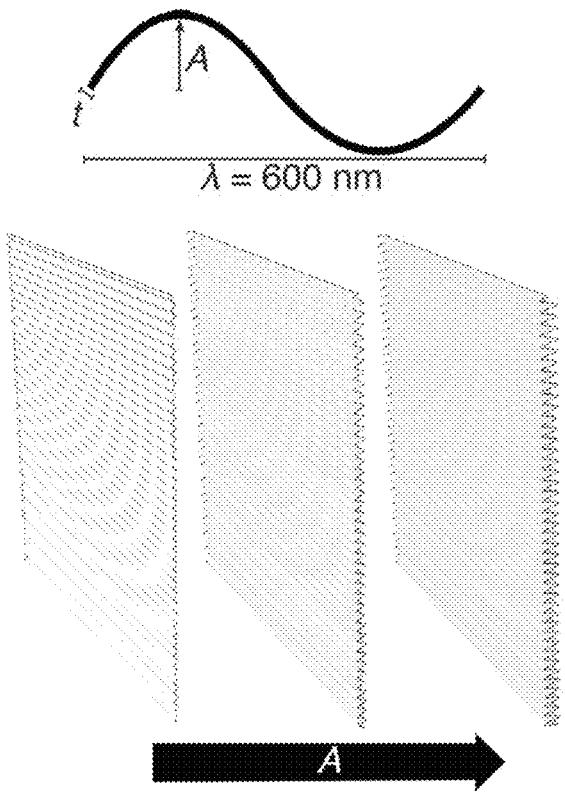
Figure 12C:
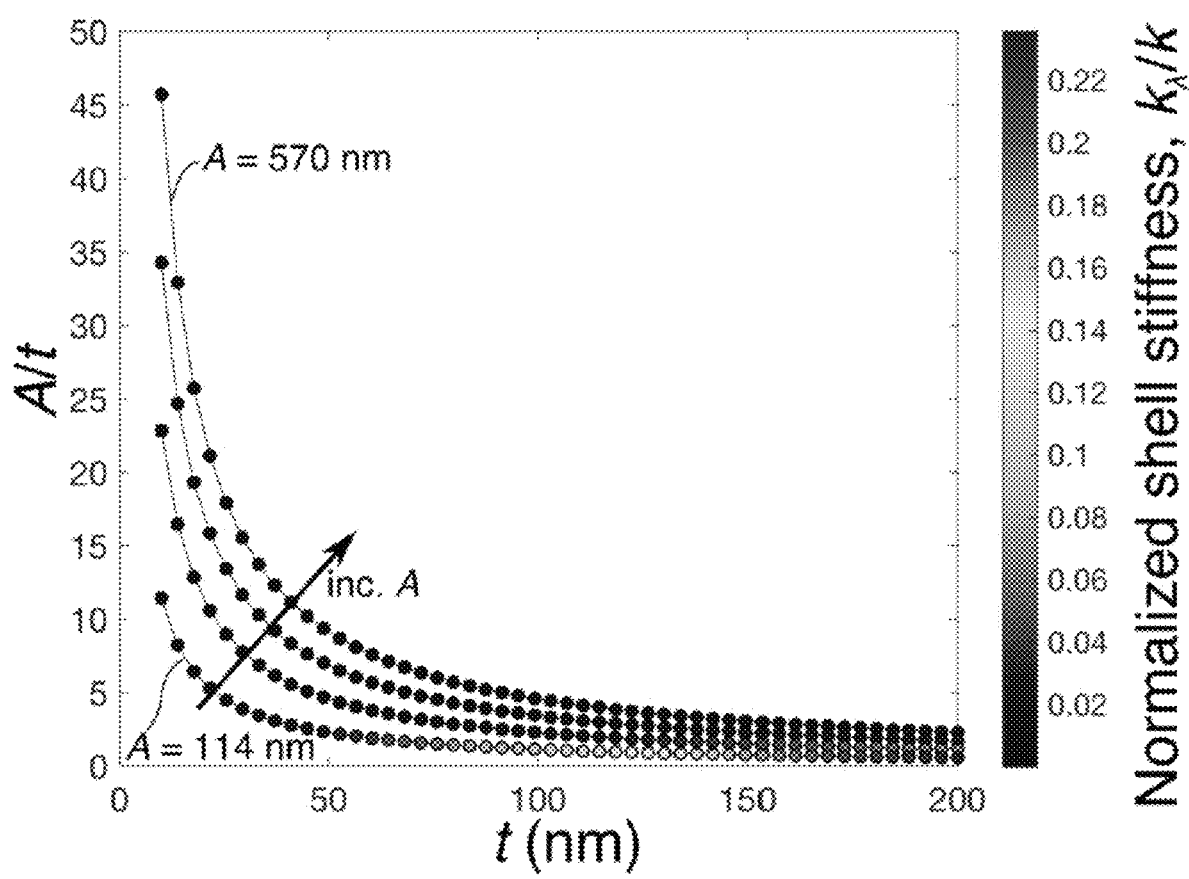
Figure 13A:
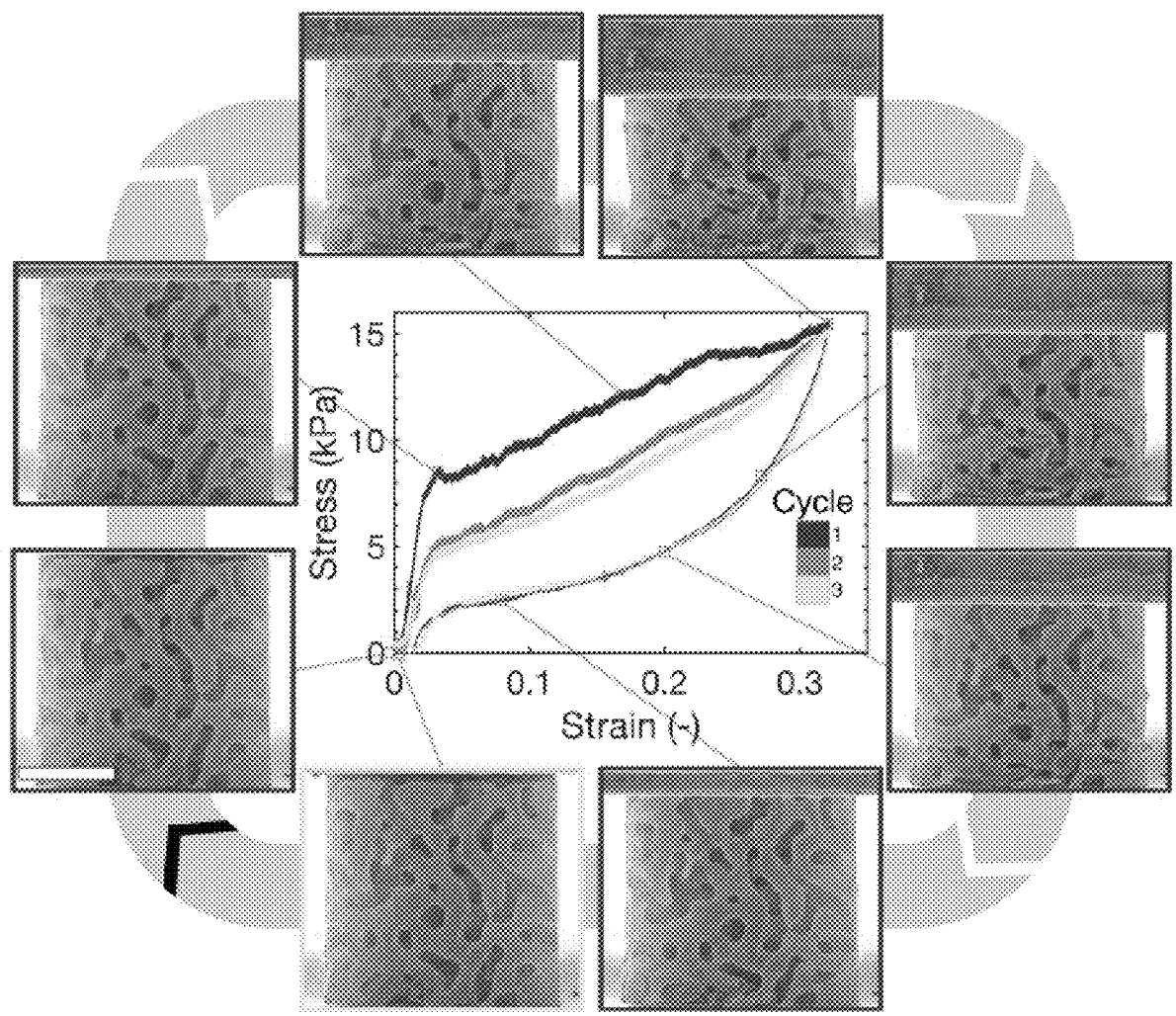
FIGS. 13A-13D. Cyclic resilience of other 11-nm nano-labyrinthine architectures.
Figure 13B:
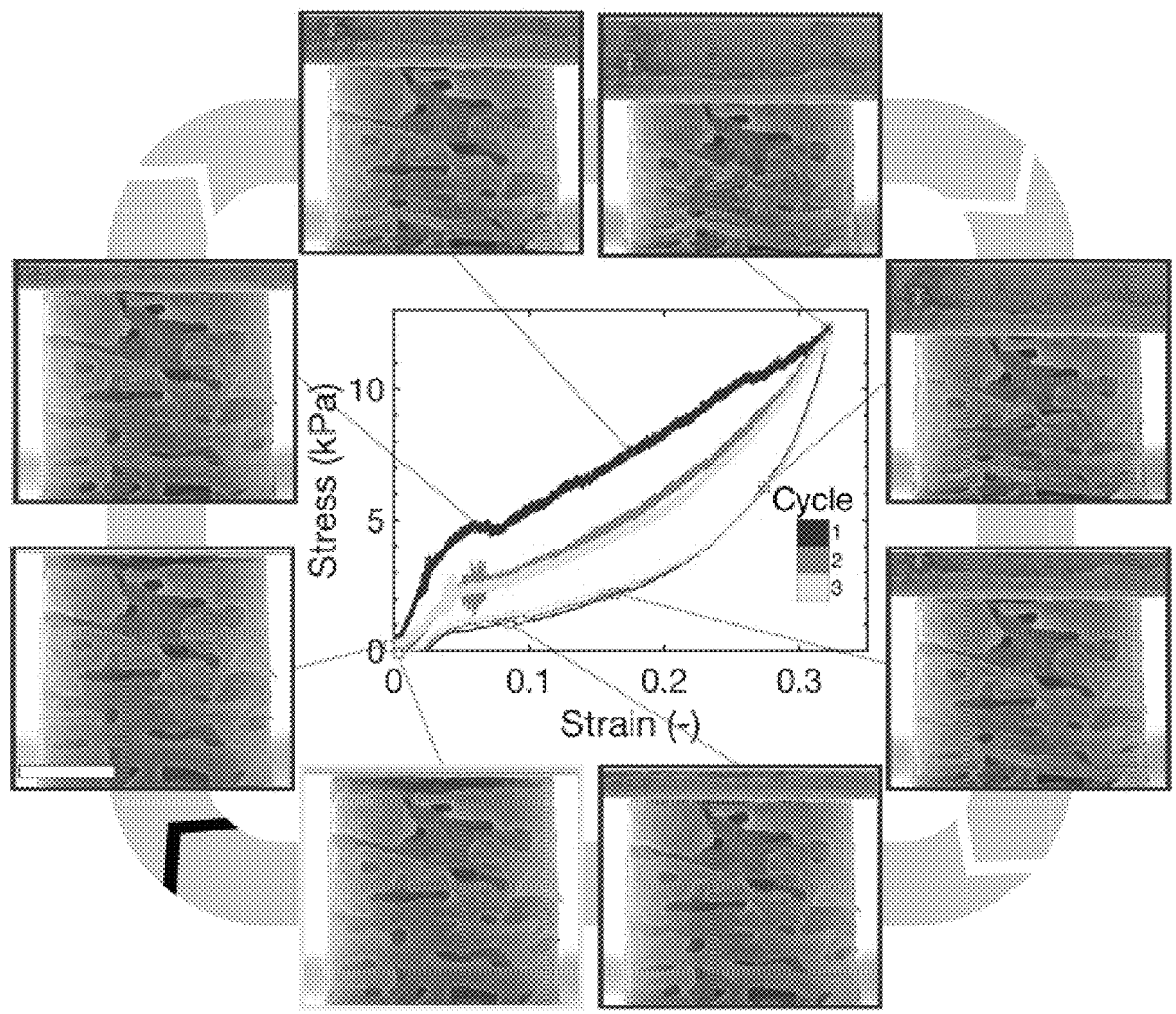
Figure 13C:
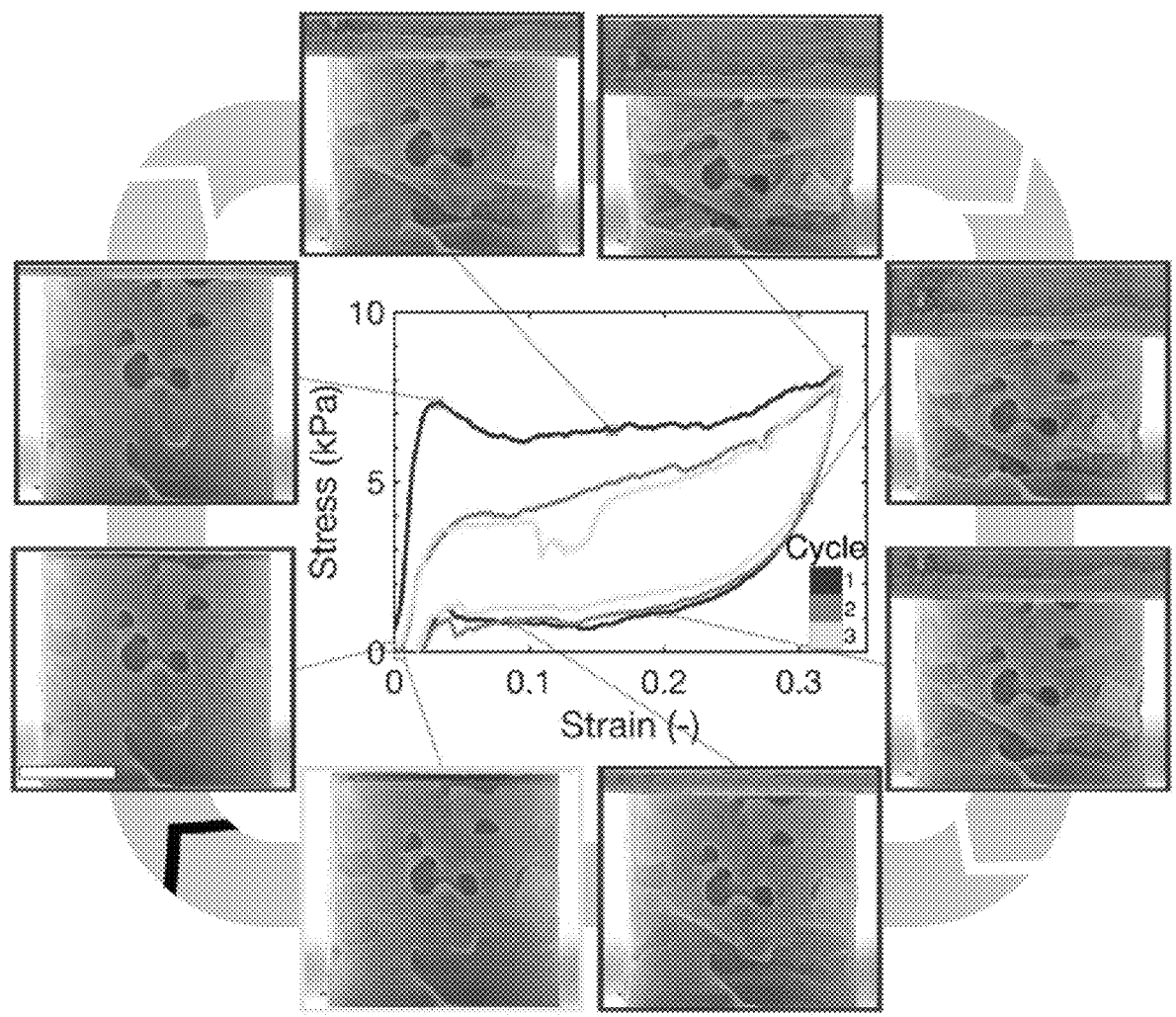
Figure 13D:
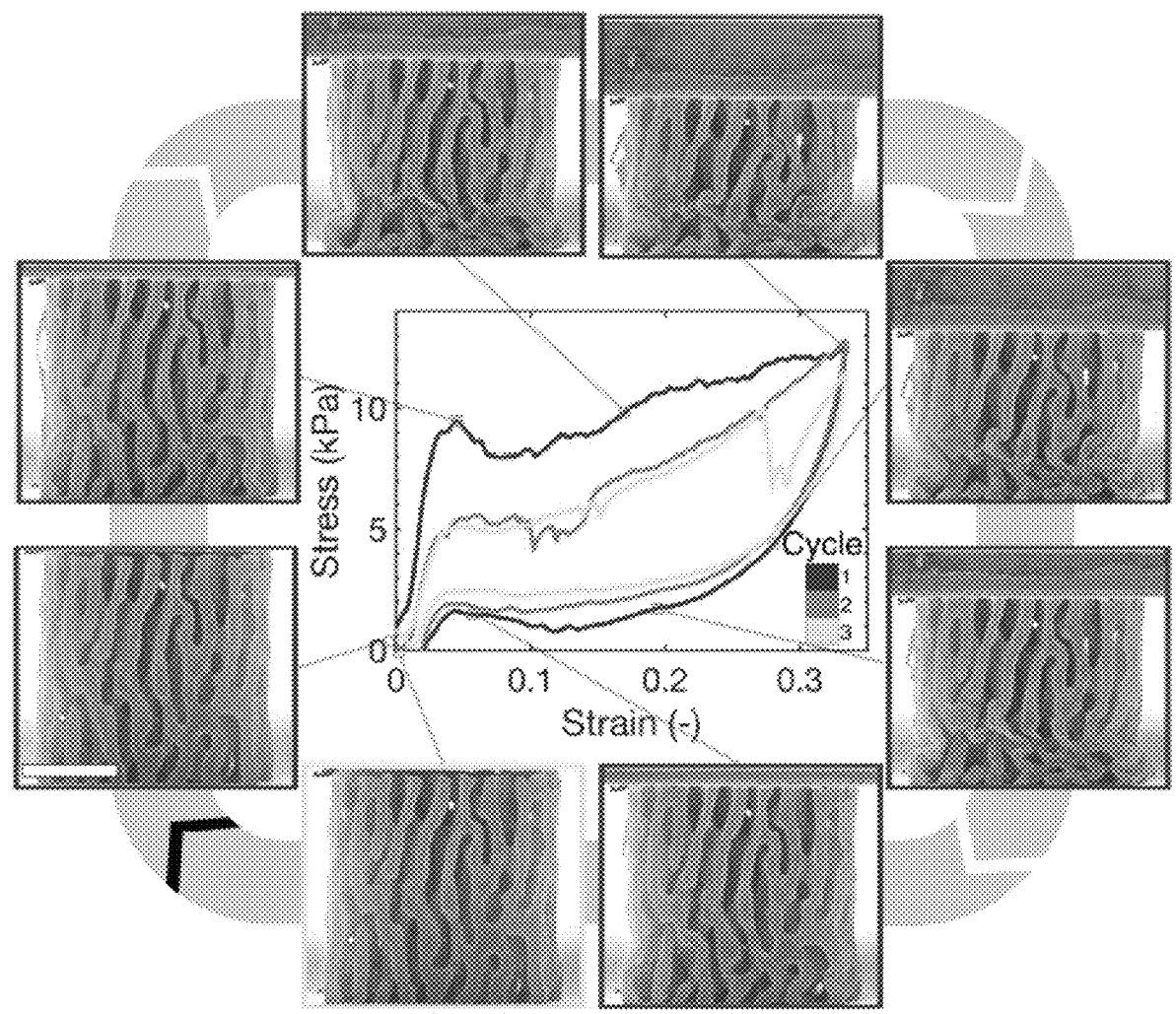
Figure 14A:
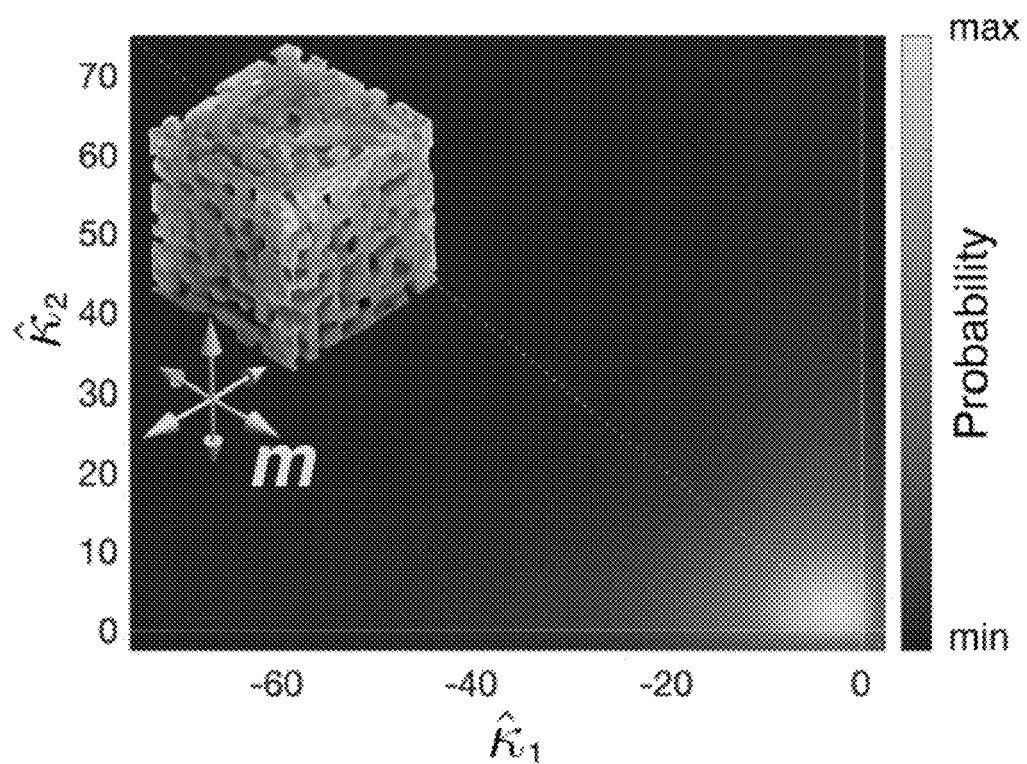
FIGS. 14A-14D. Curvature Maps. Dimensionless curvature distribution, i.e., $\tilde{\kappa}=\kappa L$ where L is the characteristic sample dimension, for all architectures.
Figure 14B:
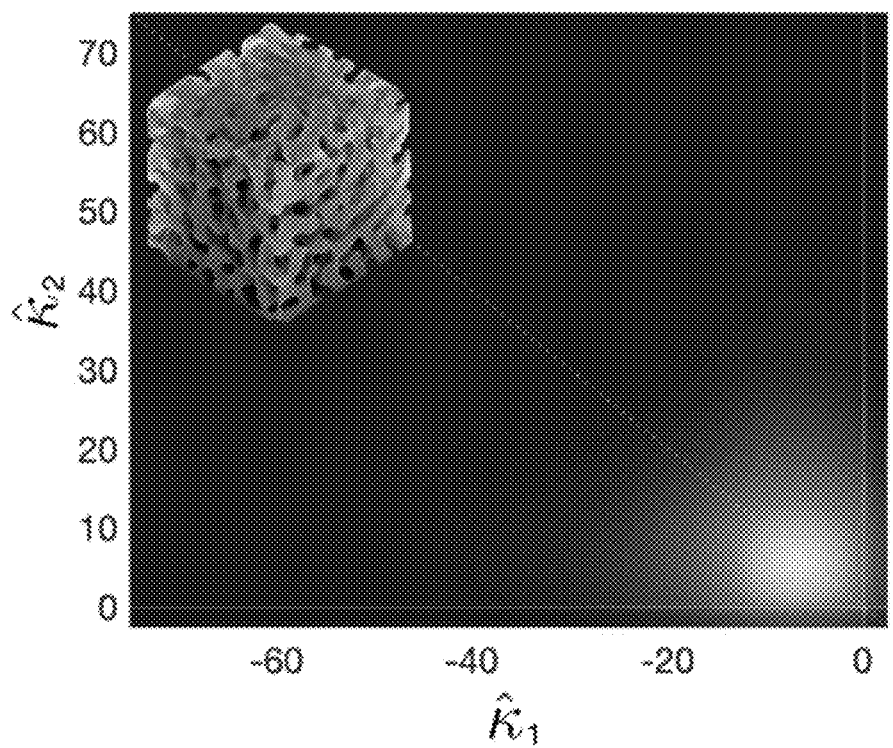
Figure 14C:
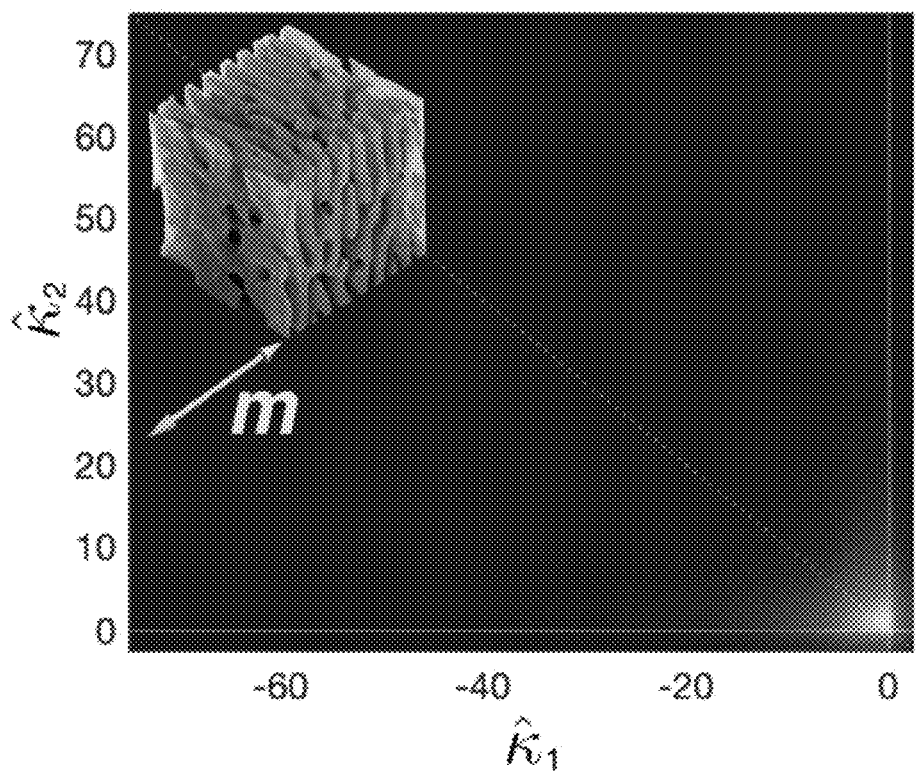
Figure 14D:
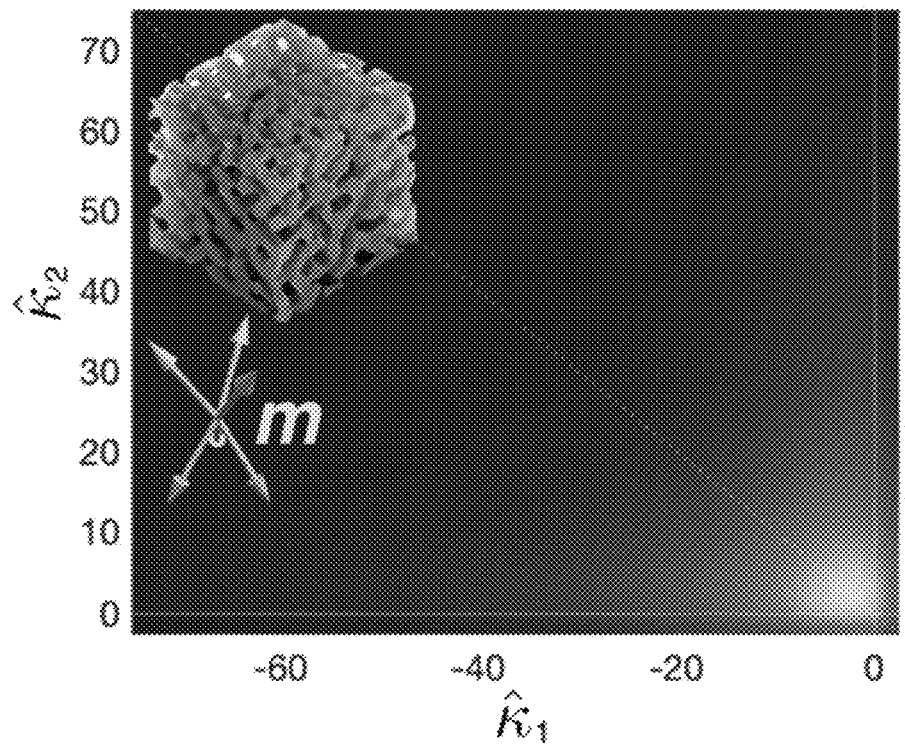

To test the computational predictions, we conducted uniaxial compression experiments on each architected sample along their (100) directions in a nanoindenter (G200 XP, KLA) with a flat punch tip to strains of ε=35% at a quasistatic rate of $\dot{\varepsilon}=10^{-3}$ s$^{-1}$. We compressed a minimum of three samples for each configuration (defined by geometry, orientation, and shell thickness) and converted the recorded load vs. displacement data into stresses and strains by normalizing by the sample footprint area and height, respectively. We obtained the effective elastic modulus $E^*_{[\cdot]}$ and material strength $\sigma^*_{y,[\cdot]}$ from the stress-strain data as, respectively, the slope of the linear loading regime and the load at the onset of nonlinearity (see Materials and Methods). Representative stress vs. strain data sets are shown in FIG. 10 which reveal the characteristic linear and nonlinear responses of samples at the three different shell thicknesses. FIG. 11C shows that the representative 168 shell thickness samples ($\bar{\rho}$=2.3±0.1%) exhibited the predicted two-order-of-magnitude anisotropy for the lamellar architecture, with an experimental $E^*_{[100]}/E_{[001]}$ ratio of 0.057 compared to 0.014 predicted by simulations. The close-to-isotropic and columnar samples approximated the numerical models' overall anisotropy with experimental $E^*_{[100]}/E^*_{[100]}$ ratios of 0.87 and 3.0 compared to the numerical ones of 0.92 and 7.2, respectively. The inherent surface waviness of the samples caused by the layer-by-layer 3D printing process used to perform this exploration slightly undermines the mechanical properties (FIGS. 12A-12C) but preserves the desired qualitative anisotropic response. Thinner-walled samples (i.e., t=11 and 44 nm) exhibited the same anisotropic behavior and had higher knockdown factors caused by fabrication defects (see FIGS. 11A-11C).

Enabling Extreme Mechanical Resilience

To probe the mechanical resilience of the self-assembly geometries, we performed additional in situ cyclic compressions on selected microscale prototype architectures in a custom nano-mechanical instrument inside of an SEM chamber [2](Quanta 200 FEG, Thermo Fisher). Our experiments reveal that the nano-labyrinthine ceramic architectures possess high and tunable directional stiffness while avoiding the stress concentrations typically found at junctions in most periodic architectures [7, 15, 48, 49], which enables the extraordinary mechanical resilience demonstrated in FIGS. 3A-3H. The 11 nm-thick samples exhibited full recovery in these in situ experiments, with no visible microcracks, after ten compressive cycles to strains of up to 35%. This is in contrast to all other thin-walled ceramic and polymer beam-based architected materials at this scale, which fail by forming microcracks at nodes and whose strength and energy-absorption hysteresis deteriorate by an order of magnitude or more after only a single load cycle [15, 49, 50]. While both hollow-beam and nano-labyrinthine architectures structurally recover due to elastic shell buckling, the nano-labyrinthine samples in this work are the only ones that do not visibly fracture and maintain substantial mechanical performance with cycling.

For instance, the columnar architecture (FIGS. 3A-3H) compressed along the [001] direction exhibited a linear loading regime followed by the onset of elastic buckling of the $Al_2O_3$ shells from a strain of 5% to 10%, beyond which they underwent nonlinear buckling and self-contact, ultimately recovering their original geometry after each cycle, as characterized by self-similar hysteretic behavior. We focus our analysis on the response of the columnar geometry since it is representative of the other architectures' hysteretic response, while exhibiting the highest strength and stiffness (see FIGS. 13A-13D). This hysteresis—observed in all geometries of 11 nm thickness—implies significant energy dissipation, which is attributed to friction and the nonlinear buckling processes without any permanent structural deformation or evident microcrack formation. Increasing the shell thickness to 44 nm changed the failure mechanism to mostly fracture-dominated with structural recovery enabled by marginal elastic buckling, while the 168 nm samples underwent mostly catastrophic failure during the first cycle with their structural integrity compromised (see FIG. 10). The response of the thicker samples is consistent with the competing effects of elastic buckling and material failure found previously for hollow-shell truss architectures [2], while the response of the thinner samples evidences a significant improvement in cyclic degradation when compared to their thin-walled truss counterparts that form microcracks even in the shell buckling regime. The improved cyclic performance of nano-labyrinthine architectures over truss ones is also in line with observations that fillets, a feature to decrease curvature at truss nodes, can be expected to provide improved effective strength even in lattice materials [26].

Figure 4A:
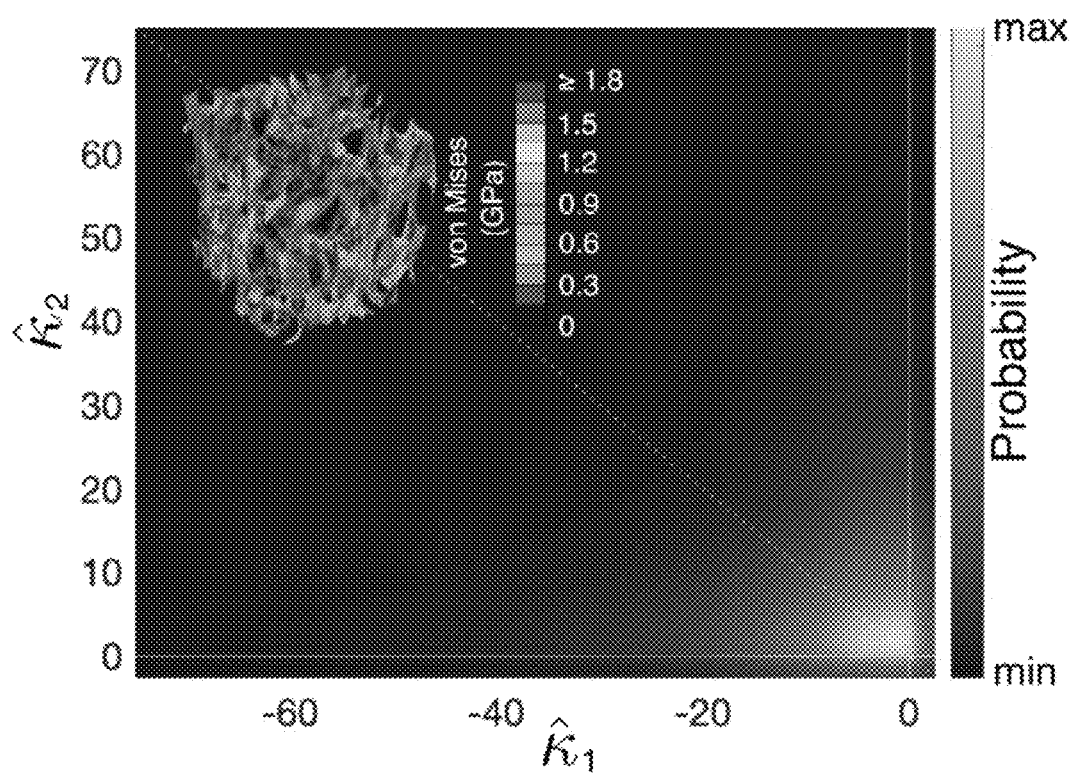
FIGS. 4A-4C. Curvature distribution and cyclic mechanical performance.
Figure 4B:
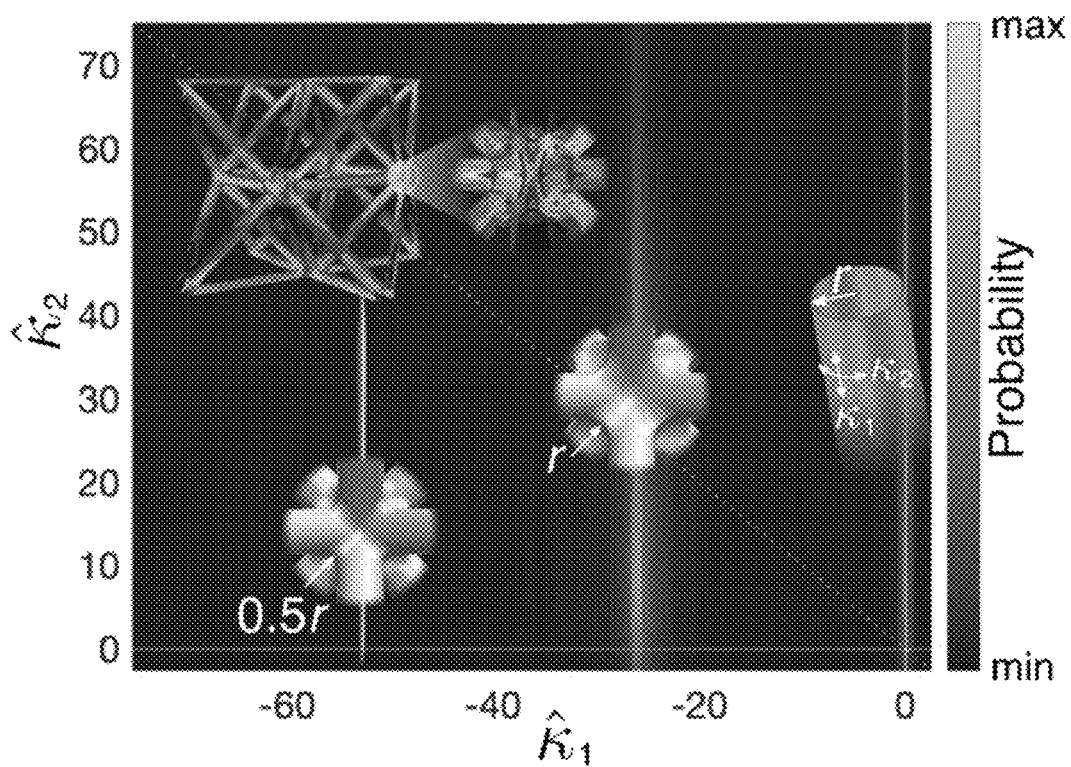

We attribute the observed mechanical resilience to the unique combination of thin, almost defect-free alumina shells (exploited previously only in trusses [2]), on the one hand, and the low local curvatures in the doubly-curved shell architectures, on the other hand. The low principal curvatures minimize local stress concentrations, which prevents localized material failure. We quantify the architectural morphology by extracting the point-wise mean and Gaussian curvatures and calculating the principal curvature probability distribution (i.e., the distribution of $\kappa_1$ and $\kappa_2$, which are normalized to $\hat{\kappa}_i = \kappa_i L$ where L is the sample dimension)[40]. For the columnar architecture, FIG. 4A shows that most of its features have principal curvatures $|\hat{\kappa}_i|<20$ (other architectures are presented in FIGS. 14A-14D). Performing the same analysis for an octet truss shows significantly larger curvatures and a bimodal distribution, with a peak curvature dominated by the struts' non-zero $\hat{\kappa}_2$ curvature and another peak at $|\hat{\kappa}_i|>>20$ corresponding to the nodal joints. Even after reducing such singularities by introducing finite-sized joint radii (FIG. 4B) by means of fillets with radii 0.5r and r (where r is the strut radius), the higher curvatures and the bimodal distributions remain.

Figure 15A:
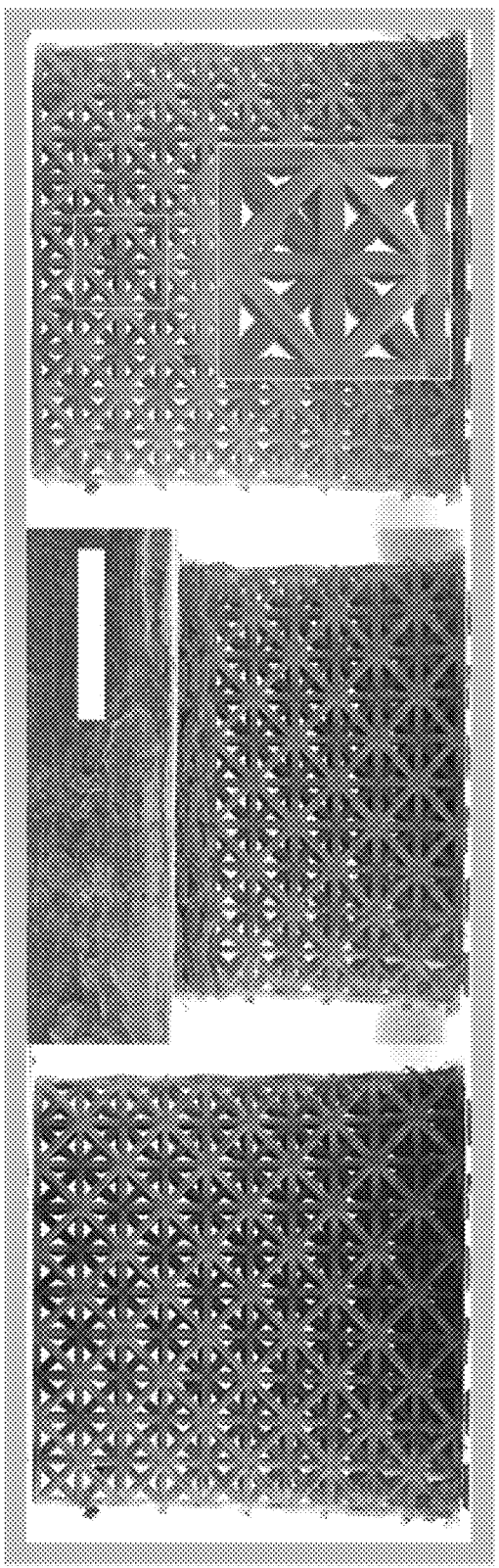
FIGS. 15A-15C. Cyclic response of octet and columnar $Al_2O_3$ architectures. Micrographs of in-situ uniaxial compressions depicting sample morphologies before, at maximum compression ($\varepsilon=30\%$), and after 10 cycles for (FIG. 15A) an octet 5×5×5 tessellation and (FIG. 15B) a columnar architecture, both of equal relative density and 11-nm wall thickness.
Figure 15B:
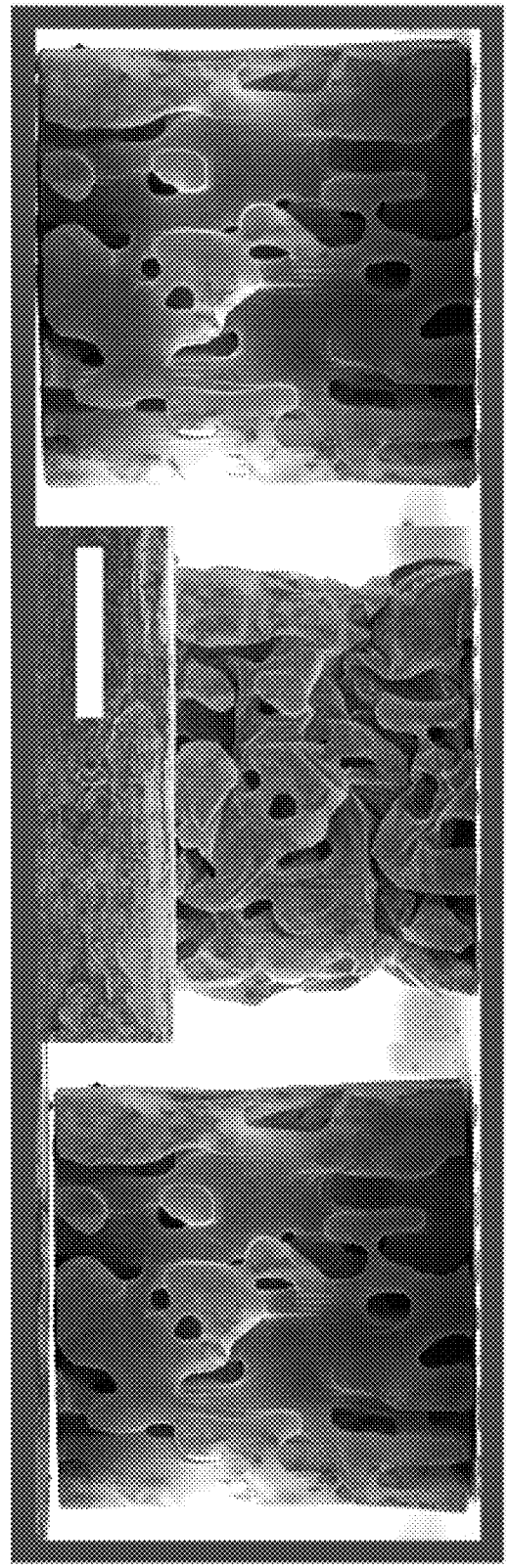
Figure 15C:
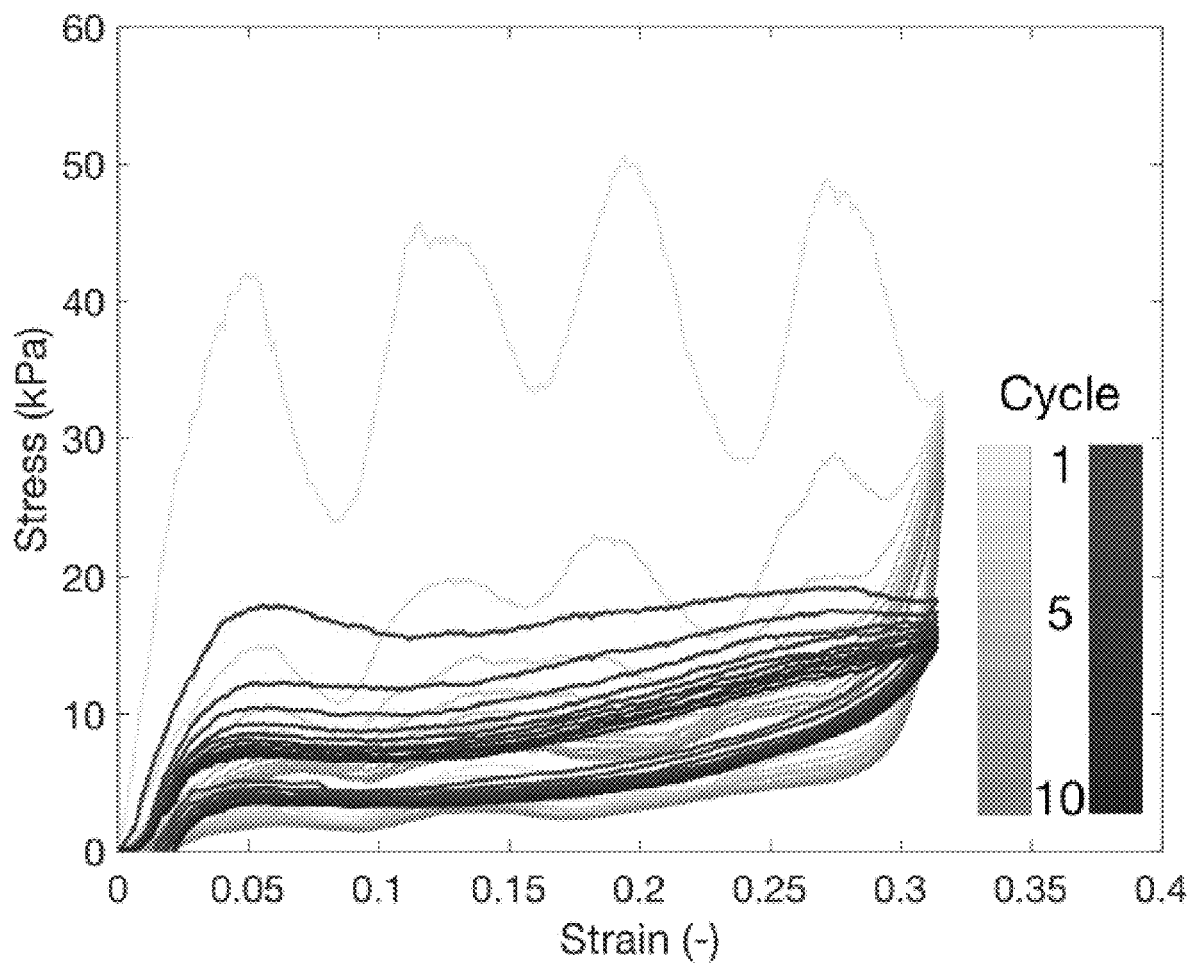

As a representative case to highlight the resilience of our nano-labyrinthine architectures, we cyclically loaded columnar samples along the [001] direction (this is the stiffest of all tested samples and directions, so that we generally do not expect soft, compliant deformation modes to engage). To compare the cyclic performance to that of hollow-tube octet lattices, we fabricated 5×5×5 octet tessellations with the same alumina wall thickness and relative density as the 11 nm nano-labyrinthine samples and performed the same in-situ cyclic compressions along the [001] direction (see FIGS. 15A-15C). We tracked the degradation of the measured modulus $E^*_i$, strength $\sigma^*_{y,i}$, and the absorbed energy density $\psi_i = \frac{1}{2} \oint \sigma d\varepsilon$, graphically represented as the enclosed area in the stress-strain response for a given i-th cycle.

Figure 4C:
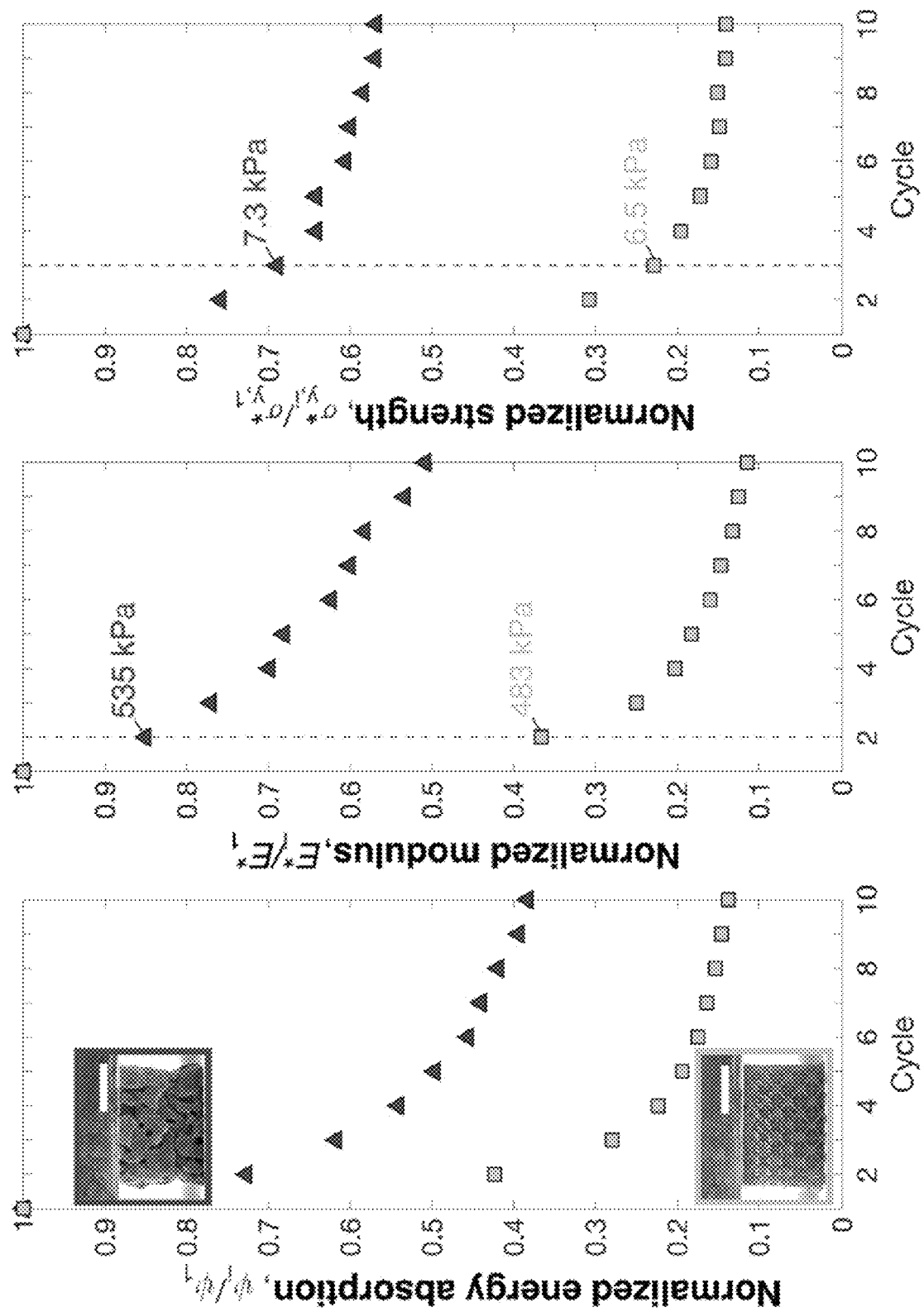

FIG. 4C summarizes how these three performance metrics, normalized by their values in the first cycle, evolved over ten load cycles. These plots convey that between the first and second cycles, the energy absorption decreased by 27% for the columnar architecture and by 58% for the octet, asymptotically approaching the tenth-cycle limit of 38% of the original energy storage capacity for the columnar and 14% for the octet architectures. Young's modulus showed a second-cycle drop of 15% for the columnar architecture compared to 63% for the octet. This significant drop in the octet's mechanical response is caused by the localized material failure and a loss of load-bearing capacity at multiple nodes, whose number increases with cycling. The less-than-half relative drop in energy absorption and a factor-of-3 lower reduction in Young's modulus between first and second cycles of the columnar architectures, when compared with octets, likely stem from internal microcracks and variations in the self-contact process that weaken but not necessarily disable load-bearing shells (no cracks were observed on the structure's outer surfaces). Strength performance also appears to be superior for the columnar architecture, showing a first-to-second-cycle degradation of 24% compared to 70% for the octet, with the absolute strengths being greater than those of octet beyond the second cycle. Despite the knock-down factor in stiffness and strength caused by shell waviness (FIGS. 12A-12C), the columnar architecture shows considerably superior mechanical performance compared to the periodic truss architecture through (at least) ten cycles. Since the deformation mechanisms exhibited by the columnar and octet architectures are representative of nano-labyrinthine and periodic truss architectures, respectively, the benefits of non-periodic, low-curvature shells can be harnessed to produce architected nano-labyrinthine materials with mechanical resilience superior to that of an equivalent junction-based truss (or plate) architecture. In particular, the non-periodic nature of similar doubly curved shell structures has been shown to provide insensitivity to imperfections [28] at higher relative densities, providing another advantage over thick-shell periodic truss architectures.

Superior Stiffness vs. Density Parameter Space

Figure 5:
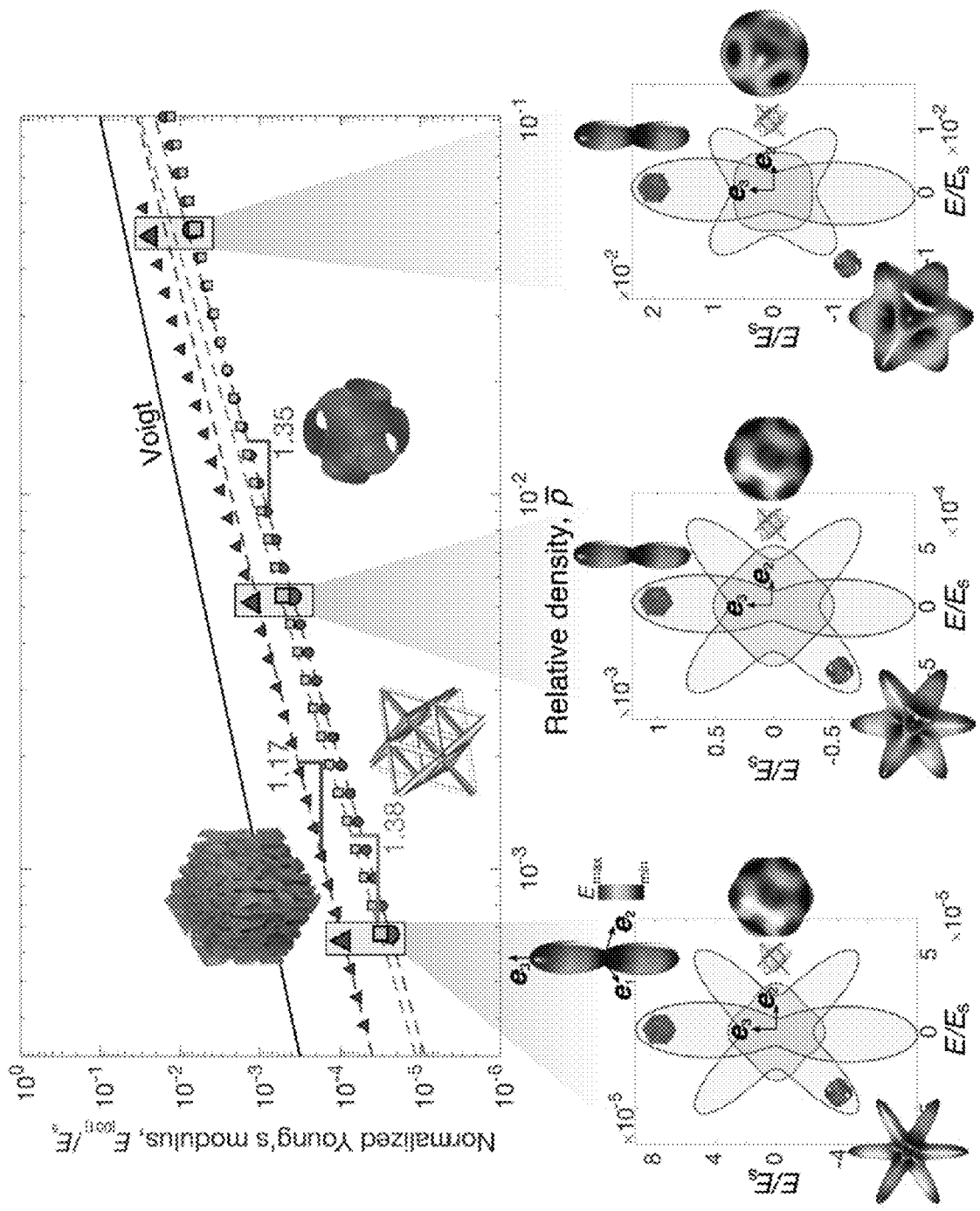
FIG. 5. Stiffness scaling and elastic surface variations. Normalized Young's modulus $E_{[001]}/E_s$ as a function of relative density $\bar{\rho}$ for bi-continuous columnar (red), Schwarz Primitive TPMS (blue), and hollow octet (gray) architectures. Regression fits for the ten lowest relative densities from each architecture are depicted as dashed lines, assuming a relation $E_{[·]}/E_s=C\bar{\rho}^\alpha$, with the corresponding scaling exponent α shown next to each fit. The elastic surfaces for each structure, along with their 2D projections, are shown for three selected relative densities. Close to constant anisotropy is observed for the bi-continuous architecture as opposed to the TPMS and octet geometries.

The atomic layer deposition process used in this work allowed for a wide range of shell thicknesses, from 11 to 168 nm, which enabled the nano-labyrinthine architectures to span a relative density range from 0.15% to 2.4%. To explore the effect of relative density on stiffness and anisotropy, we performed finite element simulations of three types of architectures with the same relative densities: columnar nano-labyrinthine, hollow octet truss, and the Schwarz Primitive triply periodic minimal surface (TPMS) [18]. FIG. 5 shows the normalized elastic modulus $E_{[001]}/E_s$ (top plot) as a function of relative density for these three architectures along with their elastic surfaces at three different relative densities (bottom panels). These simulations demonstrate a close-to-constant anisotropy for the columnar architecture (red), with virtually identical lobular elastic surfaces, and a quasi-linear stiffness scaling exponent of $\alpha=1.17$ (fit of the type $E_{[\cdot]} \propto \bar{\rho}^\alpha$) at relative densities below 5%. The TPMS (blue) and octet (gray) geometries exhibit significant transformations in anisotropy, both having a scaling exponent of ~1.4 and with the octet gradually changing its direction of maximal stiffness from [001] to [111] throughout the studied relative density regime. This anisotropy in trusses arises from the competing effects of beam bending and stretching [51] and presents an additional challenge when designing truss-based materials. Nano-labyrinthine architectures hence appear immune to significant changes in wall thickness, as they retain their target elastic anisotropy throughout the full explored density range.

Figure 16A:
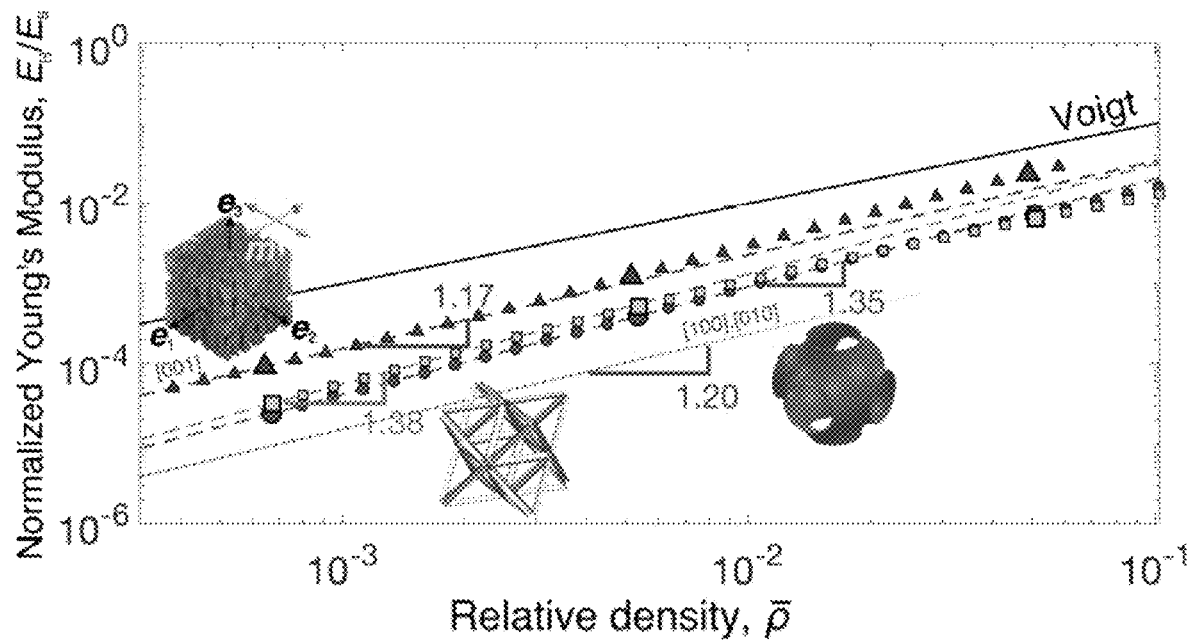
FIGS. 16A-16C. Stiffness scaling for different sample orientations. Normalized Young's modulus $E_{[·]}/E_s$ vs. relative density $\bar{\rho}$ of the (100) orientations for the (FIG. 16A) columnar architecture, (FIG. 16B) the isotropic architecture, and (FIG. 16C) the lamellar architecture. The stiffness scaling of the octet and TPMS architectures are shown for reference. The moduli were obtained numerically employing periodic boundary conditions.
Figure 16B:
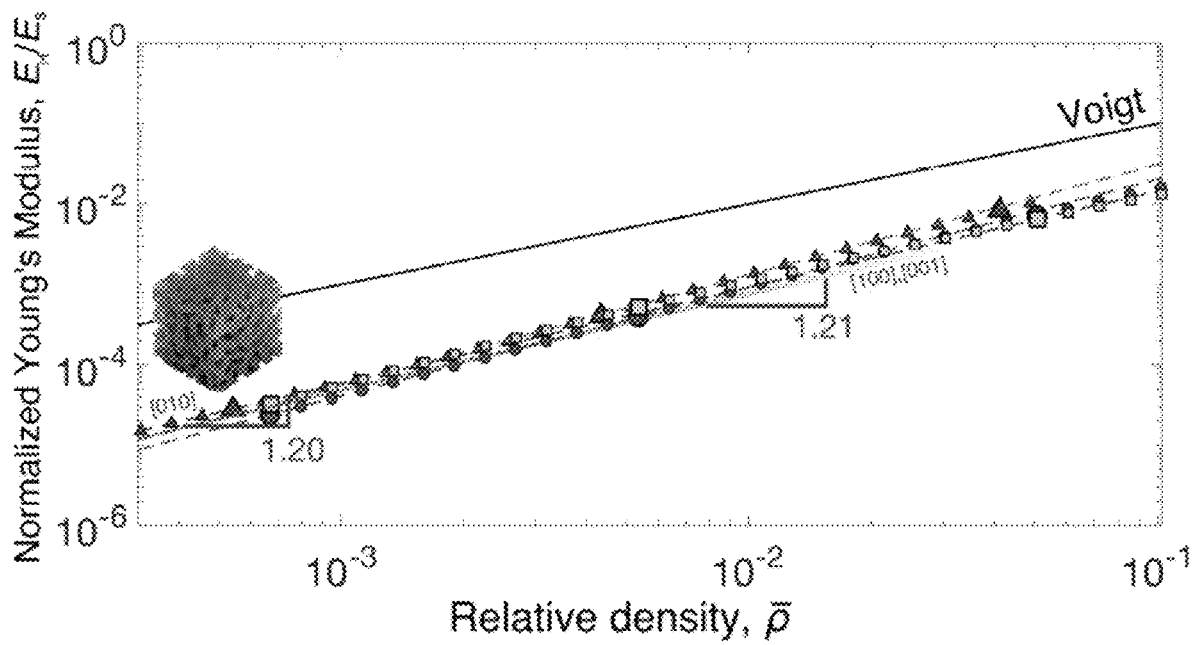
Figure 16C:
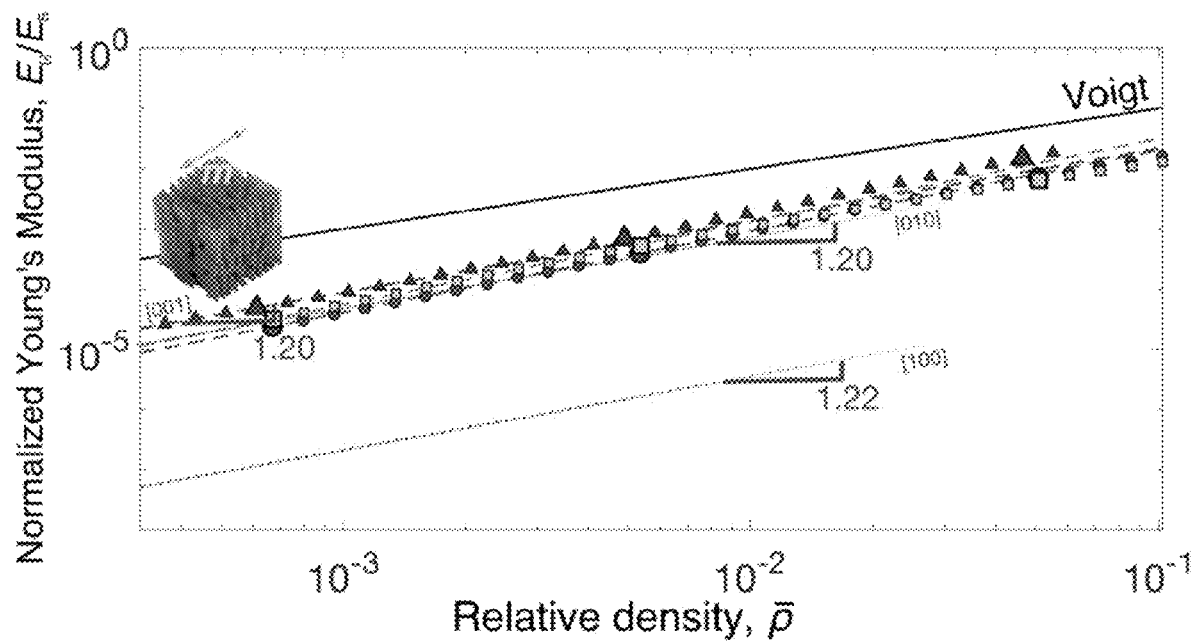

The stiffness scaling of our nano-labyrinthine architectures reveals another counter-intuitive feature, previously shown only for thick polymeric shells [28]: all architectures display an almost linear stiffness scaling with relative density. Performing the same analysis for the rest of the nano-labyrinthine architectures was consistent with the stiffness scaling of the columnar one with scaling exponents ranging from 1.16 to 1.22 in the (100) directions (FIGS. 16A-16C), remaining below the scaling exponents computed for the TPMS and octet architectures. Linear scaling is considered to be optimal, as it corresponds to the rule of mixtures, and is generally associated with stretching as the primary deformation mechanism; bending manifests in an exponent of $\alpha=2$. Although the double-curvature morphology explains the enhanced resilience observed for all architectures, the fact that their elastic deformation is stretching-dominated seems counter-intuitive at first—but is also tied to the double curvature. In the limit of very thin shells of thickness t, the bending stiffness (scaling with $t^3$) is comparably less than the stretching stiffness (scaling with t), so that membrane theory effectively describes the deformation behavior.

Figure 17A:
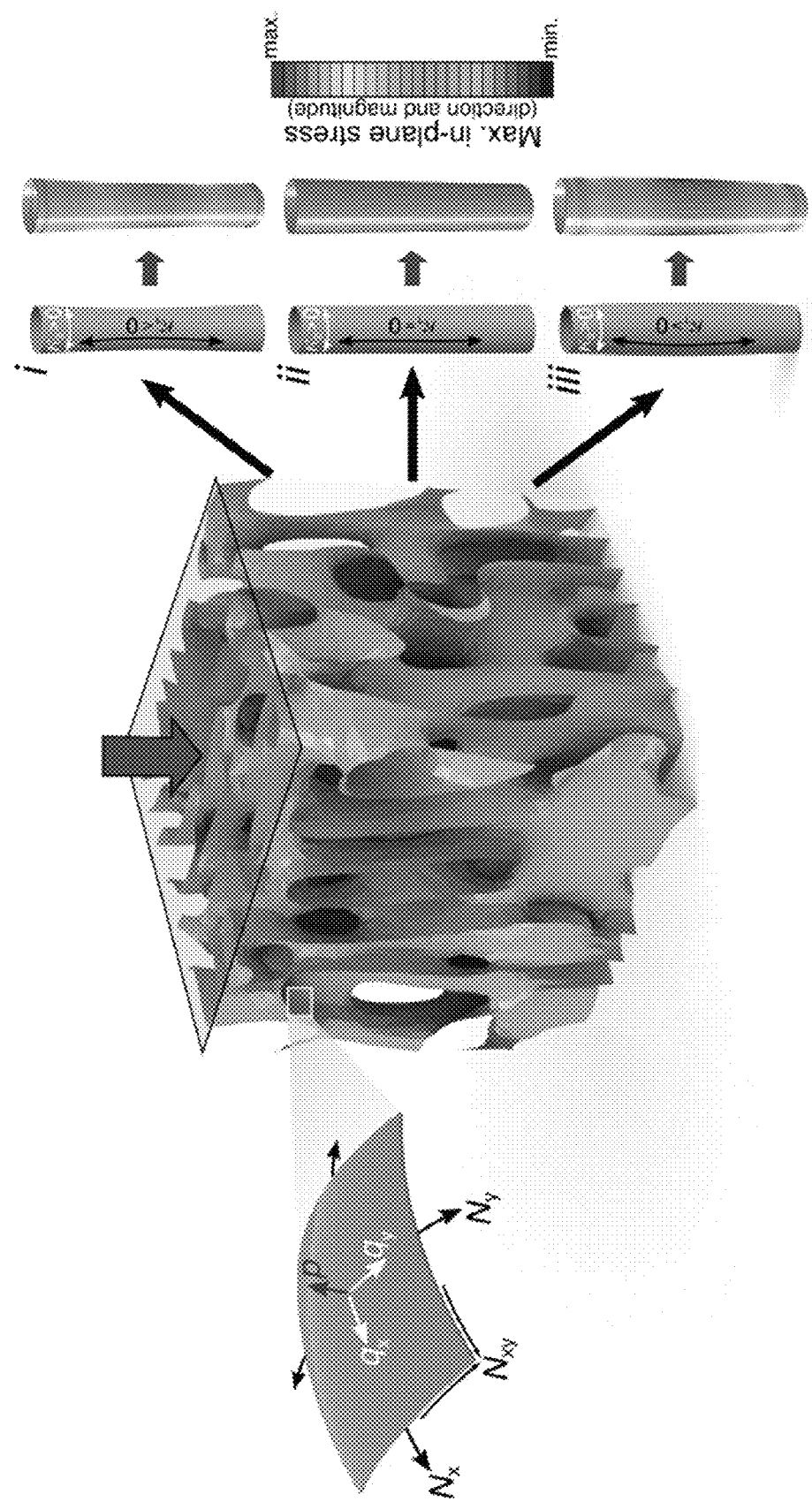
FIGS. 17A-17C. Effect of double curvature on load distribution.
Figure 17B:
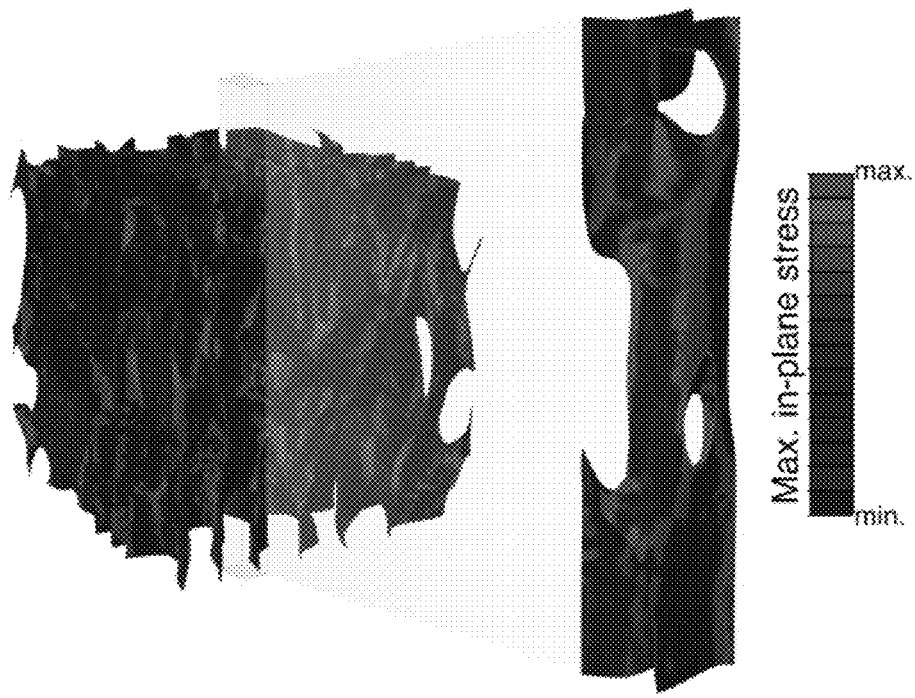
Figure 17C:
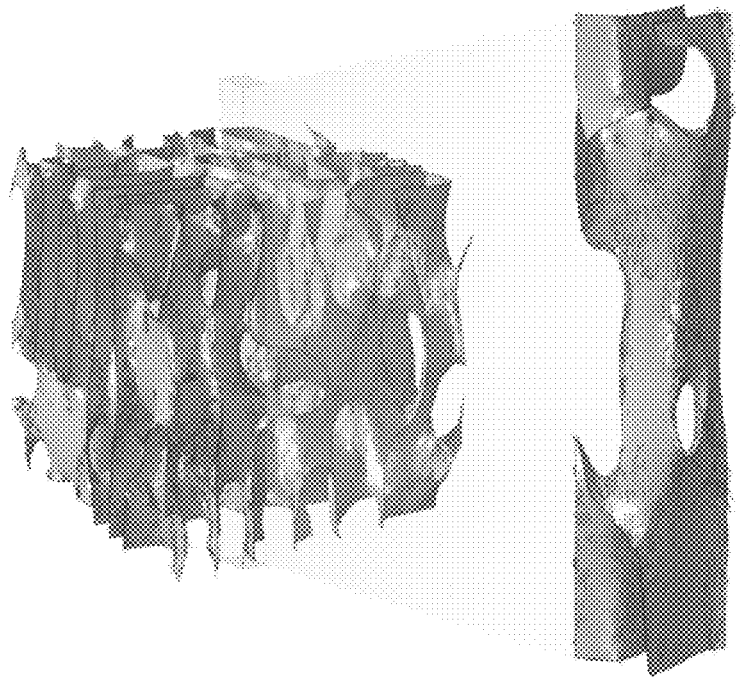

The effect of double curvature on the load distribution in thin elastic shells is best elucidated by the thought experiment of approximating, e.g., the columnar topology as (i) an array of ideal cylindrical shells with $\kappa_1=0$ and $\kappa_2>0$ having zero Gaussian curvature (i.e., $\kappa_1\kappa_2=0$), (ii) an array of doubly-curved barreled nearly-cylindrical shells with $\kappa_1>0$ and $\kappa_2>0$ having positive Gaussian curvature, and (iii) an array of doubly-curved waisted nearly-cylindrical shells with $\kappa_1<0$ and $\kappa_2>0$ having negative Gaussian curvature (see FIGS. 17A-17C). The curvature distribution presented in FIG. 4A demonstrates that the negative Gaussian curvature case is closest to the present shell architectures. For a perfectly cylindrical shell ($\kappa_1\kappa_2=0$) of low thickness (so bending is negligible and membrane theory applies), axial loads distributed across the end perimeters produce axial inner stresses that are constant along straight vertical lines, analogous to an arrangement of straight rods. In the nearly-cylindrical case with negative Gaussian curvature, the shell solution still reveals straight (but no longer vertical) iso-stress characteristics that carry constant axial loads [52] (see Supporting Information). In these two cases, the effective axial response is akin to that of an assembly of rods, thus being stretching-dominated and showing optimal scaling. This is in contrast to the waisted, positive-Gaussian cylinder which diffuses concentrated axial end loads inhomogeneously throughout the shell, in turn demonstrating that the negative Gaussian curvature adds rigidity to axial loads in the form of a membrane-stress carrying ability [52, 53]. Simulation results for those elementary cylindrical structures are depicted in FIGS. 17A-17C, which also shows vertically aligned force chains in a uniaxially compressed columnar architecture along which the principal stresses are non-decaying and maximal, resembling the non-decaying solution of the waisted cylindrical shells [52, 53]. Given that this solution only applies while the membrane hypothesis is valid (i.e., small thicknesses and relative densities), it is expected that bending will take a more prominent role at higher relative densities, yielding slightly higher scaling exponents due to less ideal stress distributions.

CONCLUSION

The example demonstrates a fabrication method that enables self-assembly of non-periodic, shell-based nano-architected materials, with features on the order of nanometers and overall volumes of up to cubic centimeters. Using additive manufacturing synthesis, in-situ experiments, and theory as exploratory tools, we showcase mechanical tunability and unsurpassed resilience of 0.15 percent-dense ceramic nano-labyrinthine shell architectures. The proposed self-assembly method presents a significant departure from existing fabrication and design principles to create architected materials at any scale because it bypasses the restrictions of commonly practiced slow and defect-prone additive manufacturing techniques. These nano-labyrinthine ceramic-shell architectures overcome the inevitable high-stiffness-high-resilience exclusivity and maintain controllable and constant anisotropy over a wide range of relative densities, shown here from 0.15% to 2.4%. This was achieved by combining two beneficial design strategies explored only independently before: extremely thin shells whose size is in the regime of nano-material size effects and failure suppression, and smooth double-curvature structural architectures that provide high stiffness. This enables producing architected materials with high and tunable-stiffness, high-resilience, and potential for scalable fabrication at large volumes through self-assembly.

Materials and Methods

Self-assembly sample fabrication. The centimeter-scale bi-continuous polymer was synthesized according to the method reported by Tsujioka et al. [32]. In brief, 2.34 g of diglycidyl ether of bisphenol A (DGEBA), 0.86 g of 4,4'-methylenebis(cyclohexylamine) (MBCHA), and 8.01 g of polyethylene glycol (PEG) 200 were added to a 20 mL vial, mixed vigorously in a vortex mixer to form a clear homogenous solution and then ultrasonicated for 10 s to remove any bubbles formed. 1.5 ML of this solution was added to a 1 dram vial (15 mm-diameter) and then cured at 130° C. for 3 hrs to form a white solid. After polymerization, the sample was immersed in water for 24 hrs to extract out the PEG 200 porogen, followed by drying in vacuum at room temperature for another 24 hrs. The polymer was then sectioned and the inner cores were conformally coated in $Al_2O_3$ using an atomic layer deposition (ALD) process (Cambridge Nanotech S200). The chamber was held at 150° C. with a recipe consisting of pulsing $H_2O$ for 15 ms, purging for 20 s, pulsing trimethyl aluminum (TMA) for 15 ms, purging again for 20 s, and repeating the process for the desired layer thickness. The system was run for 750 cycles (corresponding to 79 nm) with $N_2$ as the carrier gas at a flow rate of 20 sccm. The coating thickness was verified via spectroscopic ellipsometry using an alpha-SE Ellipsometer (J.A. Wollam Co., Inc). To expose the epoxy component after coating, we made sacrificial cuts on some edges using a razor. The exposed samples were inserted in an $O_2$ plasma asher between 100 h to 200 h, in a 300 sccm flow rate at 100 W power output, until the epoxy component was fully removed.

Microscale sample fabrication. The computed geometries were fabricated at the microscale using a two photon lithography (TPL) process in a Photonic Professional GT system (Nanoscribe GmbH). A laser power of 15 mW and a scan speed of 10 mm s$^{-1}$ on an Ip-Dip photoresist. To prevent excessive warping during the developing process, we dried the samples using a critical point drying process in an Autosamdri-931 system (Tousimis). Following the drying process, the samples were conformally coated in $Al_2O_3$ using the atomic layer deposition (ALD) process described above. Depending on the sample, the system was run for 100, 400, or 1600 cycles. After deposition, we introduced perforations on the top ceramic coating using focused ion beam milling (FIB) in an FEI Nova 200 Nanolab system (see FIGS. 6A-6B). The exposed samples were inserted in an $O_2$ plasma asher between 80 h to 100 h, in a 300 sccm flow rate, at 100 W power output. Using a high imaging voltage (~10 kV) in a scanning electron microscope, it was possible to determine when the totality of the polymer had been removed.

Computational Framework. The sample geometries were computed using a numerical framework adopted from Vidyasagar et al. [39]. In this approach, binary phase separation by spinodal decomposition is modeled using a phase field description, which solves the Cahn-Hilliard equation (in the presence of anisotropic surface energy) for an order parameter field $\phi(x,t)$ on a 3D representative volume element (RVE) with periodic boundary conditions. The phase field was simulated to evolve from a random initial distribution (with the target mean volume fractions) into solid phase ($\phi=1$) and void phase ($\phi=0$), using a stabilized Fourier spectral technique. The Ginzburg-Landau form of the binary potential ensured that the mixture undergoes reverse diffusive processes and formed two stable phases. The interface energy introduced anisotropy by penalizing normal gradients along particular directions $m_i$, under the presence of an intrinsic length scale $\epsilon$ which determined the pore sizes. This length scale was chosen such that the average pore size was approximately one order of magnitude smaller than the RVE dimension, such that sufficient representative features were contained within the RVE. Achieving this separation of scales ensured that RVEs of the same fill fraction $\phi$ but different randomized initial conditions exhibited the same homogenized response, such that a single RVE could be used for each (an)isotropy condition without loss of generality [39]. The stabilization and regularization of the Fourier spectral method, which was chosen to exploit the computational efficiency of Fast Fourier Transforms, ensured that interfacial ringing artifacts were largely mitigated (by utilizing finite-difference stencils in real space to obtain asymptotically consistent acoustic wave vectors). Simulations were initiated with smooth initial Gaussian distributions for probabilistic pattern formation and evolution. The collection of all interfaces resulting from the simulated de-mixing process (i.e., those defined by $\phi=0.5$) were extracted to yield the geometries used to generate the (an)isotropic nano-labyrinthine architectures. The resulting RVEs contained periodic boundaries, although the internal geometries lacked symmetry and periodicity due to the employed Fourier transform-based spectral simulation technique.

The geometries derived from the computational spinodal decomposition process were meshed using three-node shell elements (S3R) in Abaqus (Simulia). A mesh convergence study was performed to ensure mesh-independent results, which led to models containing approximately 237,000 to 266,000 elements, depending on architecture type. Following an analogous mesh convergence study, the octet and TPMS architectures were meshed to result in a total of 16,000 and 63,000 elements, respectively. To compare the response of uniaxial compression experiments to simulations, we performed linear perturbation simulations to establish the linear response of each architecture. For each direction of interest, we applied a compression strain of 1% by constraining the out-of-plane displacement degrees of freedom (dofs) on opposite faces of the finite-element representation of a given sample RVE, while leaving the in-plane displacement dofs and all rotational dofs on those two faces unconstrained. The remaining four faces of the cube-shaped RVE were left unconstrained, as in experiments. To predict the full elastic response of an architectures (i.e., the elastic surfaces revealing Young's modulus in all possible 3D directions), we implemented a computational homogenization scheme. By applying periodic boundary conditions, we imposed average strains within the RVE. Specifically, we sequentially imposed six linearly independent choices of the infinitesimal (symmetric) strain tensor $\epsilon$ and computed the resulting average RVE stress tensor $\sigma$. The full elastic modulus tensor $\mathbb{C}$ was then obtained from Hooke's law $\sigma = \mathbb{C}\epsilon$ of linear elasticity (or $\sigma_{ij} = \mathbb{C}_{ijkl}\epsilon_{kl}$ with the fourth-order elastic stiffness tensor $\mathbb{C}$, using Einstein's summation convention). Lastly, the compliance tensor $\mathbb{S} = \mathbb{C}^{-1}$ was calculated to obtain Young's modulus E(d) in any direction d as $E^{-1}(d) = \mathbb{S}_{ijkl}d_i d_j d_k d_l$.

Nano-mechanical experiments. We performed nano-mechanical experiments on the shell-based architectures to determine their effective stiffness, strength, and recoverability along the (100) directions. We performed ex-situ uniaxial compression experiments on a minimum of three samples per configuration (i.e., each geometry, thickness, and orientation) using a G200 XP Nanoindenter (KLA). The samples were compressed to strains of up to $\epsilon=35\%$, at a strain rate of $\dot{\epsilon}=10^{-3}$ s$^{-1}$, using a 400 μm flat punch tip. The in-situ compressions were performed using an inSEM II Nanoindenter (Nanomechanics) under the same conditions as in the ex-situ compressions. Cyclic compressions of up to ten cycles were performed in situ to observe the failure mechanisms and to quantify the cycle-specific dissipated energy and recovery. For all experiments, the effective Young's modulus was approximated by the loading slope of each cycle's linear stress-strain regime. For samples exhibiting catastrophic failure (i.e., some of the 44 nm samples and all of the 168 nm samples), the strength was approximated as the maximum load prior to collapse. For the recoverable samples (i.e., some of the 44 nm samples and all of the 11 nm samples), the strength was calculated via the 0.2% strain offset method.

REFERENCES CORRESPONDING TO EXAMPLE 1A

[1] Oraib Al-Ketan, Rachid Rezgui, Reza Rowshan, Huifeng Du, Nicholas X. Fang, and Rashid K. Abu Al-Rub. Microarchitected Stretching-Dominated Mechanical Metamaterials with Minimal Surface Topologies. Advanced Engineering Materials, 20(9):1800029, September 2018.

[2] Frank S. Bates, Wayne W. Maurer, Paul M. Lipic, Marc A. Hillmyer, Kristoffer Almdal, Kell Mortensen, Glenn H. Fredrickson, and Timothy P. Lodge. Polymeric Bicontinuous Microemulsions. Physical Review Letters, 79(5):849-852, August 1997.

[3] J. Bauer, A. Schroer, R. Schwaiger, and Oliver Kraft. Approaching theoretical strength in glassy carbon nanolattices. Nature Materials, 15(4):438-443, April 2016.

[4] Joel R. Bell, Kwanho Chang, Carlos R. Lopez-Barron, Christopher W. Macosko, and David C. Morse. Annealing of Cocontinuous Polymer Blends: Effect of Block Copolymer Molecular Weight and Architecture. Macromolecules, 43(11):5024-5032, June 2010.

[5] Maria Berdova, Tuomo Ylitalo, Ivan Kassamakov, Jouni Heino, Pekka T. Törmä, Lauri Kilpi, Helena Ronkainen, Jari Koskinen, Edward Hæggström, and Sami Franssila. Mechanical assessment of suspended ALD thin films by bulge and shaft-loading techniques. Acta Materialia, 66:370-377, 2014.

[6] J. B. Berger, H. N. G. Wadley, and R. M. McMeeking. Mechanical metamaterials at the theoretical limit of isotropic elastic stiffness. Nature, 543(7646):533-537, 2017.

[7] Juergen Biener, Andrea M. Hodge, Joel R. Hayes, Cynthia A. Volkert, Luis A. Zepeda-Ruiz, Alex V. Hamza, and Farid F. Abraham. Size Effects on the Mechanical Behavior of Nanoporous Au. Nano Letters, 6(10):2379-2382, October 2006.

[8] Colin Bonatti and Dirk Mohr. Mechanical performance of additively-manufactured anisotropic and isotropic smooth shell-lattice materials: Simulations & experiments. Journal of the Mechanics and Physics of Solids, 122:1-26, 2019.

[9] C. R. Calladine. Theory of Shell Structures. Cambridge University Press, Cambridge, 1983.

[10] Vikram S. Deshpande, Norman A. Fleck, and M. F. Ashby. Effective properties of the octet-truss lattice material. Journal of the Mechanics and Physics of Solids, 49(8):1747-1769, 2001.

[11] Nicholas G. Dou, Robert A. Jagt, Carlos M. Portela, Julia R. Greer, and Austin J. Minnich. Ultralow Thermal Conductivity and Mechanical Resilience of Architected Nanolattices. Nano Letters, 18(8):4755-4761, 2018.

[12] Andrew Gross, Panos Pantidis, Katia Bertoldi, and Simos Gerasimidis. Correlation between topology and elastic properties of imperfect truss-lattice materials. Journal of the Mechanics and Physics of Solids, 124:577-598, 2019.

[13] Seung Chul Han, Jeong Woo Lee, and Kiju Kang. A New Type of Low Density Material: Shellular. Advanced Materials, 27(37):5506-5511, October 2015.

[14] A. M. Higgins and R. A. L. Jones. Anisotropic spinodal dewetting as a route to self-assembly of patterned surfaces. Nature, 404(6777):476-478, March 2000.

[15] Meng-Ting Hsieh, Bianca Endo, Yunfei Zhang, Jens Bauer, and Lorenzo Valdevit. The mechanical response of cellular materials with spinodal topologies. Journal of the Mechanics and Physics of Solids, 125:401-419, 2019.

[16] S. N. Khaderi, M. R. J. Scherer, C. E. Hall, U. Steiner, U. Ramamurty, N. A. Fleck, and V. S. Deshpande. The indentation response of Nickel nano double gyroid lattices. Extreme Mechanics Letters, 10:15-23, 2017.

[17] Sebastian Krödel and Chiara Daraio. Microlattice Metamaterials for Tailoring Ultrasonic Transmission with Elastoacoustic Hybridization. Physical Review Applied, 6(6):064005, 2016.

[18] Yongwoo Kwon, K. Thornton, and P. W. Voorhees. Morphology and topology in coarsening of domains via non-conserved and conserved dynamics. Philosophical Magazine, 90(1-4):317-335, January 2010.

[19] Ryan M. Latture, Matthew R. Begley, and Frank W. Zok. Design and mechanical properties of elastically isotropic trusses. Journal of Materials Research, 33(3):249-263, 2018.

[20] Ryan M. Latture, Ricardo X. Rodriguez, Larry R. Holmes, and Frank W. Zok. Effects of nodal fillets and external boundaries on compressive response of an octet truss. Acta Materialia, 149:78-87, 2018.

[21] A Lazarus, H C B Florijn, and P M Reis. Geometry-Induced Rigidity in Nonspherical Pressurized Elastic Shells. Physical Review Letters, 109(14):144301, October 2012.

[22] Matthew N. Lee and Ali Mohraz. Bicontinuous macroporous materials from bijel templates. Advanced Materials, 22(43):4836-4841, 2010.

[23] Lu Liu, Paul Kamm, Francisco Garcia-Moreno, John Banhart, and Damiano Pasini. Elastic and failure response of imperfect three-dimensional metallic lattices: the role of geometric defects induced by Selective Laser Melting. Journal of the Mechanics and Physics of Solids, 107:160-184, 2017.

[24] Carlos R. Lopez-Barron and Christopher W. Macosko. Direct Measurement of Interface Anisotropy of Bicontinuous Structures via 3D Image Analysis. Langmuir, 26(17):14284-14293, September 2010.

[25] K. R. Mangipudi, E. Epler, and C. A. Volkert. Topology-dependent scaling laws for the stiffness and strength of nanoporous gold. Acta Materialia, 119:115-122, 2016.

[26] Arturo J. Mateos, Wei Huang, Yong-Wei Zhang, and Julia R. Greer. Discrete-Continuum Duality of Architected Materials: Failure, Flaws, and Fracture. Advanced Functional Materials, 1806772:1806772, 2018.

[27] Lucas R. Meza, Satyajit Das, and Julia R. Greer. Strong, lightweight, and recoverable three-dimensional ceramic nanolattices. Science, 345(6202):1322-1326, September 2014.

[28] Lucas R. Meza, Gregory P. Phlipot, Carlos M. Portela, Alessandro Maggi, Lauren C. Montemayor, Andre Comella, Dennis M. Kochmann, and Julia R. Greer. Reexamining the mechanical property space of three-dimensional lattice architectures. Acta Materialia, 140:424-432, 2017.

[29] Lucas R. Meza, Alex J. Zelhofer, Nigel Clarke, Arturo J. Mateos, Dennis M. Kochmann, and Julia R. Greer. Resilient 3D hierarchical architected metamaterials. Proceedings of the National Academy of Sciences of the United States of America, 112(37):11502-7, 2015.

[30] Utpal Nath, Brian C W Crawford, Rosemary Carpenter, and Enrico Coen. Genetic control of surface curvature. [Science. 2003]—PubMed result. Science (New York, N.Y.), 299(5611):1404-7, 2003.

[31] Sokol Ndoni, Martin E. Vigild, and Rolf H. Berg. Nanoporous Materials with Spherical and Gyroid Cavities Created by Quantitative Etching of Polydimethylsiloxane in Polystyrene-Polydimethylsiloxane Block Copolymers. Journal of the American Chemical Society, 125(44): 13366-13367, 2003.

[32] Ban Dang Nguyen, Seung Chul Han, Yoon Chang Jung, and Kiju Kang. Design of the P-surfaced shellular, an ultra-low density material with micro-architecture. Computational Materials Science, 139:162-178, 2017.

[33] Cheolmin Park, Jongseung Yoon, and Edwin L. Thomas. Enabling nanotechnology with self assembled block copolymer patterns. Polymer, 44(22):6725-6760, October 2003.

[34] C.-L. Park, J. W. Gibbs, P. W. Voorhees, and K. Thornton. Coarsening of complex microstructures following spinodal decomposition. Acta Materialia, 132:13-24, June 2017.

[35] Minh-Son Pham, Chen Liu, Iain Todd, and Jedsada Lertthanasarn. Damage-tolerant architected materials inspired by crystal microstructure. Nature, 2019.

[36] V Pini, J J Ruz, P M Kosaka, O Malvar, M Calleja, and J Tamayo. How two-dimensional bending can extraordinarily stiffen thin sheets. Scientific Reports, 6 (June):1-6, 2016.

[37] Carlos M Portela, Julia R Greer, and Dennis M Kochmann. Impact of node geometry on the effective stiffness of non-slender three-dimensional truss lattice architectures. Extreme Mechanics Letters, 22:110-138, 2018.

[38] E. Ramm and W. A. Wall. Shell structures—A sensitive interrelation between physics and numerics. International Journal for Numerical Methods in Engineering, 60(1): 381-427, 2004.

[39] Tobias A. Schaedler, Alan J. Jacobsen, A. Torrents, a. E. Sorensen, J. Lian, Julia R. Greer, Lorenzo Valdevit, and W. B. Carter. Ultralight Metallic Microlattices. Science, 334(6058):962-965, November 2011.

[40] Almut Schroer, Jeffrey M. Wheeler, and Ruth Schwaiger. Deformation behavior and energy absorption capability of polymer and ceramic-polymer composite microlattices under cyclic loading. Journal of Materials Research, 33(03):274-289, 2018.

[41] Thomas Tancogne-Dejean, Marianna Diamantopoulou, Maysam B. Gorji, Colin Bonatti, and Dirk Mohr. 3D Plate-Lattices: An Emerging Class of Low-Density Metamaterial Exhibiting Optimal Isotropic Stiffness. Advanced Materials, 30(45):1803334, November 2018.

[42] Thomas Tancogne-Dejean and Dirk Mohr. Elastically-isotropic elementary cubic lattices composed of tailored hollow beams. Extreme Mechanics Letters, 22:13-18, 2018.

[43] Thomas Tancogne-Dejean, Adriaan B. Spierings, and Dirk Mohr. Additively-manufactured metallic micro-lattice materials for high specific energy absorption under static and dynamic loading. Acta Materialia, 116:14-28, 2016.

[44] Norio Tsujioka, Norio Ishizuka, Nobuo Tanaka, Takuya Kubo, and Ken Hosoya. Well-controlled 3D skeletal epoxy-based monoliths obtained by polymerization induced phase separation. Journal of Polymer Science Part A: Polymer Chemistry, 46(10):3272-3281, May 2008.

[45] Thomas Vidil, Nicholas Hampu, and Marc A. Hillmyer. Nanoporous Thermosets with Percolating Pores from Block Polymers Chemically Fixed above the Orderâ€"Disorder Transition. ACS Central Science, 3(10):1114-1120, October 2017.

[46] A Vidyasagar, S Krödel, and D M Kochmann. Microstructural patterns with tunable mechanical anisotropy obtained by simulating anisotropic spinodal decomposition. Proceedings of the Royal Society A: Mathematical, Physical and Engineering Science, 474(2218):20180535, 2018.

[47] W Voigt. Ueber die Beziehung zwischen den beiden Elastizitätskonstanten isotroper Körper. Annalen der Physik, 274(12):573-587, January 1889.

[48] Di Zeng, Alexander Ribbe, and Ryan C. Hayward. Anisotropic and Interconnected Nanoporous Materials from Randomly End-Linked Copolymer Networks. Macromolecules, 50(12):4668-4676, June 2017.

[49] Lei Zhang, Stefanie Feih, Stephen Daynes, Shuai Chang, Michael Yu Wang, Jun Wei, and Wen Feng Lu. Energy absorption characteristics of metallic triply periodic minimal surface sheet structures under compressive loading. Additive Manufacturing, 23 (August):505-515, 2018.

[50] Xuan Zhang, Andrey Vyatskikh, Huajian Gao, Julia R. Greer, and Xiaoyan Li. Lightweight, flaw-tolerant, and ultrastrong nanoarchitected carbon. Proceedings of the National Academy of Sciences, page 201817309, 2019.

[51] Xiaoyu Zheng, Howon Lee, Todd H. Weisgraber, Maxim Shusteff, Joshua DeOtte, Eric B Duoss, Joshua D Kuntz, Monika M Biener, Qi Ge, Julie A. Jackson, Sergei O Kucheyev, Nicholas X. Fang, and Christopher M. Spadaccini. Ultralight, ultrastiff mechanical metamaterials. Science, 344(6190):1373-1377, June 2014.

[52] Xiaoyu Zheng, William Smith, Julie Jackson, Bryan Moran, Huachen Cui, Da Chen, Jianchao Ye, Nicholas Fang, Nicholas Rodriguez, Todd Weisgraber, and Christopher M. Spadaccini. Multiscale metallic metamaterials. Nature Materials, 15(10):1100-1106, oct 2016.

[53] Ning Zhou, Frank S. Bates, and Timothy P. Lodge. Mesoporous membrane templated by a polymeric bicontinuous microemulsion. Nano Letters, 6(10):2354-2357, 2006.

Supporting Information—Extreme Mechanical Resilience of Self-Assembled Nano-Labyrinthine Materials Equilibrium of Cylindrical and Doubly Curved Nearly-Cylindrical Shells The complicated double-curvature nature of the bi-continuous architectures in this study makes it challenging to find a general geometric simplification that applies to all morphologies. In light of this, we restrict this theoretical analysis to the columnar bi-continuous architecture presented in FIG. 7A, which was studied extensively in the main text.

The ability to form bi-continuous architectures with shells is due to the double-curvature morphology that results from self-assembly processes such as nanoporous foams, block copolymer systems, or polymeric emulsions. It is this double-curvature which allows shell-based architectures (based on morphologies from these processes) to achieve a stretching-dominated mechanical response elucidated by the observed quasi-linear stiffness scaling with relative density (FIG. 10). To study the role of curvature on the mechanical response of these thin shell-based architectures (where the membrane hypothesis applies), we refer to three primitive shell geometries as simplifications of the columnar architecture: an array of (i) ideal cylindrical shells with $\kappa_1=0$ and $\kappa_2>0$ having zero Gaussian curvature (i.e., $\kappa_1\kappa_2=0$), (ii) doubly-curved 'nearly cylindrical' waisted shells with $\kappa_1<0$ and $\kappa_2>0$ having negative Gaussian curvature, and (iii) doubly-curved 'nearly cylindrical' barreled shells with $\kappa_1>0$ and $\kappa_2>0$ having positive Gaussian curvature (see FIG. 17A).

Following the analysis performed by Calladine (1983)[1], the equilibrium equations for the doubly curved infinitesimal shell element in FIG. 17A are $$\frac{\partial N_x}{\partial x} + \frac{\partial N_{xy}}{\partial y} = -q_x, \quad (1)$$

$$\frac{\partial N_y}{\partial y} + \frac{\partial N_{xy}}{\partial x} = -q_y, \quad (2)$$

in the tangential directions, and $$\frac{N_x}{\rho_1} + \frac{N_y}{\rho_2} = p, \quad (3)$$

in the normal direction, where $N_x$ and $N_y$ are the tangential stress resultants, $N_{xy}$ is the shear stress resultant, and $\rho_1$ and $\rho_2$ are the radii of curvature, and $q_x$, $q_y$, and p are distributed loads. For a cylindrical shell ($\rho_2 \to \infty$), Eqs. 1-3 become $$\frac{\partial N_x}{\partial x} + \frac{1}{\rho_1}\frac{\partial N_{x\theta}}{\partial \theta} = -q_x, \quad (4)$$

$$\frac{1}{\rho_1}\frac{\partial N_\theta}{\partial \theta} + \frac{\partial N_{x\theta}}{\partial x} = -q_\theta, \quad (5)$$

$$\frac{N_\theta}{\rho_1} + \frac{N_x}{\rho_2} = p, \quad (6)$$

after a change of variables to polar coordinates. For the perfectly cylindrical shell case, i.e., $\rho_2=\infty$ and $\kappa_2=0$ with length 2l, applying an arbitrary edge loading $N_x(\theta)$ (with p, $q_\theta=0$)

yields $\frac{\partial N_x}{\partial x} = 0,$ meaning that $N_x$ is equal to the prescribed value at the edge throughout the entirety of the shell and no attenuation is observed. This solution can be represented as an array of vertically aligned rods engaged purely in stretching.

Taking the 'nearly cylindrical' cases of the barreled and waisted shells as shown by Calladine (1983)[1] and applying edge loads of the form $N_x=N_0 \cos n\theta$ yields solutions of the form $$N_x=N_0 \cos n\theta \cos hn\xi/\cos hn\zeta, \quad (7)$$

for the barreled shell, with $\zeta=l(\rho_1\rho_2)^{1/2}$, $\eta=x(\rho_1\rho_2)^{1/2}$, and $$N_x=\tfrac{1}{2}N_0(\theta-mx/\rho_1)+N_0(\theta+mx/\rho_1), \quad (8)$$

for the waisted shell, with $m=(-\rho_1/\rho_2)^{1/2}$. Eq. 7 indicates that $N_x$ throughout a barreled shell dips below the prescribed value at the edge and reaches a minimum at the middle plane (the magnitude of the dip depends on n, l, $\rho_1$, and $\rho_2$). In contrast, Eq. 8 shows that the solution for a waisted shell is constant along lines of $\theta \pm mx/\rho_1$=const. This physically translates to lines at slopes $\pm m$ that span from edge-to-edge along which there is no attenuation of the applied edge load and stretching takes place. Although not as optimal as the perfectly cylindrical solution, this solution for the waisted shell hints to a connection between stretching behavior and negative Gaussian curvature when the membrane hypothesis applies.

REFERENCES CORRESPONDING SUPPORTING INFORMATION

[1] C. R. Calladine. *Theory of Shell Structures*. Cambridge University Press, Cambridge, 1983.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Certain molecules disclosed herein may contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every composition, process, device, system, formulation, combination of components, or method described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A shell-based material comprising:
    a plurality of shell features provided in a porous shell network;
    wherein said shell features (i) do not include portions characterized by a magnitude of normalized curvature greater than 30, (ii) do not include features characterized by one zero-valued principal curvature, (iii) do not include features characterized by radial symmetry, or (iv) any combination thereof;
    wherein at least a portion of said shell features are independently characterized by a ratio of wall thickness to magnitude of inverse principal curvature selected over the range of $5 \times 10^{-8}$ to 0.005;
    wherein said shell features are hollow;
    wherein the plurality of shell features form a continuous hollow shell structure having a continuous fluidically connected internal lumen or void space throughout said structure;
    wherein the shell-based material has an average density less than or equal to 100 mg cm$^3$;
    wherein said shell features are provided in a bicontinuous shell network, such that the material comprises a first volume and a second volume;
        wherein the second volume is distinct from the first volume, is fluidically disconnected from the first volume within the shell-based material, and is fluidically and physically separated from the first volume by one or more walls of said plurality of shell features; and
        wherein each of said first volume and said second volume is independently continuous.

2. The shell-based material of claim 1, wherein the shell-based material has an average density selected over the range of 2 mg cm$^{-3}$ to 100 mg cm$^{-3}$.

3. The shell-based material of claim 1, wherein at least a portion of said shell features of said porous shell network are provided in a non-periodic spatial distribution.

4. The shell-based material of claim 1, wherein said shell features of said porous shell network are characterized by average wall thickness selected from the range of 5 nm to 500 nm.

5. The shell-based material of claim 1, wherein said shell features of said porous shell network are characterized by a ratio of average wall thickness to characteristic length selected over the range of $5 \times 10^{-4}$ to 0.02.

6. The shell-based material of claim 1, wherein said shell features of said porous shell network do not include portions characterized by a magnitude of normalized curvature greater than 30, do not include features characterized by one zero-valued principal curvature, and do not include features characterized by radial symmetry.

7. The shell-based material of claim 1, wherein said shell features of said porous shell network are one or more material selected from the group consisting of a ceramic, a polymer, a metal, a metal oxide, a carbon allotrope, and any combinations thereof.

8. The shell-based material of claim 1, wherein said shell features of said porous shell network are formed of a material comprising $Al_2O_3$, $HfO_2$, $SiO_2$, $TiO_2$, $SrTiO_3$, $Ta_2O_5$, $Gd_2O_3$, $ZrO_2$, $Ga_2O_3$, $V_{205}$, $Co_3O_4$, ZnO, ZnO:Al, ZnO:B, $In_2O_3$:H, $W_{03}$, $MoO_3$, $Nb_2O_5$, NiO, MgO, $RuO_2$, TiN, TaN, $Si_3N_4$, AN, GaN, WN, HfN, NbN, GdN, VN, ZrN, Pt, Ru, Pd, Ni, W, ZnS, $MoS_2$, $MgF_2$, $A_lF_3$, Cu, nickel-phosphorous alloy, nickel-boron alloy, Cu, Al, Hf, Si, Ti, Sr, Ta, Zr, Gd, Ga, V, Co, Zn, In, Mo, Nb, Mg, an alloy thereof, an oxide thereof, a nitride thereof, a fluoride thereof, or any combinations thereof.

9. The shell-based material of claim 1, having a stiffness ranging from 0.2% to 0.48% of the theoretical stiffness bound (Voigt bound).

10. The shell-based material of claim 1, having an average stiffness-to-density ratio selected from the range of 1 $kPa*m^3/kg$ to 10 $MPa*m^3/kg$.

11. The shell-based material of claim 1, wherein an average stiffness (S) of the material increases substantially linearly with relative density (D) pursuant to the expression (E1) wherein 1.0<x<1.3:

$$S \propto D^x \quad (E1).$$

12. The shell-based material of claim 1, having a resilient response showing no crack formation in response to strain selected over the range of greater than 0% to 40%.

13. The shell-based material of claim 1, having an anisotropic Young's modulus, such that a ratio of a first average Young's modulus along a first direction to a second average Young's modulus along a second direction is greater than or equal to 150, wherein said first direction is orthogonal to said second direction.

14. The shell-based material of claim 1, having an average porosity selected over the range of 95% to 99.9%.

15. The shell-based material of claim 1, having a sample volume greater than or equal to $2.7 \times 10^6$ μm$^3$.

16. The shell-based material of claim 1 comprises a matrix phase provided in at least a portion of the pores of said porous shell network.

17. The shell-based material of claim 1, fabricated via a self-assembly based templating approach process.

18. The shell-based material of claim 1, wherein said shell features of said porous shell network do not include portions characterized by a magnitude of normalized curvature greater than 30.

19. The shell-based material of claim 1, wherein said shell features have a maximum probability of normalized curvature equal to or less than 30.

20. The shell-based material of claim 1, wherein said shell features of said porous shell network do not include features characterized by one zero-valued principal curvature.

21. The shell-based material of claim 1, wherein said shell features of said porous shell network do not include features characterized by radial symmetry.

22. The shell-based material of claim 1, wherein a majority of said shell features of said porous shell network are characterized by a magnitude of each normalized principal curvature being less than 20.

23. The shell-based material of claim 1, wherein the porous shell network has a node-free geometry.

24. The shell-based material of claim 1, wherein a Gaussian curvature or multiplication product of the principal curvatures ($\kappa_1 \kappa_2$) at any portion of said shell features is nonzero.

25. The shell-based material of claim 1, wherein a Gaussian curvature or multiplication product of the principal curvatures ($\kappa_1 \kappa_2$) at any portion of said shell features is negative.

26. The shell-based material of claim 1, wherein at least 50% of said shell features are independently characterized by said ratio of wall thickness to magnitude of inverse principal curvature selected over the range of $5 \times 10^{-8}$ to 0.005.

27. The shell-based material of claim 1, wherein at least 90% of said shell features are independently characterized by said ratio of wall thickness to magnitude of inverse principal curvature selected over the range of $5 \times 10^{-8}$ to 0.005.

28. The shell-based material of claim 1, wherein said shell features include portions characterized by a magnitude of normalized curvature less than 30, features characterized by nonzero-valued principal curvature, or a combination thereof.

29. The shell-based material of claim 1, wherein said shell features include portions characterized by both a magnitude of normalized curvature less than 30 and nonzero-valued principal curvature.

30. The shell-based material of claim 1, wherein each of said first volume and said second volume is independently continuous and fluidically-connected throughout itself.

31. A method of making a shell-based material, said method comprising:
providing a mixture comprising a first polymer precursor and a second polymer precursor;
polymerizing the first polymer precursor and/or the second polymer precursor so as to cause phase separation of the mixture, thereby resulting in formation of a porous bi-continuous template structure;
coating at least a portion of the porous bi-continuous template structure with a deposition material, there generating a layer of deposited material on at least a portion of said template structure having a thickness less than or equal to 5 μm; and
at least partially removing said porous template structure; thereby forming a shell-based material comprising a plurality shell features provided in a porous shell network;
wherein said shell features (i) do not include portions characterized by a magnitude of normalized curvature greater than 30, (ii) do not include features characterized by one zero-valued principal curvature, (iii) do not include features characterized by radial symmetry, or (iv) any combination thereof;
wherein at least a portion of said shell features are independently characterized by a ratio of wall thickness to magnitude of inverse principal curvature selected over the range of $5 \times 10^{-8}$ to 0.005;

wherein said shell features are hollow;

wherein the plurality of shell features form a continuous hollow shell structure having a continuous fluidically connected internal lumen or void space throughout said structure;

wherein the shell-based material has an average density less than or equal to 100 mg cm$^{-3}$;

wherein said shell features are provided in a bicontinuous shell network, such that the material comprises a first volume and a second volume; and wherein the second volume is distinct from the first volume, is fluidically disconnected from the first volume within the shell-based material, and is fluidically and physically separated from the first volume by one or more walls of said plurality of shell features; and wherein each of said first volume and said second volume is independently continuous.

32. The method of claim 31 comprising a step of deforming the porous bi-continuous template structure; wherein the step of deforming is performed between the steps of polymerizing and coating; and wherein the geometry, morphology and/or physical dimensions of the porous shell network is controllable via selection of one or more of: mechanical input to the mixture during the polymerizing step and deformation force and one or more deformation direction during the step of deforming.

33. The method of claim 31, wherein each of said first volume and said second volume is independently continuous and fluidically-connected throughout itself.

* * * * *